(12) United States Patent
Koyama et al.

(10) Patent No.: US 9,337,826 B2
(45) Date of Patent: May 10, 2016

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Jun Koyama, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/887,595

(22) Filed: May 6, 2013

(65) Prior Publication Data

US 2013/0300462 A1    Nov. 14, 2013

(30) Foreign Application Priority Data

May 11, 2012  (JP) .................. 2012-109475
Jun. 1, 2012   (JP) .................. 2012-125706

(51) Int. Cl.
*H03K 3/01*     (2006.01)
*H03K 17/30*    (2006.01)
*H01L 27/12*    (2006.01)

(52) U.S. Cl.
CPC .......... *H03K 17/302* (2013.01); *H01L 27/1225* (2013.01); *H03K 2217/0018* (2013.01); *H03K 2217/0036* (2013.01)

(58) Field of Classification Search
CPC .............. H03K 19/0016; H03K 19/00384; H03K 2217/0018; G05F 3/205

USPC ............... 327/108–112, 534–537; 326/82, 83
See application file for complete search history.

(56) References Cited

U.S. PATENT DOCUMENTS 5,448,198 A * 9/1995 Toyoshima et al. ........... 327/530
5,461,338 A * 10/1995 Hirayama et al. ............ 327/534

(Continued)

FOREIGN PATENT DOCUMENTS

EP    1 737 044 A1    12/2006
EP    2 226 847 A2     9/2010

(Continued)

OTHER PUBLICATIONS

Asakuma, N et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

(Continued)

*Primary Examiner* — Lincoln Donovan
*Assistant Examiner* — Thomas Skibinski
(74) *Attorney, Agent, or Firm* — Fish & Richardson P.C.

(57) ABSTRACT

To reduce power consumption, a semiconductor device includes a power source circuit for generating a power source potential, and a power supply control switch for controlling supply of the power source potential from the power source circuit to a back gate of a transistor, and the power supply control switch includes a control transistor for controlling conduction between the power source circuit and the back gate of the transistor by being turned on or off in accordance with a pulse signal that is input into a control terminal of the control transistor. The power source potential is intermittently supplied from the power source circuit to the back gate of the transistor, using the power supply control switch.

24 Claims, 29 Drawing Sheets

(56) References Cited

U.S. PATENT DOCUMENTS

| | | | |
|---|---|---|---|
| 5,610,533 A * | 3/1997 | Arimoto et al. | 326/33 |
| 5,731,856 A | 3/1998 | Kim et al. | |
| 5,744,864 A | 4/1998 | Cillessen et al. | |
| 5,818,070 A | 10/1998 | Yamazaki et al. | |
| 6,049,110 A | 4/2000 | Koh | |
| 6,060,918 A * | 5/2000 | Tsuchida et al. | 327/143 |
| 6,097,113 A * | 8/2000 | Teraoka et al. | 307/125 |
| 6,150,869 A * | 11/2000 | Storino et al. | 327/534 |
| 6,239,649 B1 * | 5/2001 | Bertin et al. | 327/534 |
| 6,294,274 B1 | 9/2001 | Kawazoe et al. | |
| 6,306,691 B1 | 10/2001 | Koh | |
| 6,333,571 B1 | 12/2001 | Teraoka et al. | |
| 6,351,176 B1 * | 2/2002 | Houston | G11C 7/062 327/534 |
| 6,462,723 B1 | 10/2002 | Yamazaki et al. | |
| 6,518,825 B2 | 2/2003 | Miyazaki et al. | |
| 6,563,174 B2 | 5/2003 | Kawasaki et al. | |
| 6,727,522 B1 | 4/2004 | Kawasaki et al. | |
| 6,778,002 B2 * | 8/2004 | Miyazaki et al. | 327/534 |
| 6,833,750 B2 | 12/2004 | Miyazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,161,408 B2 * | 1/2007 | Mizuno et al. | 327/534 |
| 7,205,825 B2 * | 4/2007 | Klein et al. | 327/537 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,307,317 B2 | 12/2007 | Koyama | |
| 7,323,356 B2 | 1/2008 | Hosono et al. | |
| 7,348,827 B2 * | 3/2008 | Rahim | G06F 17/5054 326/32 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,580,310 B2 * | 8/2009 | Chu | 365/222 |
| 7,592,832 B2 * | 9/2009 | Perisetty | 326/37 |
| 7,674,650 B2 | 3/2010 | Akimoto et al. | |
| 7,732,819 B2 | 6/2010 | Akimoto et al. | |
| 7,732,864 B2 | 6/2010 | Kawahara et al. | |
| 7,808,045 B2 | 10/2010 | Kawahara et al. | |
| 7,943,996 B2 | 5/2011 | Kawahara et al. | |
| 8,508,283 B2 | 8/2013 | Kawahara et al. | |
| 8,710,762 B2 | 4/2014 | Takahashi et al. | |
| 8,871,565 B2 | 10/2014 | Yamazaki et al. | |
| 9,012,918 B2 | 4/2015 | Yamazaki et al. | |
| 9,024,317 B2 | 5/2015 | Endo et al. | |
| 9,105,668 B2 | 8/2015 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 * | 6/2009 | Umeda et al. | 252/500 |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0244029 A1 | 9/2010 | Yamazaki et al. | |
| 2011/0057918 A1 | 3/2011 | Kimura et al. | |
| 2011/0102409 A1 | 5/2011 | Hayakawa | |
| 2012/0061663 A1 * | 3/2012 | Yamazaki | H01L 21/02488 257/43 |
| 2012/0064664 A1 * | 3/2012 | Yamazaki et al. | 438/104 |
| 2013/0034199 A1 | 2/2013 | Toyotaka | |
| 2014/0320107 A1 | 10/2014 | Takahashi et al. | |
| 2015/0214379 A1 | 7/2015 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-021443 A | 1/1994 |
| JP | 08-264794 A | 10/1996 |
| JP | 10-012887 A | 1/1998 |
| JP | 11-122047 A | 4/1999 |
| JP | 11-505377 A | 5/1999 |
| JP | 2000-044236 A | 2/2000 |
| JP | 2000-150900 A | 5/2000 |

(56) References Cited

FOREIGN PATENT DOCUMENTS

| JP | 2001-339045 A | 12/2001 |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165808 A | 6/2006 |
| JP | 2007-042730 A | 2/2007 |
| JP | 2009-070939 A | 4/2009 |
| JP | 2010-251735 A | 11/2010 |
| JP | 2011-076079 A | 4/2011 |
| JP | 2012-019682 A | 1/2012 |
| JP | 2012-084860 A | 4/2012 |
| WO | 2004/114391 A1 | 12/2004 |
| WO | WO-2011/155295 | 12/2011 |
| WO | WO-2012/036104 | 3/2012 |

OTHER PUBLICATIONS

Asaoka, Y et al., "29.1: Polarizer-Free Reflective LCD Combined with Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

(56) References Cited

OTHER PUBLICATIONS

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector with Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display with Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Gate Insulator, Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 4A1
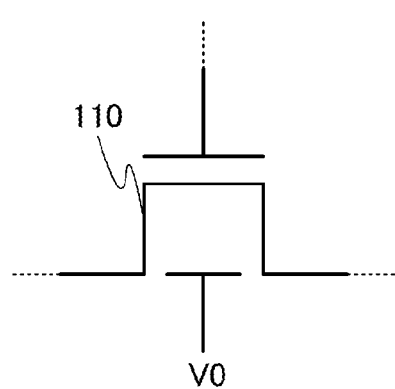
FIG. 4A2
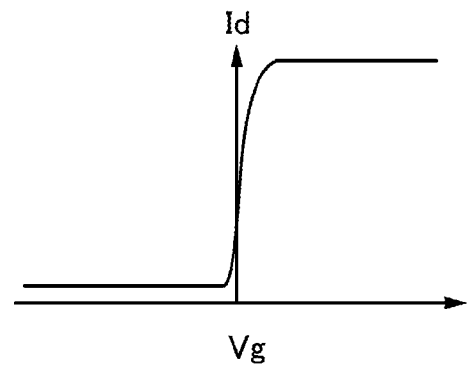
FIG. 4B1
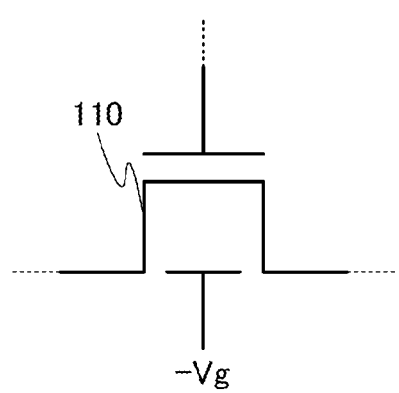
FIG. 4B2
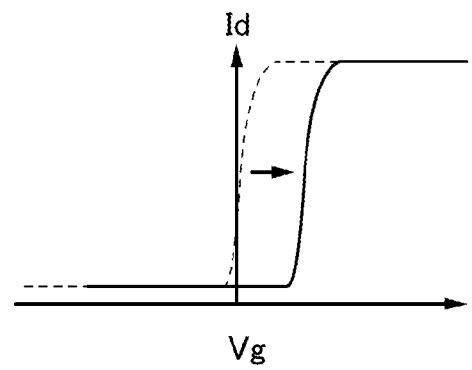

FIG. 20A1
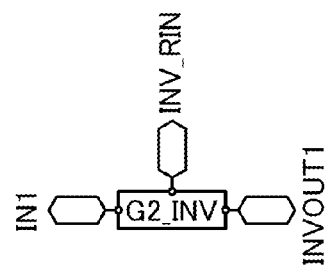
FIG. 20A2
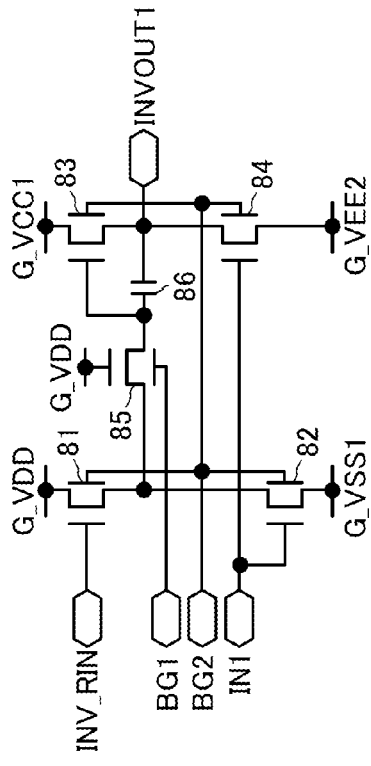
FIG. 20B1
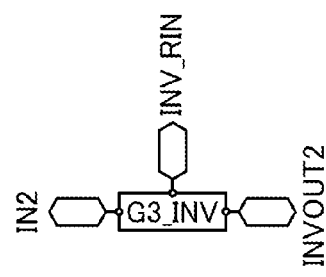
FIG. 20B2
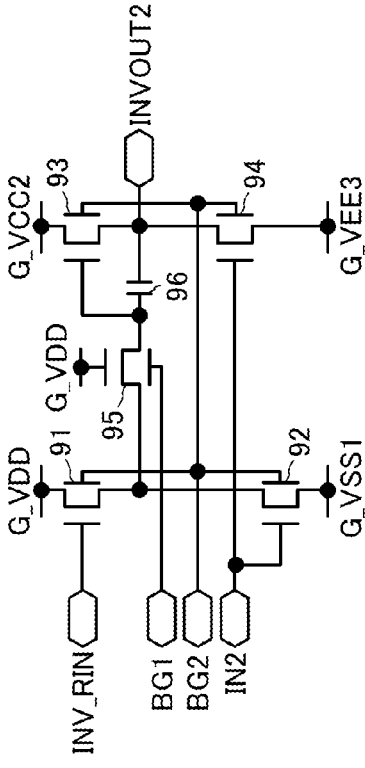

SEMICONDUCTOR DEVICE AND ELECTRONIC DEVICE

BACKGROUND OF THE INVENTION

1. Field of the Invention

The present invention relates to a semiconductor device. In addition, the present invention relates to an electronic device including the semiconductor device.

2. Description of the Related Art

In recent years, development of semiconductor devices including transistors has been advanced.

In the above semiconductor device, control of the threshold voltage of the transistor is important. For example, a transistor having normally-on characteristics causes various problems in that malfunction is likely to be caused when in operation and that power consumption is increased when not in operation.

As a method for controlling the threshold voltage of a transistor, a method for shifting the threshold voltage of a transistor by supplying a power source potential to a back gate of the transistor has been known (see Patent Document 1).

REFERENCE

[Patent Document 1] Japanese Published Patent Application No. 2006-165808

SUMMARY OF THE INVENTION

However, the conventional method for controlling the threshold voltage of a transistor has a problem of high power consumption.

For example, in a semiconductor device disclosed in Patent Document 1, it is necessary to constantly keep supplying a power source potential to a back gate of a transistor when in operation. Therefore, for example, a power source circuit for generating the power source potential needs to be kept operating; thus, it is difficult to reduce power consumption.

In view of the above problem, one object of one embodiment of the present invention is to reduce power consumption.

According to one embodiment of the present invention, a power source potential is intermittently supplied from a power source circuit to a back gate of a transistor, using a power supply control switch. At this time, the power supply control switch is formed using, for example, a control transistor with low off-state current.

With the power supply control switch, the potential of the back gate can be held for a certain period of time when the power supply control switch is off, that is, the back gate of the transistor is in a floating state. Thus, it is not necessary to constantly supply a power source potential to the back gate of the transistor from the power source circuit; therefore, supply of a power source voltage to the power source circuit can be stopped when not needed.

According to one embodiment of the present invention, supply of a power source potential from a power source circuit to a back gate of a transistor is intermittently stopped in this manner to reduce power consumption.

One embodiment of the present invention is a semiconductor device including a power source circuit for generating a power source potential, and a power supply control switch for controlling supply of the power source potential from the power source circuit to a back gate of a transistor. In the semiconductor device, the power supply control switch includes a control transistor for controlling conduction between the power source circuit and the back gate of the transistor by being turned on or off in accordance with a pulse signal that is input into a control terminal of the control transistor.

Further, in the one embodiment of the present invention, the power source potential supplied to the back gate of the transistor is switched between binary power source potentials, for example, a negative power source potential and a positive power source potential, whereby the off-state current is reduced when the transistor is off and the on-state current is increased when the transistor is on. Note that the power source potential supplied to the back gate of the transistor may be switched not only between the binary power source potentials but also between trinary or more power source potentials.

Another embodiment of the present invention is a semiconductor device including a first power source circuit for generating a first power source potential, a first power supply control switch for controlling supply of the first power source potential from the first power source circuit to a back gate of a transistor, a first power source switch for controlling supply of a first power source voltage to the first power source circuit, a second power source circuit for generating a second power source potential, a second power supply control switch for controlling supply of the second power source potential from the second power source circuit to the back gate of the transistor, and a second power source switch for controlling supply of a second power source voltage to the second power source circuit. In the semiconductor device, the first power supply control switch includes a first control transistor for controlling conduction between the first power source circuit and the back gate of the transistor by being turned on or off in accordance with a first pulse signal that is input into a control terminal of the first control transistor, the second power supply control switch includes a second control transistor for controlling conduction between the second power source circuit and the back gate of the transistor by being turned on or off in accordance with a second pulse signal that is input into a control terminal of the second control transistor, off-state currents per micrometer of channel widths of the first control transistor and the second control transistor are lower than or equal to 100 zA, when one of the first pulse signal and the second pulse signal is at a high level, the other of the first pulse signal and the second pulse signal is at a low level, when the first power source switch is off, the first control transistor is off, and when the second power source switch is off, the second control transistor is off.

Another embodiment of the present invention is an electronic device including any of the above semiconductor devices.

According to one embodiment of the present invention, supply of a power source potential to a back gate of a transistor can be intermittently stopped even in the case of controlling the threshold voltage of the transistor; therefore, power consumption can be reduced.

BRIEF DESCRIPTION OF THE DRAWINGS

FIGS. 4A-1 and 4A-2 and FIGS. 4B-1 and 4B-2 show examples of a semiconductor device.

FIGS. 20A-1 and 20A-2 and FIGS. 20B-1 and 20B-2 show examples of inverters.

DETAILED DESCRIPTION OF THE INVENTION

Embodiment of the present invention will be described below. Note that it will be readily appreciated by those skilled in the art that details of the embodiments can be modified in various ways without departing from the spirit and scope of the present invention. Thus, the present invention should not be limited to the description of the following embodiments, for example.

Note that the contents in different embodiments can be combined with one another as appropriate. In addition, the contents of the embodiments can be replaced with each other as appropriate.

Further, the ordinal numbers such as "first" and "second" are used to avoid confusion between components and do not limit the number of each component.
[Embodiment 1]

In this embodiment, an example of a semiconductor device of one embodiment of the present invention will be described.

Note that in this specification, a semiconductor device refers to all devices that can function by utilizing semiconductor properties, and integrated circuits such as sensors or large-scale integration (LSI), display devices, and the like are all semiconductor devices.

A structure example of a semiconductor device in this embodiment is described with reference to FIG. 1.

Figure 1:
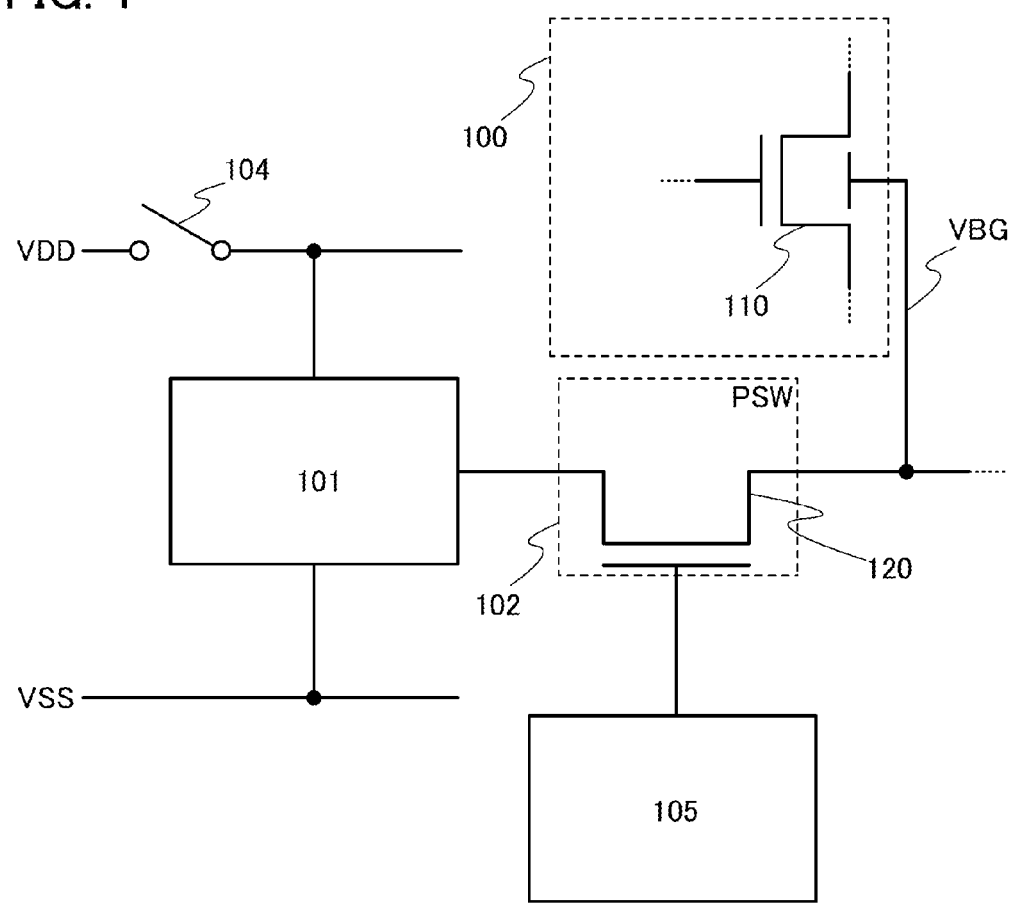
FIG. 1 shows an example of a semiconductor device.

A semiconductor device shown in FIG. 1 includes a power source circuit 101 and a power supply control switch (also referred to as a PSW) 102.

Further, a transistor 110 shown in FIG. 1 is a transistor capable of controlling a back-gate potential (also referred to as VBG). The transistor 110 is provided in a functional circuit 100 included in the semiconductor device, for example.

As the functional circuit 100, various circuits having a specific function can be used. For example, the functional circuit 100 includes a semiconductor device or the like including a gate driver, a source driver, LSI, a sensor, or a pixel portion.

The power source circuit 101 shown in FIG. 1 has a function of generating a power source potential Vx on the basis of an input power source voltage. Note that the power source voltage corresponds to a potential difference between a power source potential VDD and a power source potential VSS. Further, a switch 104 is turned off so that supply of a power source voltage to the power source circuit 101 is stopped. Note that one embodiment of the present invention is not limited to the structure of FIG. 1, and supply of the power source potential VSS to the power source circuit 101 may be controlled by the switch 104.

The power source circuit 101 includes, for example, a charge pump or an inverted converter. Alternatively, the power source circuit 101 may include a Cuk-type converter.

The power supply control switch 102 has a function of controlling supply of the power source potential from the power source circuit 101 to the back gate of the transistor 110.

The power supply control switch 102 includes a control transistor 120. The control transistor 120 has a function of controlling conduction between the power source circuit 101 and the back gate of the transistor 110 by being turned on or off in accordance with a pulse signal that is input into a control terminal. In FIG. 1, as an example, a gate of the transistor 120 is described as the control terminal. Further, one embodiment of the present invention is not limited to the structure of FIG. 1, and the power supply control switch 102 may be formed using, for example, an analog switch or the like including the control transistor 120.

At this time, the pulse signal is input from a pulse output circuit 105 into the gate of the control transistor 120, for example. An interval between pulses of the pulse signal is preferably 1 second or longer, more preferably 30 seconds or longer, further preferably one minute or longer. For example, the interval between the pulses of the pulse signal that is output from the pulse output circuit 105 can be controlled by a control signal or the like. Note that the interval between the pulses is not necessarily constant. Alternatively, the pulse output circuit 105 may be included in the semiconductor device.

A transistor with low off-state current can be used as the control transistor 120. Note that the value of the cutoff current in the control transistor 120 is preferred to be smaller than the value of the cutoff current in the transistor 110. For example, when the ratio between the channel length (L) and the channel width (W) (also referred to as an L/W ratio) of the control transistor 120 is made larger than the L/W ratio of the transistor 110, the value of the cutoff current in the control transistor 120 can be made smaller than the value of the cutoff current in the transistor 110.

The transistor with low off-state current can be, for example, a transistor that includes a channel formation region including an oxide semiconductor with a wider bandgap than silicon and is substantially i-type. Here, the carrier density of the oxide semiconductor is preferred to be lower than $1\times10^{14}$ atoms/cm$^3$, more preferably lower than $1\times10^{12}$ atoms cm$^3$, further preferably lower than $1\times10^{11}$ atoms/cm$^3$. The transistor including the oxide semiconductor can be fabricated in such a manner that, for example, impurities such as hydrogen or water are reduced as much as possible and oxygen vacancies are reduced as much as possible by supply of oxygen. At this time, the amount of hydrogen regarded as a donor impurity in the channel formation region is preferred to be lower than or equal to $1\times10^{19}$ atoms/cm$^3$, more preferably lower than or equal to $1\times10^{18}$ atoms/cm$^3$.

For example, an In-based metal oxide, a Zn-based metal oxide, an In—Zn-based metal oxide, or an In—Ga—Zn-based metal oxide can be used as the oxide semiconductor. Alternatively, a metal oxide including another metal element instead of part or all of Ga in the In—Ga—Zn-based metal oxide may be used.

Alternatively, as another metal element, it is favorable to use one or more elements of titanium, zirconium, hafnium, germanium, tin, lanthanum, cerium, praseodymium, neodymium, samarium, europium, gadolinium, terbium, dysprosium, holmium, erbium, thulium, ytterbium, and lutetium. These metal elements function as a stabilizer. Note that the amount of such a metal element added is determined so that the metal oxide can function as a semiconductor.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) layer, and the like.

The amorphous oxide semiconductor layer has disordered atomic arrangement and no crystalline component. A typical example thereof is an oxide semiconductor layer in which no crystal part exists even in a microscopic region, and the whole of the layer is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS layer is one of oxide semiconductor layers including a plurality of crystal parts, and most of each crystal part fits inside a cube whose one side is less than 100 nm. Thus, there is a case where a crystal part included in the CAAC-OS layer fits a cube whose one side is less than 10 nm, less than 5 nm, or less than 3 nm. The density of defect states of the CAAC-OS layer is lower than that of the microcrystalline oxide semiconductor layer. The CAAC-OS layer is described in detail below.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the TEM image of the CAAC-layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS layer, a peak is not clearly observed even when φ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is in some cases higher than that in the vicinity of the formation surface. Further, when an impurity is added to the CAAC-OS layer, the crystallinity in a region to which the impurity is added is changed, and the degree of crystallinity in the CAAC-OS layer varies depends on regions.

Note that when the CAAC-OS layer with an InGaZnO$_4$ crystal is analyzed by an out-of-plane method, a peak of 2θ may also be observed at around 36°, in addition to the peak of 2θ at around 31°. The peak of 2θ at around 36° is derived from the (311) plane of a ZnGa$_2$O$_4$ crystal; such a peak indicates that a ZnGa$_2$O$_4$ crystal is included in part of the CAAC-OS layer including the InGaZnO$_4$ crystal. It is preferred that in the CAAC-OS layer, a peak of 2θ appear at around 31° and a peak of 2θ do not appear at around 36°.

In a transistor using the CAAC-OS layer, change in electrical characteristics due to irradiation with visible light or ultraviolet light is small. Thus, the transistor has high reliability.

Note that an oxide semiconductor layer may be a stacked layer including two or more layers of an amorphous oxide semiconductor layer, a microcrystalline oxide semiconductor layer, and a CAAC-OS layer, for example.

Since the transistor including the oxide semiconductor has a wider bandgap, leakage current generated by thermal excitation is low and the number of carriers in a semiconductor layer is extremely small; thus, the off-state current can be lowered. For example, the off-state current per micrometer of the channel width of the transistor at room temperature (25° C.) is lower than or equal to $1 \times 10^{-19}$ A (100 zA), preferably lower than or equal to $1 \times 10^{-22}$ A (100 yA). It is preferred that the off-state current of the transistor be as low as possible; the lowest level of the off-state current of the transistor is estimated to be about $1 \times 10^{-30}$ A/μm.

As the transistor with low off-state current, a transistor whose channel formation region is formed using an oxide semiconductor containing indium, zinc, and gallium is used and the level of its off-state current is described here.

Since the value of the off-state current of the transistor is extremely small, in order to measure the off-state current, it is necessary to fabricate a transistor with a relatively large size and to estimate an off-state current that actually flows.

Figure 2:
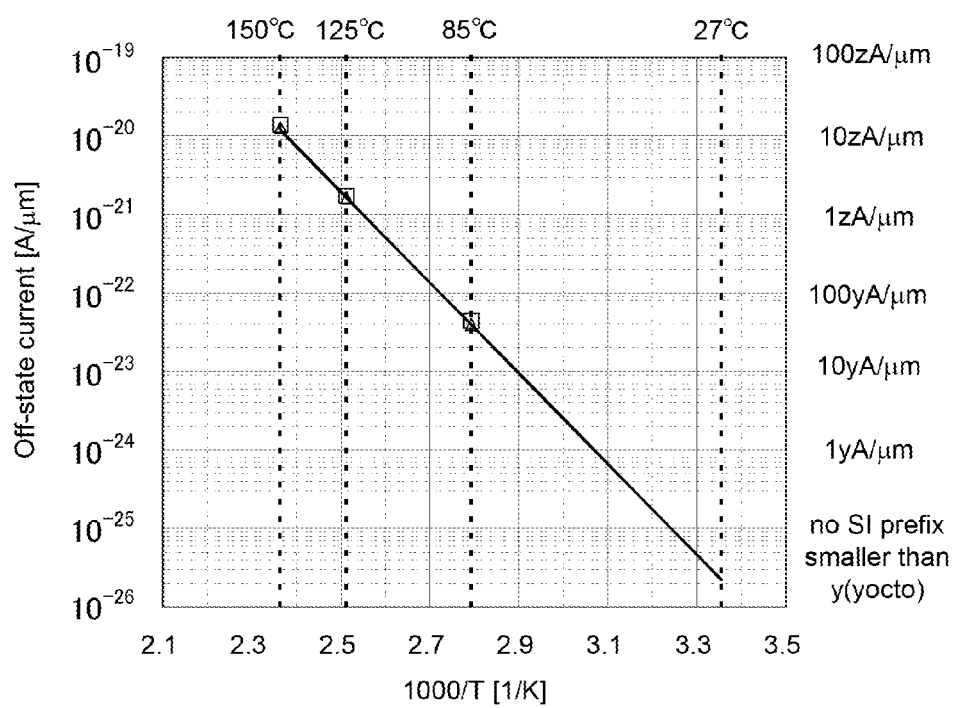
FIG. 2 shows an off-state current of a transistor.

As an example, FIG. 2 shows, in a transistor having a channel width W of 1 m (1,000,000 μm) and a channel length L of 3 μm, an Arrhenius plot of the off-state current value which is estimated from the value of the off-state current per micrometer of the channel width W when the temperature is changed to 150° C., 125° C., and 85° C.

As shown in FIG. 2, for example, the off-state current of the transistor per micrometer of the channel width W at 27° C. is lower than or equal to $1 \times 10^{-25}$ A. It is found from FIG. 2 that the transistor whose channel formation region is formed using the oxide semiconductor containing indium, zinc, and gallium has an extremely low off-state current.

The above is the description of the power supply control switch 102.

Next, an example of a method for driving the semiconductor device shown in FIG. 1 is described with reference to FIGS. 3A and 3B. As an example here, the control transistor 120 and the transistor 110 are n-channel transistors, and the potential supplied to the back gate of the transistor 110 is a negative power source potential –Vx.

Figure 3A:
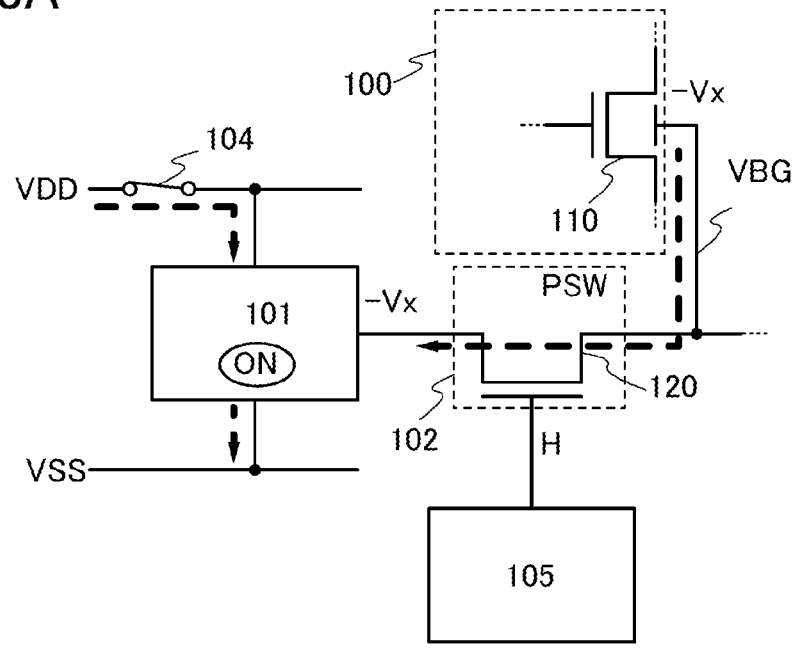
FIGS. 3A and 3B show examples of a method for driving a semiconductor device.

First, the control transistor 120 is turned on as shown in FIG. 3A. For example, when a pulse of a pulse signal is input from the pulse output circuit 105 into the gate of the control transistor 120, the gate has a high-level potential (H), so that the control transistor 120 is turned on. Note that a power source voltage is supplied to the power source circuit 101 and the power source circuit 101 is turned on in advance by turning on the switch 104 before the control transistor 120 is turned on.

When the control transistor 120 is on, current flows as an arrow shown in FIG. 3A, the negative power source potential –Vx is supplied from the power source circuit 101 to the back gate of the transistor 110, and the level of the potential of the back gate (VBG) becomes equivalent to the level of the negative power source potential –Vx, for example.

At this time, the threshold voltage of the transistor 110 is shifted in the positive direction.

Here, a change in the threshold voltage of the transistor 110 due to the potential of the back gate is described with reference to FIGS. 4A-1, 4A-2, 4B-1, and 4B-2.

FIG. 4A-1 shows the case where the back-gate potential of the transistor 110 is a reference potential V0, and FIG. 4A-2 shows the threshold voltage of the transistor 110 in the case where the back-gate potential thereof is the reference potential V0. Note that the reference potential V0 may be 0 V, a source potential, or a ground potential, for example.

FIG. 4B-1 shows the case where the back-gate potential of the transistor 110 is a negative power source potential –Vg, and FIG. 4B-2 shows the threshold voltage of the transistor 110 in the case where the back-gate potential thereof is the negative power source potential –Vg.

For example, the threshold voltage of an n-channel transistor whose channel formation region contains an oxide semiconductor is shifted in the positive direction because, when the back gate has a negative potential, the width of a depletion layer expands, so that a body current is unlikely to flow. When the back-gate potential of the transistor 110 is the reference potential V0, the threshold voltage is as shown in FIG. 4A-2, whereas when the back-gate potential thereof is the negative power source potential –Vg, the threshold voltage is shifted in the positive direction as shown in FIG. 4B-2. The back-gate potential of the transistor 110 is controlled in this manner, whereby a normally-on transistor can be changed to a normally-off transistor, for example.

Figure 3B:
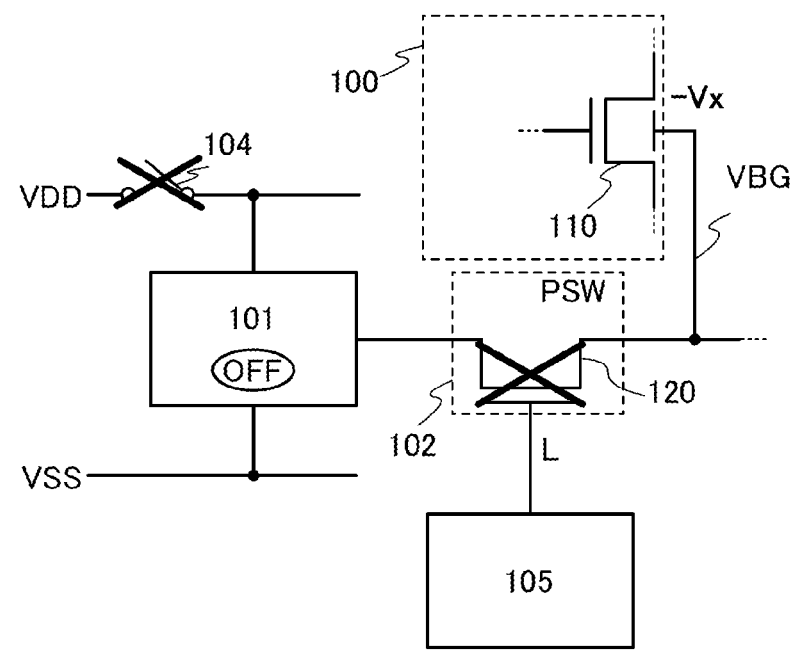

Further, the control transistor 120 is turned off as shown in FIG. 3B. For example, when input of a pulse signal from the pulse output circuit 105 into the control transistor 120 is stopped, the gate of the control transistor 120 has a low-level potential (L), so that the control transistor 120 is turned off. Note that the switch 104 is turned off after the control transistor 120 is turned off, whereby supply of a power source voltage to the power source circuit 101 is stopped so that the power source circuit 101 is off.

When the control transistor 120 is off, the power source circuit 101 is off and supply of a power source potential from the power source circuit 101 to the back gate of the transistor 110 is stopped. Further, the back gate of the transistor 110 is in a floating state, and the potential of the back gate (VBG) is held.

Further, a power source potential may be resupplied to the back gate of the transistor 110 (also referred to as recharging the back gate of the transistor 110) in such a manner that the control transistor 120 is turned on when the power source circuit 101 is on as in FIG. 3A. In the semiconductor device shown in FIG. 1, the control transistor 120 is turned on every time a pulse of the pulse signal is input from the pulse output circuit 105. Therefore, the back gate of the transistor 110 can be recharged every time the control transistor 120 is turned on.

Figure 5:
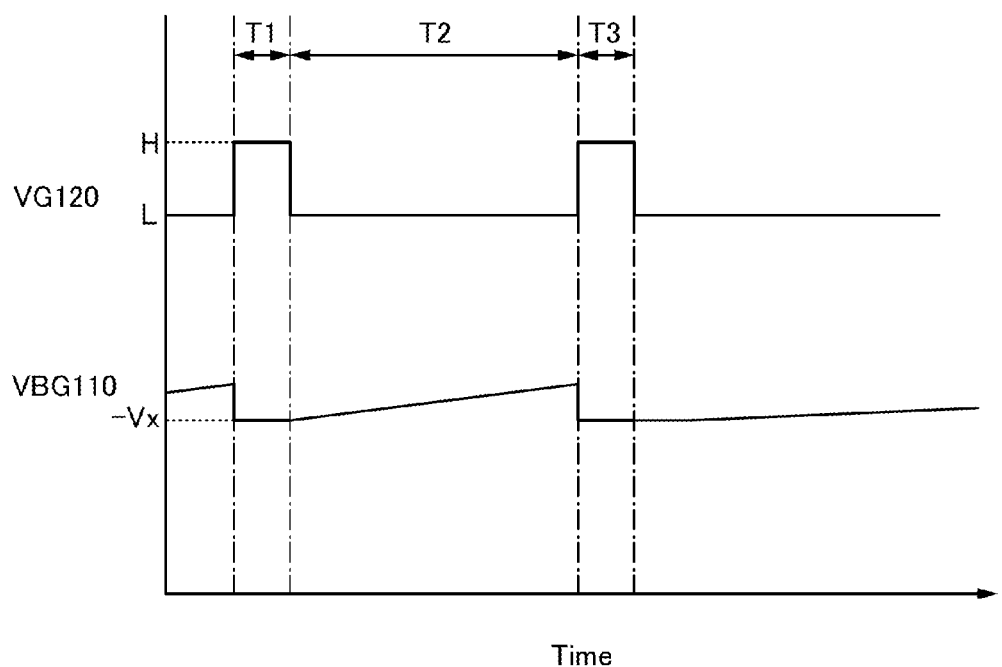
FIG. 5 shows an example of a functional circuit.

A change in potential in the case where the back gate of the transistor 110 is recharged is shown in the timing chart of FIG. 5.

In FIG. 5, the gate potential of the control transistor 120 (the potential is also referred to as VG 120) becomes a high-level potential (H) in a period T1. At this time, the control transistor 120 is turned on, and the back-gate potential of the transistor 110 (the potential is also referred to as VBG 110) becomes −Vx.

In a period T2, VG 120 becomes a low-level potential (L), and the control transistor 120 is turned off. Here, the back gate of the transistor 110 is in a floating state; however, the potential of the back gate is in some cases gradually increased more than −Vx.

However, the gate potential of the control transistor 120 (the potential is also referred to as VG 120) becomes a high-level potential (H) again in a period T3, whereby the control transistor 120 is turned on, and the back-gate potential of the transistor 110 (the potential is also referred to as VBG 110) can be returned to −Vx (the back gate can be recharged).

As shown in FIG. 5, the back gate of the transistor 110 is recharged, whereby the back-gate potential of the transistor 110 can be kept at a negative power source potential, for example. Moreover, the back gate of the transistor 110 is intermittently recharged; therefore, it is not necessary to constantly operate the power source circuit 101; thus, power consumption can be reduced.

The above is the description of the example of the method for driving the semiconductor device shown in FIG. 1.

As described with reference to FIG. 1, FIG. 2, FIGS. 3A and 3B, FIGS. 4A-1, 4A-2, 4B-1, and 4B-2, and FIG. 5, supply of a power source potential from a power source circuit to a back gate of a transistor is controlled by a power supply control switch in the example of the semiconductor device in this embodiment. With the above structure, the back-gate potential can be held when the power supply control switch is off, and supply of a power source voltage to the power source circuit can be intermittently stopped; thus, power consumption can be reduced.

Note that in the semiconductor device in this embodiment, the potential supplied to the back gate of the transistor 110 may be switched between a plurality of different potentials. An example of a structure in which the potential supplied to the back gate of the transistor 110 is switched is described with reference to FIG. 6.

Figure 6:
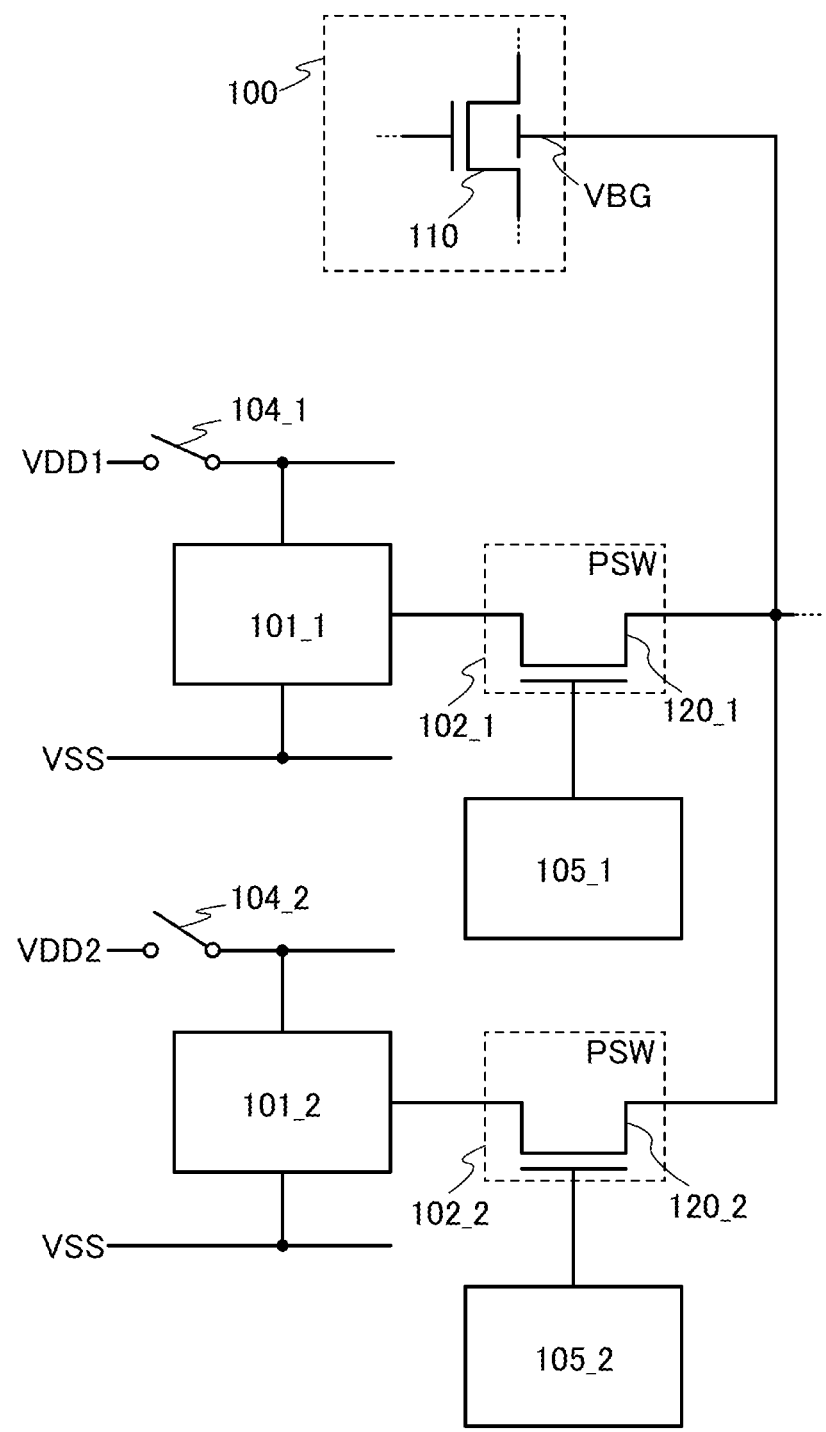
FIG. 6 shows an example of a semiconductor device.

A semiconductor device shown in FIG. 6 includes power source circuits 101_1 and 101_2, power supply control switches (also referred to as PSW) 102_1 and 102_2, and power source switches 104_1 and 1042. Note that the numbers of the power source circuits are not limited to those in FIG. 6 and the power supply control switches and the power source switches may be provided in accordance with the number of power source circuits.

Further, in FIG. 6, the transistor 110 is a transistor capable of controlling a back-gate potential (also referred to as VBG). The transistor 110 is provided in the functional circuit 100 included in the semiconductor device, for example.

The power source circuit 101_1 has a function of generating a power source potential Vx1 on the basis of an input first power source voltage. Note that the first power source voltage corresponds to a potential difference between a power source potential VDD1 and a power source potential VSS. Further, the power source switch 104_1 is turned off, so that supply of the power source potential VDD1 to the power source circuit 101_1 can be stopped and therefore supply of the first power source voltage can be stopped. The power source switch 104_1 has a function of controlling supply of the first power source voltage to the power source circuit 101_1. Note that one embodiment of the present invention is not limited to the structure of FIG. 6, and supply of the power source potential VSS to the power source circuit 101_1 may be controlled by the switch 104_1.

The power source circuit 101_2 has a function of generating a power source potential Vx2 on the basis of an input second power source voltage. Note that the second power source voltage corresponds to a potential difference between a power source potential VDD2 and a power source potential VSS. Further, the power source switch 104_2 is turned off, so that supply of the power source potential VDD2 to the power source circuit 101_2 can be stopped and therefore supply of the second power source voltage can be stopped. The power source switch 104_2 has a function of controlling supply of the second power source voltage to the power source circuit 101_2. Note that one embodiment of the present invention is not limited to the structure of FIG. 6, and supply of the power source potential VSS to the power source circuit 101_2 may be controlled by the switch 104_2. The levels of the first power source voltage and the second power source voltage may be different.

Figure 7:
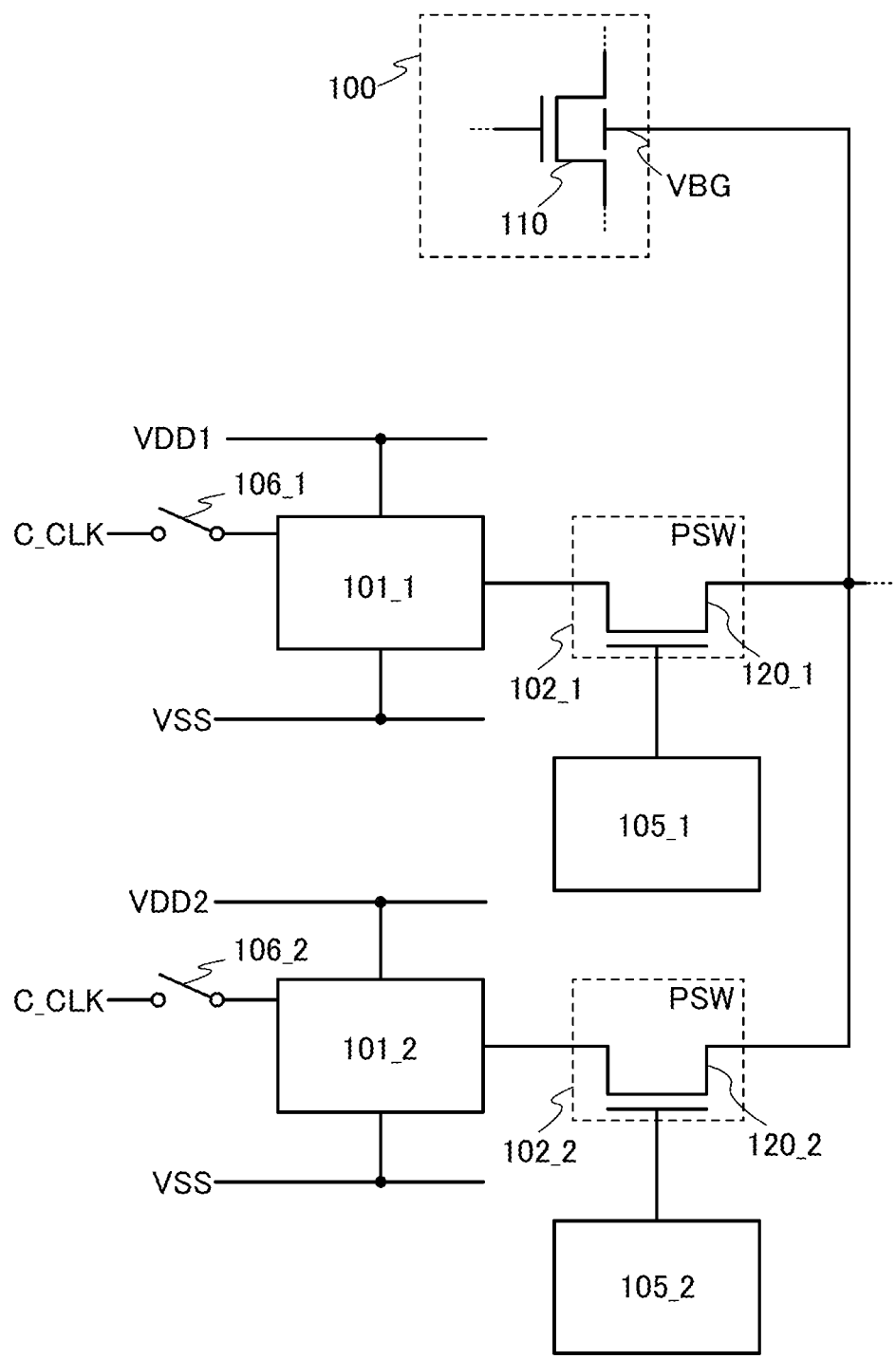
FIG. 7 shows an example of a semiconductor device.

Note that in the case of using a clock signal C_CLK for the power source circuit 101, the power source circuit 101 may be turned off in such a manner that a clock supply control switch 106 for controlling supply of the clock signal C_CLK to the power source circuit 101 is provided and supply of the clock signal C_CLK is stopped. For example, in the case of using the clock signals C_CLK for the power source circuits 101_1 and 101_2, as shown in FIG. 7, the power source circuit 101_1 or the power source circuit 101_2 may be turned off in such a manner that a clock supply control switch 106_1 for controlling supply of the clock signal C_CLK to the power source circuit 101_1 and a clock supply control switch 106_2 for controlling supply of the clock signal C_CLK to the power source circuit 101_2 are provided and supply of the clock signal C_CLK to the power source circuit 101_1 or 101_2 is stopped.

In FIG. 6, the power supply control switch 102_1 has a function of controlling supply of the power source potential from the power source circuit 101_1 to the back gate of the transistor 110, and the power supply control switch 102_2 has a function of controlling supply of the power source potential from the power source circuit 101_2 to the back gate of the transistor 110.

The power supply control switch 102_1 includes a control transistor 120_1, and the power supply control switch 102_2 includes a control transistor 120_2. The control transistor 120_1 has a function of controlling conduction between the power source circuit 101_1 and the back gate of the transistor 110 by being turned on or off in accordance with a first pulse signal that is input into a control terminal, and the control transistor 120_2 has a function of controlling conduction between the power source circuit 101_2 and the back gate of the transistor 110 by being turned on or off in accordance with a second pulse signal that is input into a control terminal. In FIG. 6, as an example, gates of the transistors 120_1 and 120_2 are described as the control terminals. Further, one embodiment of the present invention is not limited to the structure of FIG. 6, and the power supply control switch 102_1 may be formed using, for example, an analog switch or the like including the control transistor 120_1 and the power supply control switch 102_2 may be formed using, for example, an analog switch or the like including the control transistor 120_2.

At this time, the first pulse signal is input from a pulse output circuit 105_1 into the control transistor 120_1, and the second pulse signal is input from a pulse output circuit 105_2 into the control transistor 120_2. Note that a pulse of the first pulse signal and a pulse of the second pulse signal are preferred not to overlap with each other; for example, when one of the first pulse signal and the second pulse signal is at a high level, the other pulse signal is preferred to be at a low level. Further, an interval between pulses of each of the first pulse signal and the second pulse signal can be 1 second or longer, more preferably 30 seconds or longer, further preferably one minute or longer. The interval between the pulses can be controlled by a control signal, for example. Note that the interval between the pulses is not necessarily constant. Alternatively, the pulse output circuits 105_1 and 105_2 may be included in the semiconductor device.

The above transistor with low off-state current can be used as the control transistors 120_1 and 120_2.

The above is the description of the power supply control switches 102_1 and 102_2.

Next, examples of a method for driving the semiconductor device shown in FIG. 6 are described with reference to FIG. 8, FIG. 9, and FIG. 10. As an example here, the control transistors 120_1 and 120_2 and the transistor 110 are n-channel transistors.

Figure 8:
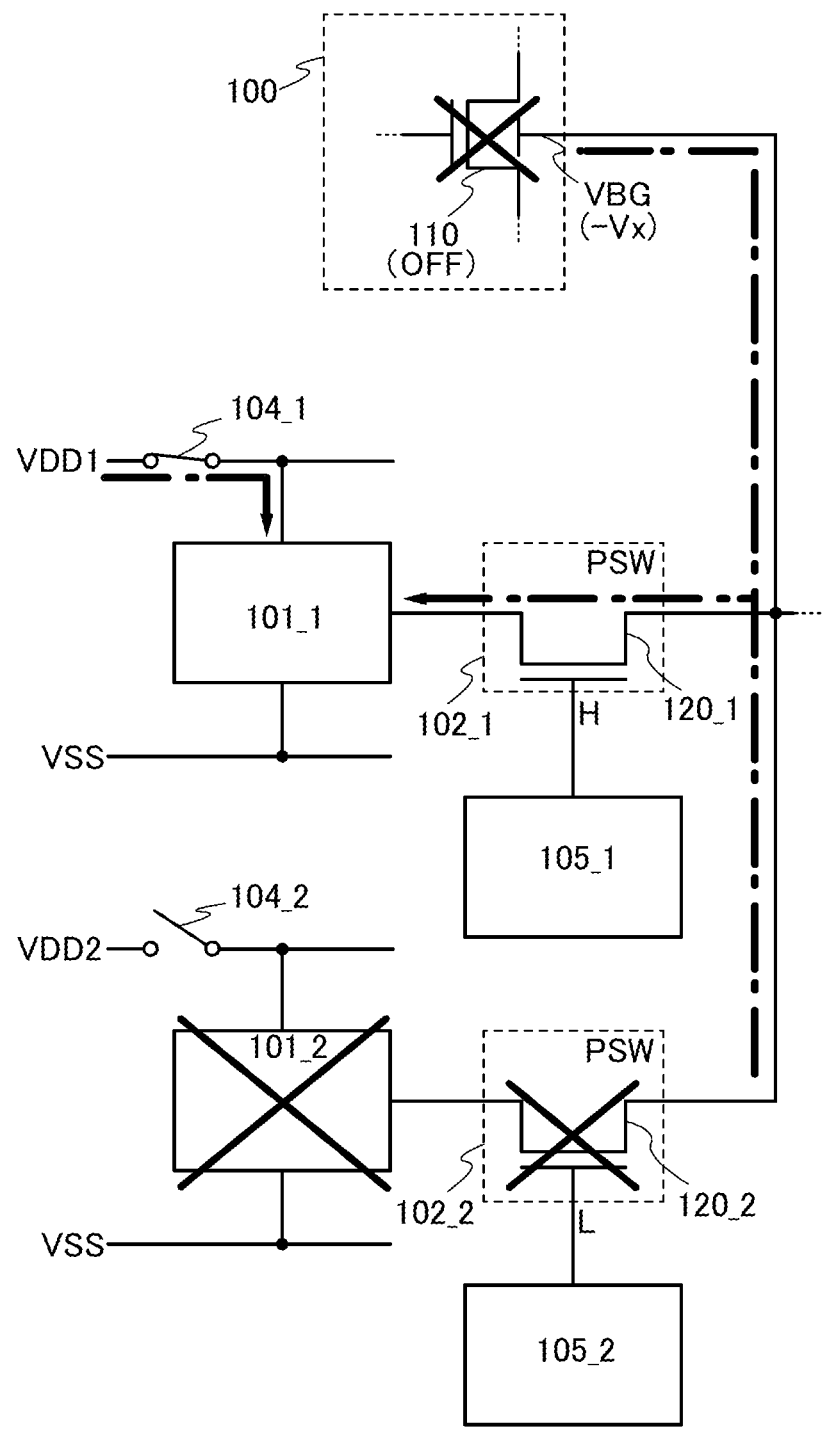
FIG. 8 shows an example of a method for driving a semiconductor device.

For example, when the transistor 110 is off, the control transistor 120_1 is turned on and the control transistor 120_2 is turned off, as shown in FIG. 8. For example, the control transistor 120_1 can be turned on when the gate of the control transistor 120_1 has a high-level potential (H) by the pulse output circuit 105_1, and the control transistor 120_2 can be turned off when the gate of the control transistor 120_2 has a low-level potential (L). Note that the first power source voltage is supplied to the power source circuit 101_1 and the power source circuit 101_1 is turned on in advance by turning on the power source switch 104_1 before the control transistor 120_1 is turned on. Further, supply of the second power source voltage to the power source circuit 101_2 is stopped and the power source circuit 101_2 is turned off in advance by turning off the power source switch 104_2.

At this time, a negative power source potential −Vx is supplied from the power source circuit 101_1 to the back gate of the transistor 110 and the level of the potential of the back gate (VBG) becomes equivalent to the level of the negative power source potential −Vx.

Further, the threshold voltage of the transistor 110 is shifted in the positive direction. Accordingly, a normally-on transistor can be changed to a normally-off transistor, for example.

Figure 9:
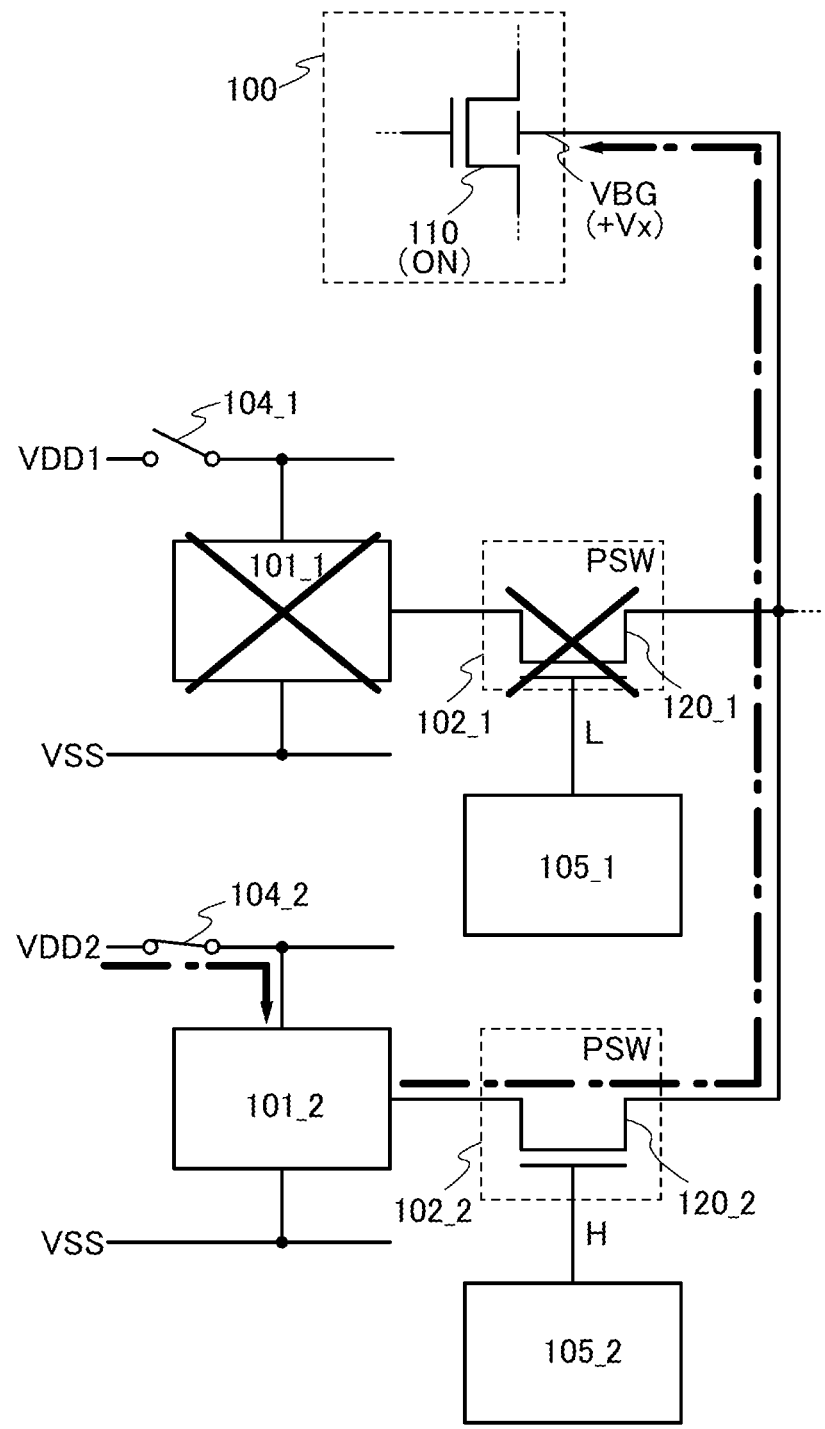
FIG. 9 shows an example of a method for driving a semiconductor device.

When the transistor 110 is on, the control transistor 120_2 is turned on and the control transistor 120_1 is turned off as shown in FIG. 9. For example, the control transistor 120_1 can be turned off when the gate of the control transistor 120_1 has a low-level potential (L) by the pulse output circuit 105_1, and the control transistor 120_2 can be turned on when the gate of the control transistor 120_2 has a high-level potential (H). Note that the second power source voltage is supplied to the power source circuit 101_2 and the power source circuit 101_2 is turned on in advance by turning on the power source switch 104_2 before the control transistor 120_2 is turned on. Further, supply of the first power source voltage to the power source circuit 101_1 is stopped and the power source circuit 101_1 is turned off in advance by turning off the power source switch 104_1.

At this time, a positive power source potential +Vx is supplied from the power source circuit 101_2 to the back gate of the transistor 110 and the level of the potential of the back gate (VBG) becomes equivalent to the level of the positive power source potential +Vx.

Further, the threshold voltage of the transistor 110 is shifted in the negative direction. Accordingly, the on-state current of the transistor can be improved, for example.

Figure 10:
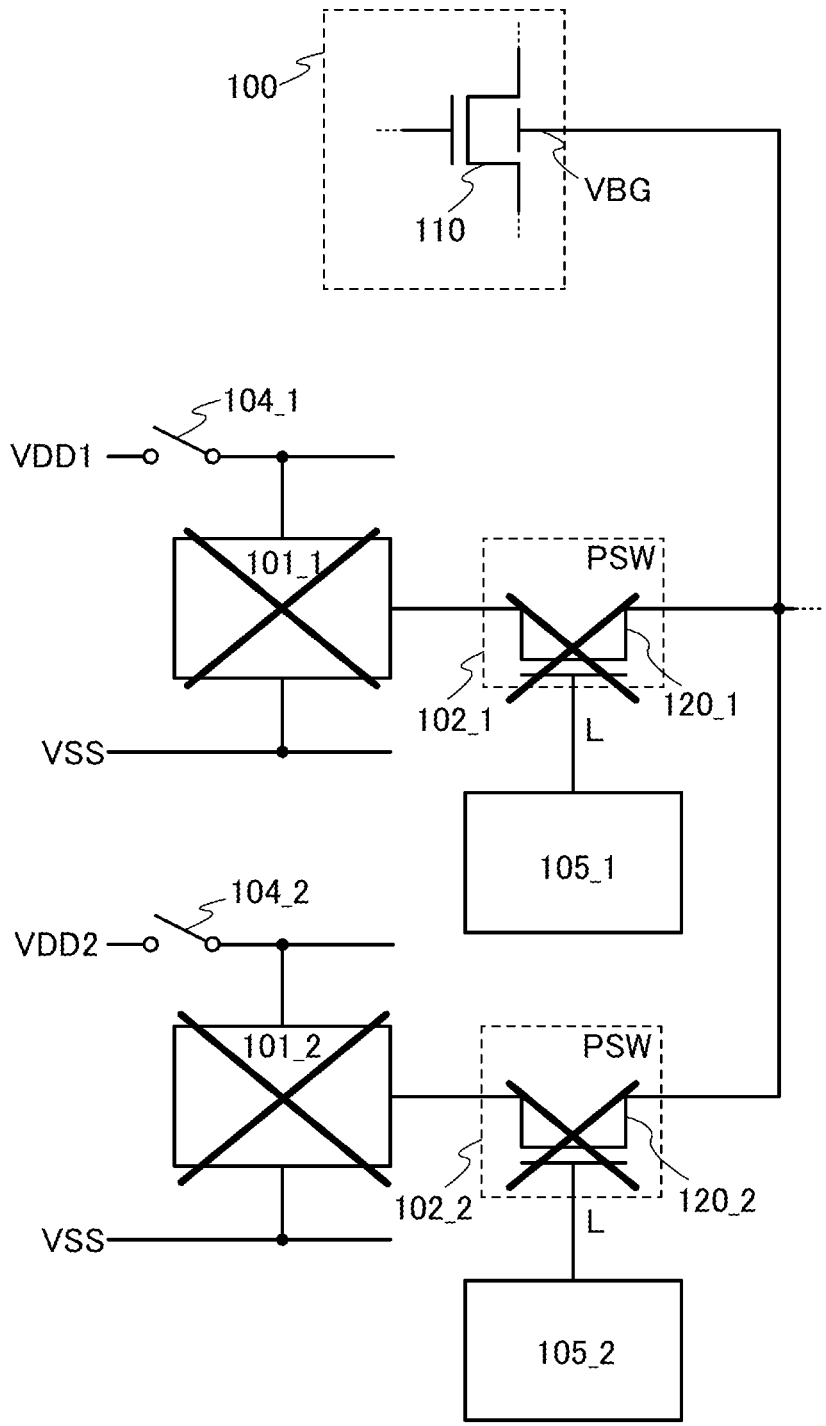
FIG. 10 shows an example of a method for driving a semiconductor device.

Further, after the negative power source potential −Vx or the positive power source potential +Vx is supplied to the back gate of the transistor 110, the control transistors 120_1 and 120_2 are turned off as shown in FIG. 10. Supply of the first power source voltage to the power source circuit 101_1 and supply of the second power source voltage to the power source circuit 101_2 are stopped and the power source circuits 101_1 and 101_2 are turned off by turning off the power source switches 104_1 and 104_2.

At this time, the back gate of the transistor 110 is in a floating state, and the potential of the back gate (VBG) is held.

After that, a power source potential may be resupplied to the back gate of the transistor 110 (also referred to as recharging the back gate of the transistor 110) in such a manner that the control transistor 120_1 is turned on and the control transistor 120_2 is turned off when the transistor 110 is off. Alternatively, a power source potential may be resupplied to the back gate of the transistor 110 (also referred to as recharging the back gate of the transistor 110) in such a manner that the control transistor 120_2 is turned on and the control transistor 120_1 is turned off when the transistor 110 is on.

The above is the description of the example of the method for driving the semiconductor device shown in FIG. 6.

As described with reference to FIG. 1, FIG. 2, FIGS. 3A and 3B, FIGS. 4A-1, 4A-2, 4B-1, and 4B-2, FIG. 5, FIG. 6, FIG. 7, FIG. 8, FIG. 9, and FIG. 10, supply of a power source potential from a power source circuit to a back gate of a transistor is controlled by a power supply control switch in the examples of the semiconductor device in this embodiment. With the above structure, the back-gate potential can be held when the power supply control switch is off, and supply of a power source voltage to the power source circuit can be intermittently stopped; thus, power consumption can be reduced.

Further, in any of the examples of the semiconductor device in this embodiment, when the potential supplied to the back gate of the transistor is switched between a plurality of power source potentials, the off-state current is reduced when the transistor is off and the on-state current is increased when the transistor is on, for example. Thus, the state of the transistor can be optimized.

Here, an example of the functional circuit 100 shown in FIG. 1 or FIG. 6 is described with reference to FIGS. 11A to 11D.

Figure 11A:
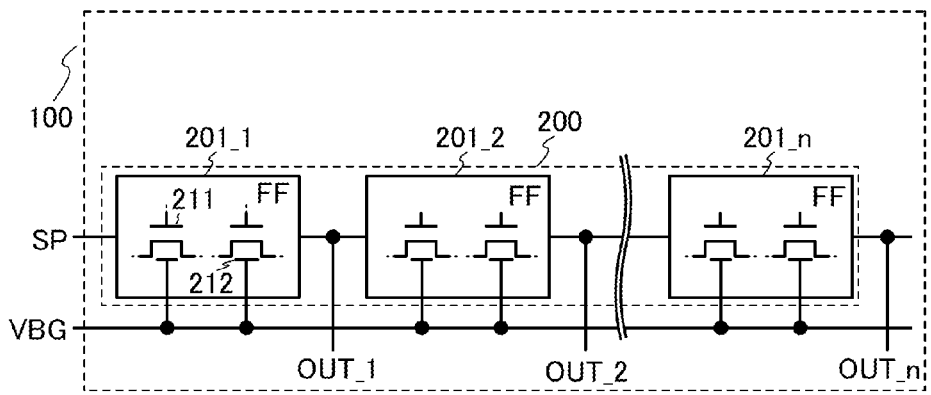
FIGS. 11A to 11D show examples of a functional circuit.

FIG. 11A shows the case where the functional circuit 100 is a gate driver.

As shown in FIG. 11A, the semiconductor device includes a gate driver, the gate driver further includes a shift register 200, and the shift register 200 still further includes flip-flop (also referred to as FF) 201_1 to 201_n (n is a natural number). Note that FIG. 11A is the case where n is larger than or equal to 3.

Each of the flip-flops 201_1 to 201_n includes a transistor 211 and a transistor 212. The transistors 211 and 212 each control an output signal of the flip-flop. At this time, back gates of the transistors 211 and 212 are each electrically connected to a power supply control switch, for example. The power supply control switch controls conduction between the power source circuit and the back gate of the transistor 211 and conduction between the power source circuit and the back gate of the transistor 212 by being turned on or off in accordance with a pulse signal. That is, the transistors 211 and 212 each correspond to the transistor 110 shown in FIG. 1, for example.

Pulses of signals OUT_1 to OUT_n which are output signals of the flip-flops 201_1 to 201_n are sequentially output by the shift register 200.

Note that the structure shown in FIG. 11A can be applied not only to a gate driver but also to another circuit such as a source driver.

Figure 11B:
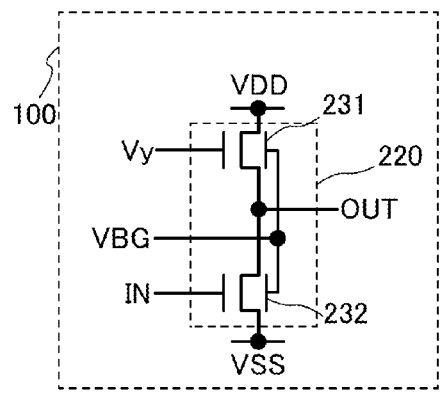

FIG. 11B shows the case where the functional circuit 100 is an integrated circuit (LSI).

As shown in FIG. 11B, the semiconductor device can include a logic circuit 220.

The logic circuit 220 includes a transistor 231 and a transistor 232. In the transistor 231, a power source potential VDD is supplied to one of a source and a drain, and a potential of the other of the source and the drain corresponds to a potential of an output signal OUT. Further, a potential Vy is supplied to a gate of the transistor 231, and channel resistance of the transistor 231 depends on the potential Vy. Moreover, in the transistor 232, one of a source and a drain is supplied with a power source potential VSS, and the other of the source and the drain is electrically connected to the other of the source and the drain of the transistor 231. Further, a potential of a gate of the transistor 232 corresponds to a potential of an input signal N. Note that in the power source potential VDD and the power source potential VSS, the power source potential VDD is a high power source potential which is relatively higher, and the power source potential VSS is a low power source potential which is relatively lower. The transistor 231 controls whether the potential of the output signal OUT is set as a first potential or not, whereas the transistor 232 controls whether the potential of the output signal OUT is set as a second potential or not. Further, back gates of the transistors 231 and 232 are electrically connected to the power supply control switch. The power supply control switch controls conduction between the power source circuit and the back gate of the transistor 231 and conduction between the power source circuit and the back gate of the transistor 232 by being turned on or off in accordance with a pulse signal. The back-gate potentials of the transistors 231 and 232 are controlled, whereby the transistors 231 and 232 can be driven as normally-off transistors even in the case of normally-on transistors, for example. Note that although the example in which the logic circuit 220 is an inverter is shown in FIG. 11B, the logic circuit 220 is not limited to an inverter and another logic circuit may be used.

Figure 11C:
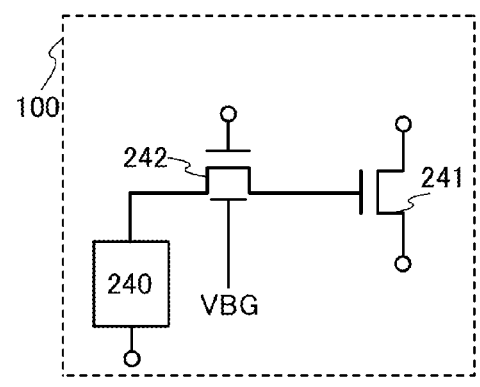

FIG. 11C shows the case where the functional circuit 100 is a sensor.

As shown in FIG. 11C, the semiconductor device includes a sensor element 240, an amplifier transistor 241, and a selection transistor 242.

As the sensor element 240, for example, an optical sensor element or a temperature sensor element can be used.

A potential of a source or a drain of the amplifier transistor 241 corresponds to a potential of an output signal.

A back gate of the selection transistor 242 is electrically connected to a power supply control switch. At this time, the power supply control switch controls conduction between the power source circuit and the back gate of the selection transistor 242 by being turned on or off in accordance with a pulse signal. The back-gate potential of the selection transistor 242 is controlled, whereby the selection transistor 242 can be driven as a normally-off transistor even in the case of a normally-on transistor, for example. The selection transistor 242 has a function of controlling conduction between the sensor element 240 and a gate of the amplifier transistor 241 by being turned on or off.

Figure 11D:
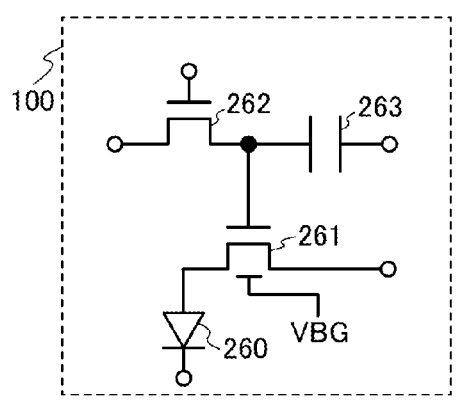

FIG. 11D shows the case of a semiconductor device including a pixel portion.

As shown in FIG. 11D, the semiconductor device includes a light-emitting element 260, a driving transistor 261, a selection transistor 262, and a storage capacitor 263.

The display state of the light-emitting element 260 is set in accordance with a data signal that is input into a pixel.

A back gate of the driving transistor 261 is electrically connected to a power supply control switch, for example. The driving transistor 261 has a function of setting the amount of current flowing through the light-emitting element 260 in accordance with a data signal. The power supply control switch controls conduction between the power source circuit and the back gate of the driving transistor 261 by being turned on or off in accordance with a pulse signal. The back-gate potential of the driving transistor 261 is controlled, whereby the driving transistor 261 can be driven as a normally-off transistor even in the case of a normally-on transistor, for example.

Input of the data signal into the pixel is controlled by turning on or off the selection transistor 262. Note that the back-gate potential of the selection transistor 262 may be controlled.

The storage capacitor 263 has a function of holding a potential in accordance with the data signal that is input into the pixel. Note that the storage capacitor 263 is not necessarily provided.

The pixel includes at least a display element and a transistor as shown in FIG. 11D.

As shown in FIGS. 11A to 11D, the semiconductor device in this embodiment can include various functional circuits. Further, the semiconductor device in this embodiment is not limited to the various functional circuits and may be composed of a memory device, a processor, or the like.

Next, an example of the power source circuit 101_1 shown in FIG. 6 is shown in FIGS. 12A and 12B, FIGS. 13A and 13B, and FIG. 14. Note that the structure that can be applied to the power source circuit 101_1 can also be applied to the power source circuit 101.

Figure 12A:
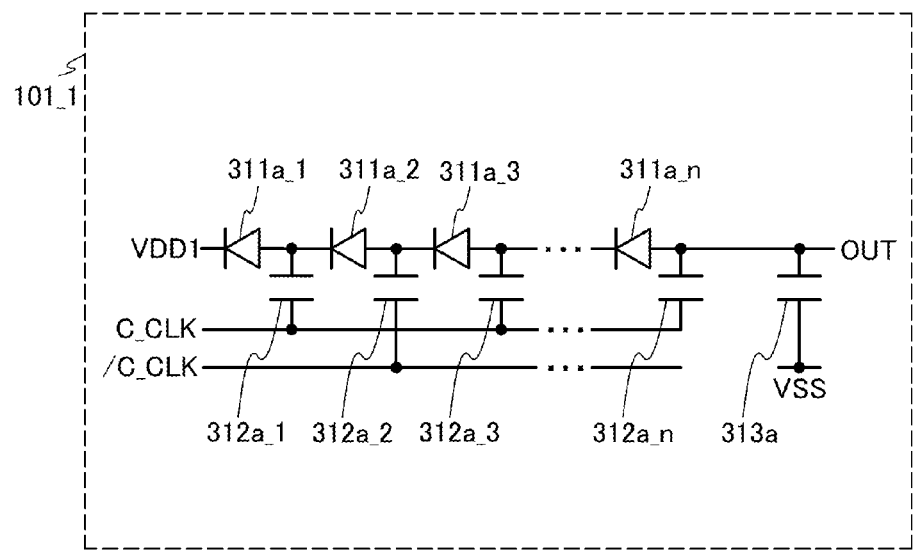
FIGS. 12A and 12B show examples of a power source circuit.

The power source circuit 101_1 shown in FIG. 12A includes diodes 311a_1 to 311a_n (n is a natural number), capacitors 312a_1 to 312a_n, and a capacitor 313a. Note that FIG. 12A is the case where n is larger than or equal to 4 as an example.

A power source potential VDD1 (the power source potential VDD in FIG. 1) is supplied to a cathode of the diode 311a_1.

A cathode of the diode 311a_k (k is a natural number larger than or equal to 2) is electrically connected to an anode of the diode 311a_k−1.

In the capacitor 312a_m (m is a natural number smaller than or equal to n), a clock signal C_CLK is input into one of a pair of electrodes of the capacitor whose m is an odd number.

In the capacitor 312a_m, an inverted clock signal/C_CLK which is an inverted signal of the clock signal C_CLK is input into one of a pair of electrodes of the capacitor whose m is an even number.

Further, the other of the pair of electrodes of the capacitor 312a_m is electrically connected to the anode of the diode 311a_m.

One of a pair of electrodes of the capacitor 313a is supplied with a power source potential VSS, and the other of the pair of electrodes is electrically connected to an anode of the diode 311a_n.

In the power source circuit 101_1 shown in FIG. 12A, voltages of the capacitors 312a_1 to 312a_n are stepped down in such a manner that the clock signal C_CLK and the inverted clock signal/C_CLK are alternately changed to a high level or a low level. Further, the voltage of the capacitor 312a_k becomes lower than the voltage of the capacitor 312a_k−1. Accordingly, a negative power source potential −Vx can be output as a signal OUT.

Figure 12B:
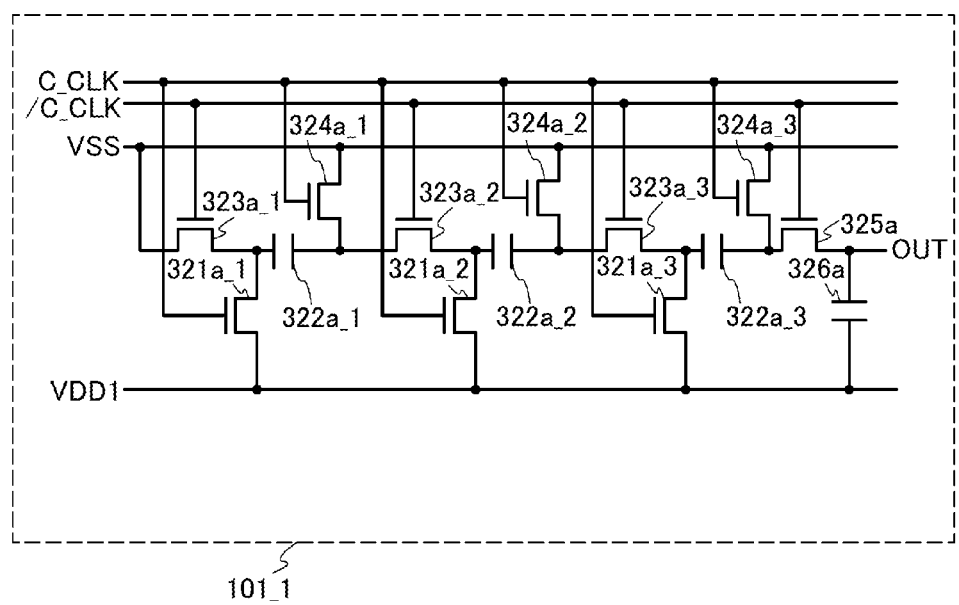

The power source circuit 101_1 shown in FIG. 12B includes transistors 321a_1 to 321a_3, capacitors 322a_1 to 322a_3, transistors 323a_1 to 323a_3, transistors 324a_1 to 324a_3, a transistor 325a, and a capacitor 326a. Note that although the power source circuit 101_1 shown in FIG. 12B shows the case where a power source potential three time as high as an input power source potential VDD1 is generated, one embodiment of the present invention is not limited such a case.

The power source potential VDD1 is supplied to one of a source and a drain of the transistor 321a_i (i is a natural number smaller than or equal to 3). Further, a clock signal C_CLK is input into a gate of the transistor 321a_i.

One of a pair of electrodes of the capacitor 322a_i is electrically connected to the other of the source and the drain of the transistor 321a_i.

In the transistor 323a_1, one of a source and a drain is supplied with a power source potential VSS, and the other of the source and drain is electrically connected to one of the pair of electrodes of the capacitor 322a_1. Further, an inverted clock signal/C_CLK is input into a gate of the transistor 323a_1.

In the transistor 323a_j (j is a natural number larger than or equal to 2 and smaller than or equal to 3), one of a source and a drain is electrically connected to the other of the pair of electrodes of the capacitor 322a_j−1, and the other of the source and the drain is electrically connected to the one of the pair of electrodes of the capacitor 322a_j. Further, the inverted clock signal/C_CLK is input into a gate of the transistor 323a_j.

In the transistor 324a_i, one of a source and a drain is supplied with the power source potential VSS, and the other of the source and drain is electrically connected to the other of the pair of electrodes of the capacitor 322a_i.

One of a source and a drain of the transistor 325a is electrically connected to the one of the pair of electrodes of the capacitor 322a_3. Further, the inverted clock signal/C_CLK is input into a gate of the transistor 325a.

In the capacitor 326a, one of a pair of electrodes is supplied with the power source potential VDD1, and the other of the pair of electrodes is electrically connected to the other of the source and the drain of the transistor 325a.

In the power source circuit 101_1 shown in FIG. 12B, voltages of the capacitors 322a_1 to 312a_3 are stepped down in such a manner that the clock signal C_CLK and the inverted clock signal/C_CLK are alternately changed to a high level or a low level. Accordingly, a negative power source potential −Vx can be output as a signal OUT.

Figure 13A:
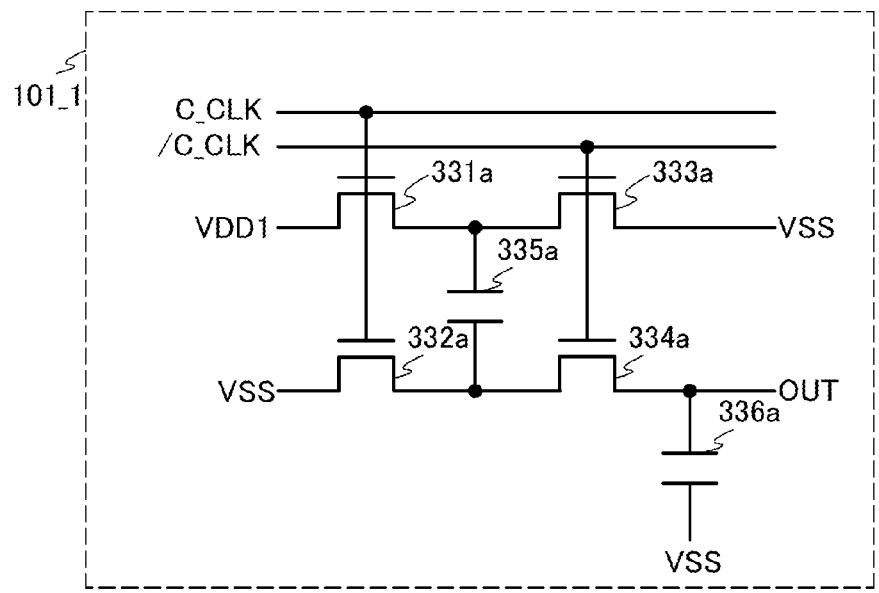
FIGS. 13A and 13B show examples of a power source circuit.

The power source circuit 101_1 shown in FIG. 13A includes transistors 331a to 334a and capacitors 335a and 336a.

A power source potential VDD1 is supplied to one of a source and a drain of the transistor 331a. Further, a clock signal C_CLK is input into a gate of the transistor 331a.

A power source potential VSS is supplied to one of a source and a drain of the transistor 332a. Further, the clock signal C_CLK is input into a gate of the transistor 332a.

In the transistor 333a, one of a source and a drain is electrically connected to the other of the source and the drain of the transistor 331a, and the other of the source and the drain is supplied with a power source potential VSS. Further, an inverted clock signal/C_CLK of the clock signal C_CLK is input into a gate of the transistor 333a.

In the transistor 334a, one of a source and a drain is electrically connected to the other of the source and the drain of the transistor 332a, and the potential of the other of the source and the drain corresponds to a potential of an output signal OUT, that is, a power source potential to be output to the back gate of the transistor 110. The inverted clock signal/C_CLK is input into a gate of the transistor 334a.

In the capacitor 335a, one of a pair of electrodes is electrically connected to the other of the source and the drain of the transistor 331a, and the other of the pair of electrodes is electrically connected to the other of the source and the drain of the transistor 332a.

In the capacitor 336a, one of a pair of electrodes is supplied with a power source potential VSS, and the other of the pair of electrodes is electrically connected to the other of the source and the drain of the transistor 334a.

In the power source circuit 101_1 shown in FIG. 13A, a power source potential to be input into the back gate of the transistor 110 can be generated in such a manner that the transistors 331a and 332a and the transistors 333a and 334a are alternately turned on or off and the first power source voltage to be input is stepped down in accordance with the clock signal C_CLK and the inverted clock signal/C_CLK.

Figure 13B:
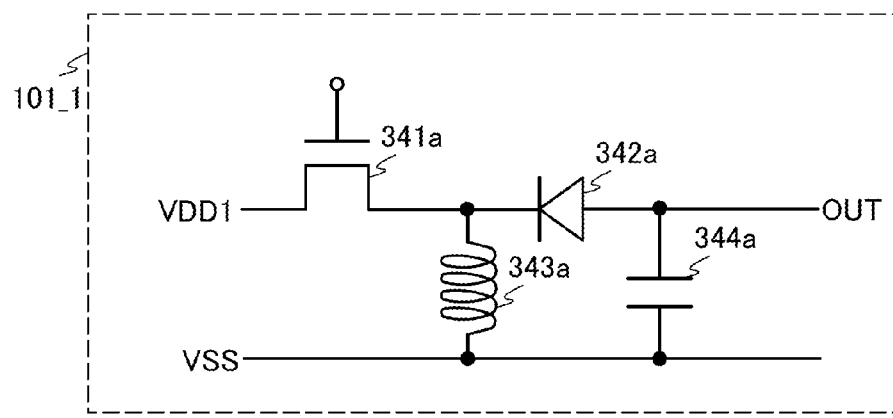

The power source circuit 101_1 shown in FIG. 13B includes a transistor 341a, a diode 342a, an inductor 343a, and a capacitor 344a.

A power source potential VDD1 is supplied to one of a source and a drain of the transistor 341a. A pulse signal is input into a gate of the transistor 341a.

In the diode 342a, a potential of an anode corresponds to a potential of an output signal OUT, that is, a power source potential to be input into the back gate of the transistor 110, and a cathode is electrically connected to the other of the source and the drain of the transistor 341a.

In the inductor 343a, one terminal is electrically connected to the other of the source and the drain of the transistor 341a, and the other terminal is supplied with a power source potential VSS.

In the capacitor 344a, one of a pair of electrodes is electrically connected to the anode of the diode 342a, and the other of the pair of electrodes is supplied with the power source potential VSS.

In the power source circuit 101_1 shown in FIG. 13B, the transistor 341a is turned on, whereby the diode 342a is brought out of conduction, and current flows through the inductor 343a. At this time, electromotive force V1 is applied to the inductor 343a. Note that the voltage applied to the capacitor 344a does not change. Further, the transistor 341a is turned off, whereby electromotive force V2 in the direction which is opposite to the direction of the electromotive force V1 is generated in the inductor 343a in order to suppress a change of its magnetic field, and the diode 342a is brought into conduction. At this time, current flows through the inductor 343a and the diode 342a and the voltage applied to the capacitor 344a is changed, whereby a power source potential to be input into the back gate of the transistor 110 can be generated.

Figure 14:
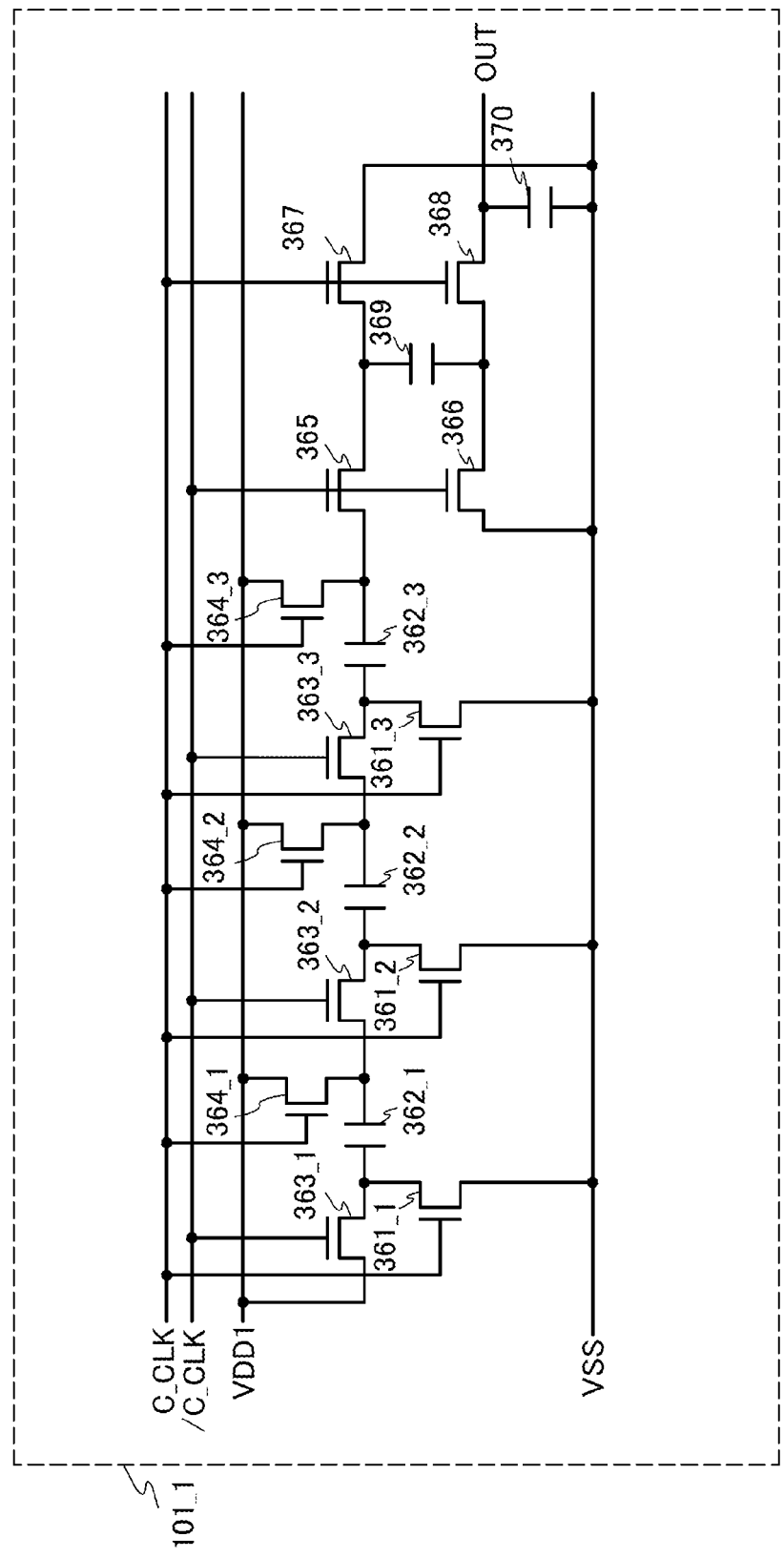
FIG. 14 shows an example of a power source circuit.

The power source circuit 101_1 shown in FIG. 14 includes transistors 361_1 to 361_3, capacitors 362_1 to 362_3, transistors 363_1 to 363_3, transistors 364_1 to 364_3, transistors 365 to 368, and capacitors 369 and 370. Note that although the power source circuit 101_1 shown in FIG. 14 shows the case where a power source potential three time as low as an input power source potential VDD1 is generated, one embodiment of the present invention is not limited such a case.

A power source potential VSS is supplied to one of a source and a drain of the transistor 361_i (i is a natural number smaller than or equal to 3). Further, a clock signal C_CLK is input into a gate of the transistor 361_i.

One of a pair of electrodes of the capacitor 362_i is electrically connected to the other of the source and the drain of the transistor 361_j.

In the transistor 363_1, one of a source and a drain is supplied with a power source potential VDD1, and the other of the source and drain is electrically connected to the one of the pair of electrodes of the capacitor 362_1. Further, an inverted clock signal/C_CLK is input into a gate of the transistor 363_1.

In the transistor 363_j (j is a natural number larger than or equal to 2 and smaller than or equal to 3), one of a source and a drain is electrically connected to the other of the pair of electrodes of the capacitor 362_j−1, and the other of the source and the drain is electrically connected to the one of the pair of electrodes of the capacitor 362_j. Further, the inverted clock signal/C_CLK is input into a gate of the transistor 363_j.

In the transistor 364_j, one of a source and a drain is supplied with the power source potential VDD1, and the other of the source and drain is electrically connected to the other of the pair of electrodes of the capacitor 362_i.

One of a source and a drain of the transistor 365 is electrically connected to the other of the pair of electrodes of the capacitor 362a_3. Further, the inverted clock signal/C_CLK is input into a gate of the transistor 365.

The power source potential VSS is supplied to one of a source and a drain of the transistor 366. Further, the inverted clock signal/C_CLK is input into a gate of the transistor 366.

In the transistor 367, one of a source and a drain is electrically connected to the other of the source and the drain of the transistor 365, and the other of the source and the drain is supplied with the power source potential VSS. Further, the clock signal C_CLK is input into a gate of the transistor 367.

In the transistor 368, one of a source and a drain is electrically connected to the other of the source and the drain of the transistor 366, and the potential of the other of the source and the drain corresponds to a potential of an output signal OUT, that is, a power source potential to be output to the back gate of the transistor 110. The clock signal/C_CLK is input into a gate of the transistor 368.

In the capacitor 369, one of a pair of electrodes is electrically connected to the other of the source and the drain of the transistor 365, and the other of the pair of electrodes is electrically connected to the other of the source and the drain of the transistor 366.

In the capacitor 370, one of a pair of electrodes is supplied with the power source potential VSS, and the other of the pair of electrodes is electrically connected to the other of the source and the drain of the transistor 368.

In the power source circuit shown 101_1 in FIG. 14, voltages of the capacitors 362_1 to 362_3 are stepped down in accordance with the clock signal C_CLK and the inverted clock signal/C_CLK. Further, a power source potential to be input into the back gate of the transistor 110 can be generated in such a manner that the transistors 365 and 366 and the transistors 367 and 368 are alternately turned on or off and the voltage of the capacitor 362_3 is stepped down to a negative voltage.

Further, an example of the power source circuit 101_2 is shown in FIGS. 15A and 15B and FIGS. 16A and 16B.

Figure 15A:
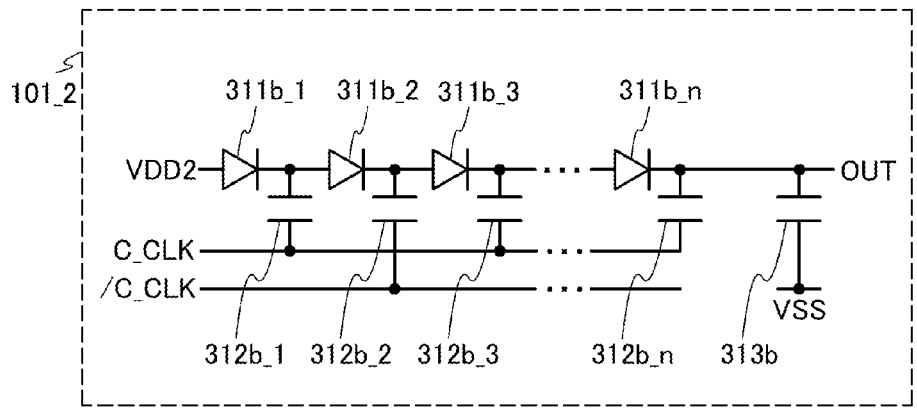
FIGS. 15A and 15B show examples of a power source circuit.

The power source circuit 101_2 shown in FIG. 15A includes diodes 311b_1 to 311b_n (n is a natural number), capacitors 312b_1 to 312b_n, and a capacitor 313b. Note that FIG. 15A is the case where n is larger than or equal to 4 as an example.

A power source potential VDD2 is supplied to an anode of the diode 311b_1.

An anode of the diode 311b_k (k is a natural number larger than or equal to 2) is electrically connected to a cathode of the diode 311b_k−1.

In the capacitor 312b_m (m is a natural number smaller than or equal to n), a clock signal C_CLK is input into one of a pair of electrodes of the capacitor whose m is an odd number.

In the capacitor 312b_m, an inverted clock signal/C_CLK which is an inverted signal of the clock signal C_CLK is input into one of a pair of electrodes of the capacitor whose m is an even number.

Further, the other of the pair of electrodes of the capacitor 312b_m is electrically connected to a cathode of the diode 311b_m.

One of a pair of electrodes of the capacitor 313b is supplied with a power source potential VSS, and the other of the pair of electrodes is electrically connected to the cathode of the diode 311b_n.

In the power source circuit 101_2 shown in FIG. 15A, voltages of the capacitors 312b_1 to 312b_n are stepped up in such a manner that the clock signal C_CLK and the inverted clock signal/C_CLK are alternately changed to a high level or a low level. Further, the voltage of the capacitor 312b_k becomes higher than the voltage of the capacitor 312b_k−1. Accordingly, a positive power source potential +Vx can be output as a signal OUT.

Figure 15B:
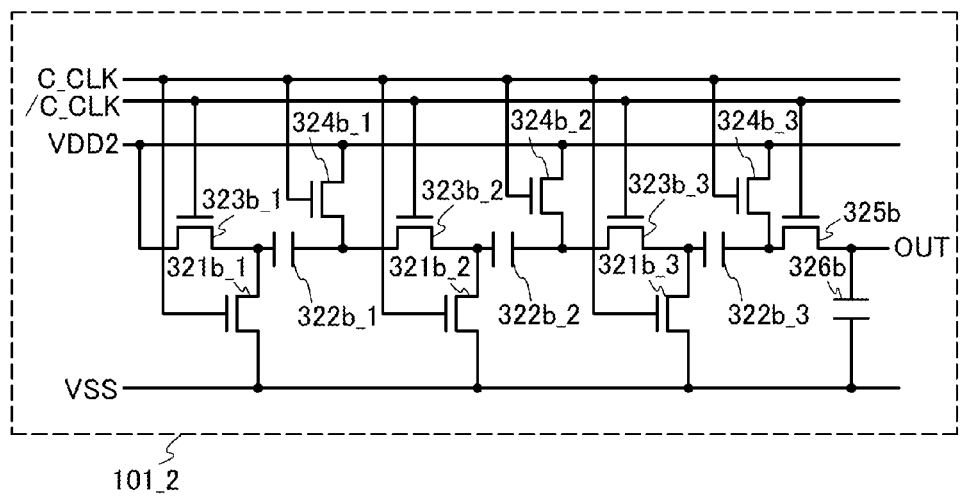

The power source circuit 101_2 shown in FIG. 15B includes transistors 321b_1 to 321b_3, capacitors 322b_1 to 322b_3, transistors 323b_1 to 323b_3, transistors 324b_1 to 324b_3, a transistor 325b, and a capacitor 326b. Note that although the power source circuit 101_2 shown in FIG. 15B shows the case where a power source potential three time as high as an input power source potential VDD2 is generated, one embodiment of the present invention is not limited such a case.

A power source potential VSS is supplied to one of a source and a drain of the transistor 321b_i (i is a natural number smaller than or equal to 3). Further, a clock signal C_CLK is input into a gate of the transistor 321b_i.

One of a pair of electrodes of the capacitor 322b_i is electrically connected to the other of the source and the drain of the transistor 321b_i.

In the transistor 323b_1, one of a source and a drain is supplied with a power source potential VDD2, and the other of the source and drain is electrically connected to the one of the pair of electrodes of the capacitor 322b_1. Further, an inverted clock signal/C_CLK is input into a gate of the transistor 323b_1.

In the transistor 323b_j (j is a natural number larger than or equal to 2 and smaller than or equal to 3), one of a source and a drain is electrically connected to the other of the pair of electrodes of the capacitor 322b_j−1, and the other of the source and the drain is electrically connected to the one of the pair of electrodes of the capacitor 322b_j. Further, the inverted clock signal/C_CLK is input into a gate of the transistor 323b_j.

In the transistor 324b_i, one of a source and a drain is supplied with the power source potential VDD2, and the other of the source and drain is electrically connected to the other of the pair of electrodes of the capacitor 322b_i.

One of a source and a drain of the transistor 325b is electrically connected to the other of the pair of electrodes of the capacitor 322b_3. Further, the inverted clock signal/C_CLK is input into a gate of the transistor 325b.

In the capacitor 326b, one of a pair of electrodes is supplied with the power source potential VSS, and the other of the pair of electrodes is electrically connected to the other of the source and the drain of the transistor 325b.

In the power source circuit 101_2 shown in FIG. 15B, voltages of the capacitors 322b_1 to 322b_3 are stepped up in such a manner that the clock signal C_CLK and the inverted clock signal/C_CLK are alternately changed to a high level or a low level. Accordingly, a positive power source potential +Vx can be output as a signal OUT.

Figure 16A:
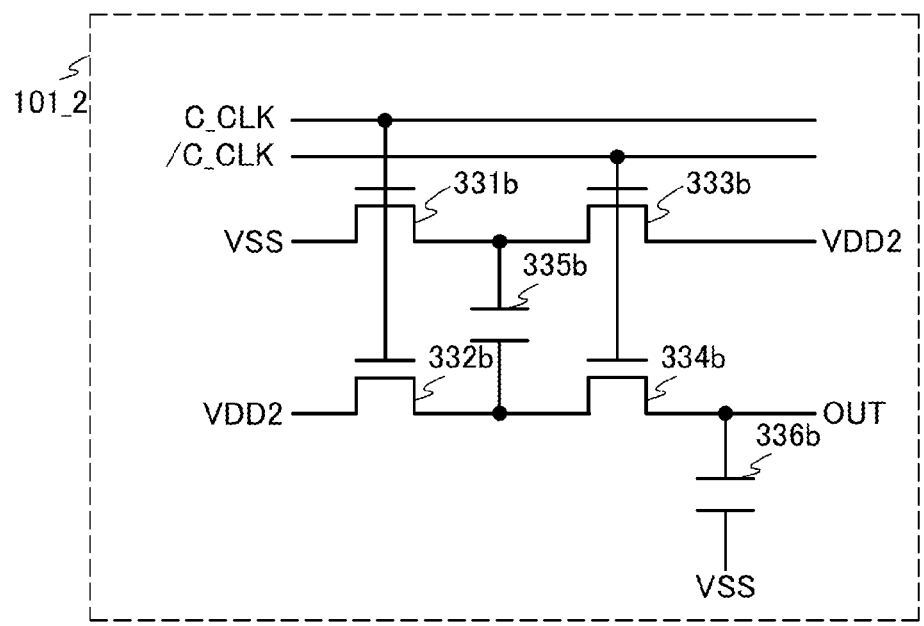
FIGS. 16A and 16B show examples of a power source circuit.

The power source circuit 101_2 shown in FIG. 16A includes transistors 331b to 334b and capacitors 335b and 336b.

A power source potential VSS is supplied to one of a source and a drain of the transistor 331b. Further, a clock signal C_CLK is input into a gate of the transistor 331b.

A power source potential VDD2 is supplied to one of a source and a drain of the transistor 332b. Further, the clock signal C_CLK is input into a gate of the transistor 332b.

In the transistor 333b, one of a source and a drain is electrically connected to the other of the source and the drain of the transistor 331b, and the other of the source and the drain is supplied with a power source potential VDD2. Further, an inverted clock signal/C_CLK which is an inverted signal of the clock signal C_CLK is input into a gate of the transistor 333b.

In the transistor 334b, one of a source and a drain is electrically connected to the other of the source and the drain of the transistor 332b, and the potential of the other of the source and the drain corresponds to a potential of an output signal OUT, that is, a power source potential to be output to the back gate of the transistor 110. The inverted clock signal/C_CLK is input into a gate of the transistor 334b.

In the capacitor 335b, one of a pair of electrodes is electrically connected to the other of the source and the drain of the transistor 331b, and the other of the pair of electrodes is electrically connected to the other of the source and the drain of the transistor 332b.

In the capacitor 336b, one of a pair of electrodes is supplied with a power source potential VSS, and the other of the pair of electrodes is electrically connected to the other of the source and the drain of the transistor 334b.

In the power source circuit 101_2 shown in FIG. 16A, a power source potential to be input into the back gate of the transistor 110 can be generated in such a manner that the transistors 331b and 332b and the transistors 333b and 334b are alternately turned on or off and the second power source voltage to be input is stepped up in accordance with the clock signal C_CLK and the inverted clock signal/C_CLK.

Figure 16B:
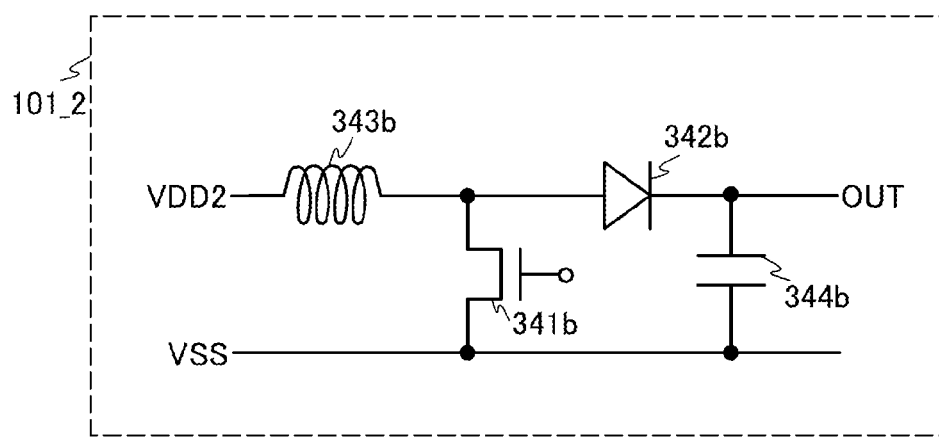

The power source circuit 101_2 shown in FIG. 16B includes a transistor 341b, a diode 342b, an inductor 343b, and a capacitor 344b.

A power source potential VSS is supplied to one of a source and a drain of the transistor 341b. A pulse signal is input into a gate of the transistor 341b.

In the diode 342b, an anode is electrically connected to the other of the source and the drain of the transistor 341b, and a potential of a cathode corresponds to a potential of an output signal OUT, that is, a power source potential Vx2 to be input into the back gate of the transistor 110.

In the inductor 343b, one terminal is supplied with a power source potential VDD2, and the other terminal is electrically connected to the other of the source and the drain of the transistor 341b.

One of a pair of electrodes of the capacitor 344b is supplied with the power source potential VSS, and the other of the pair of electrodes is electrically connected to the cathode of the diode 342b.

In the power source circuit 101_2 shown in FIG. 16B, the transistor 341b is turned on, whereby the diode 342b is brought out of conduction, and current flows through the inductor 343b. At this time, electromotive force V1 is applied to the inductor 343b. Note that the voltage applied to the capacitor 344b does not change. Further, the transistor 341b is turned off, whereby electromotive force V2 in the direction which is opposite to the direction of the electromotive force V1 is generated in the inductor 343b in order to suppress a change of its magnetic field, and the diode 342b is brought into conduction. At this time, current flows through the inductor 343b and the diode 342b and the voltage applied to the capacitor 344b is changed, whereby a power source potential to be input into the back gate of the transistor 110 can be generated.

The above is the description of the example of the power source circuit 101_2.

[Embodiment 2]

In this embodiment, an example of a semiconductor device capable of displaying images will be described.

First, a structure example of the semiconductor device in this embodiment is described with reference to FIG. 17.

Figure 17:
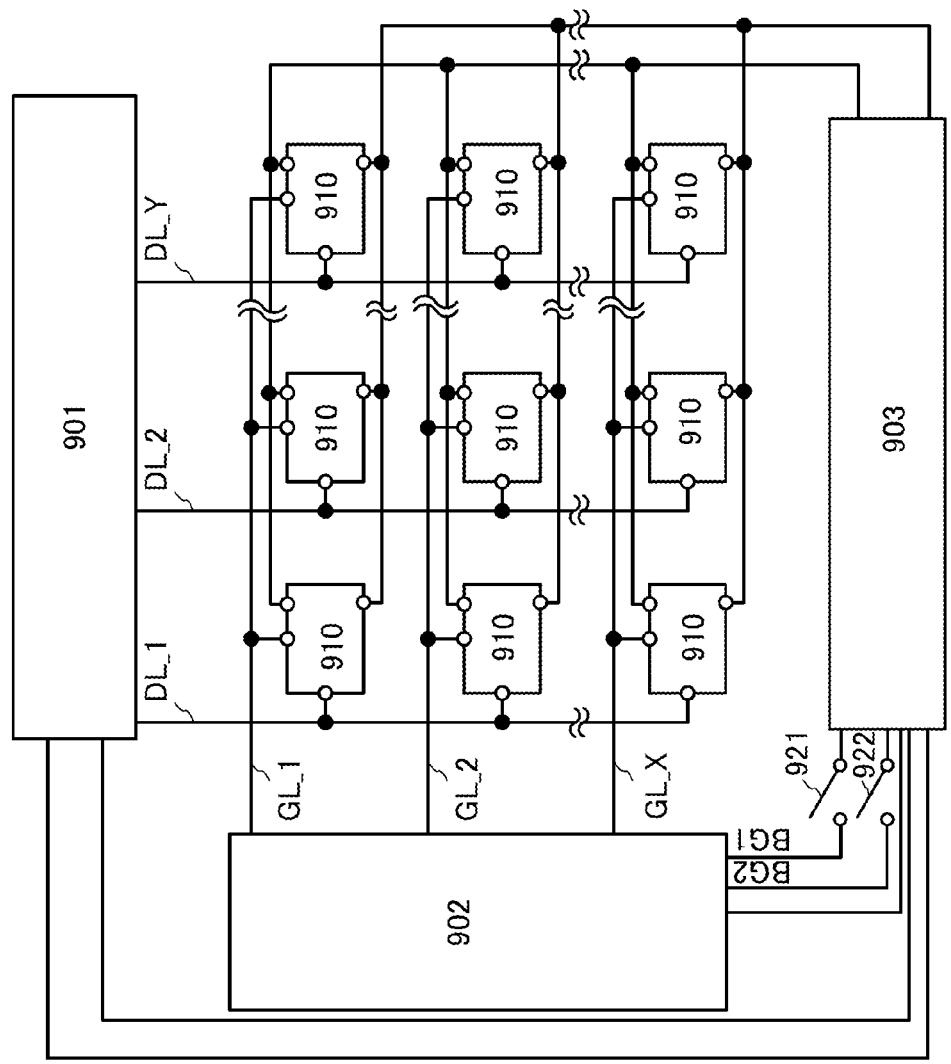
FIG. 17 shows an example of a semiconductor device.

A semiconductor device shown in FIG. 17 has a plurality of pixel circuits 910 arranged in X rows and Y columns (X and Y are natural numbers larger than or equal to 2), a source driver 901, data signal lines DL_1 to DL_Y, a gate driver 902, gate signal lines GL_1 to GL_X, a power source circuit 903, a power supply control switch 921, and a power supply control switch 922. Note that as each of the gate signal lines GL_1 to GL_X, a plurality of gate signal lines may be provided for every gate signal.

For example, one pixel is composed of three pixel circuits 910 for displaying red (R), green (G), and blue (B).

The potentials of the data signal lines DL_1 to DL_Y are controlled by the source driver 901. The source driver 901 can be formed using an analog switch, a latch circuit, and an operation amplifier, for example. In the semiconductor device shown in FIG. 17, data is input into the plurality of pixel circuits 910 via the data signal lines DL_1 to DL_Y.

The potentials of the gate signal lines GL_1 to GL_X are controlled by the gate driver 902. Note that the gate driver 902 and the pixel circuits 910 may be formed over one substrate in the same manufacturing process. The gate driver 902 is formed using a shift register, for example. The gate signal lines GL_1 to GL_X are each a wiring into which a gate signal for selecting the pixel circuit 910 for input of data is input.

Further, a power source potential or power source voltage is supplied from the power source circuit 903 to the pixel circuits 910, the source driver 901, and the gate driver 902. Note that the power source circuit 903 may be formed over a substrate different from that of the pixel circuits 910 and connected by a wiring or the like.

Further, a potential BG1 and a potential BG2 are supplied to a back gate of a transistor in the gate driver 902 via the power supply control switch 921 and the power supply control switch 922, respectively. The potential BG1 and the potential BG2 are potentials supplied to the back gate of the transistor. As the structures of the power supply control switch 921 and the power supply control switch 922, the structure of the power supply control switch 102 can be employed.

Figure 18:
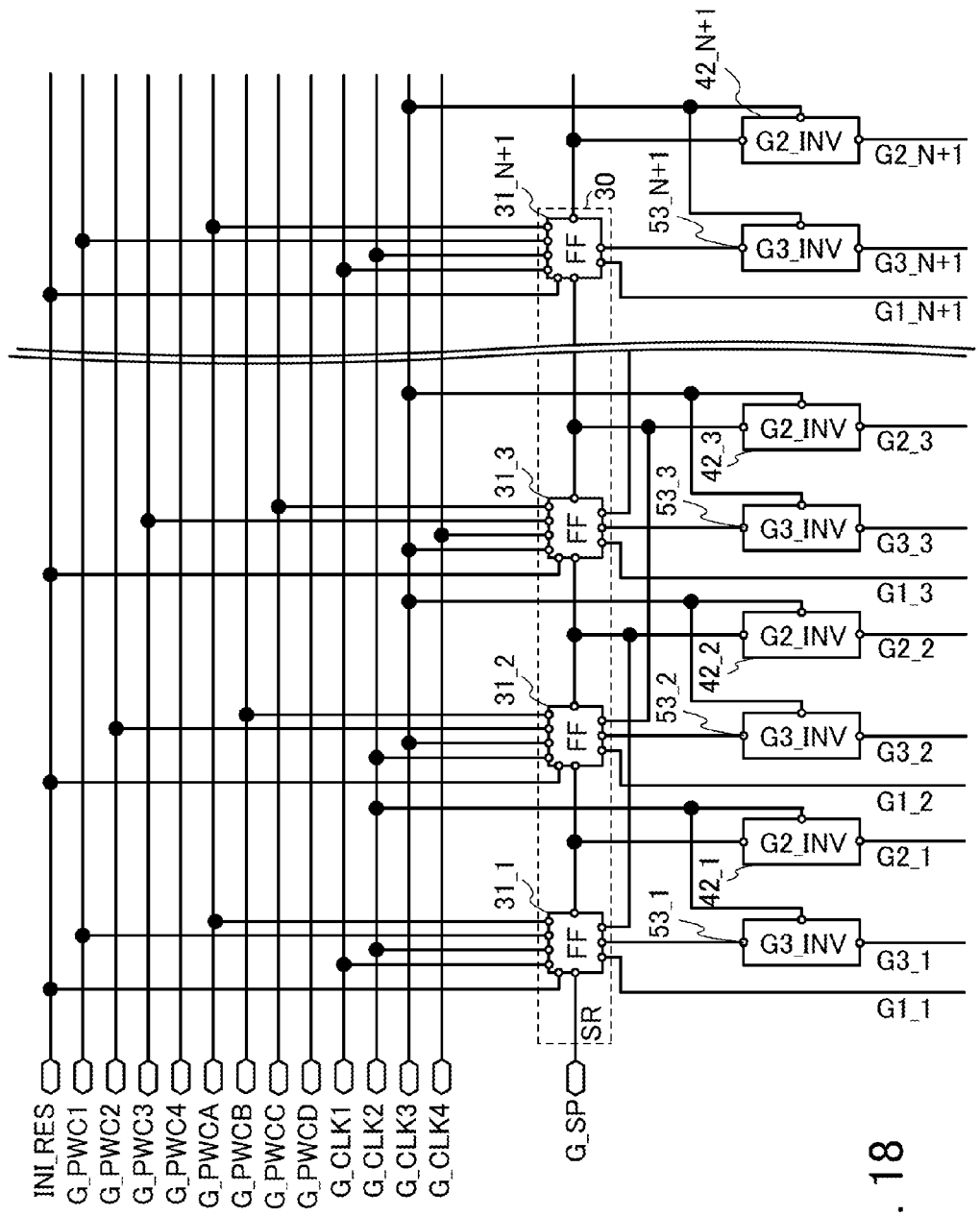
FIG. 18 shows an example of a gate driver.

Further, an example of the gate driver 902 is shown in FIG. 18.

The gate driver 902 shown in FIG. 18 includes a shift register 30, inverters 42_1 to 42_N+1, and inverters 53_1 to 53_N+1. Further, the shift register 30 includes flip-flops (FF) 31_1 to 31_N+1.

Further, components of the gate driver shown in FIG. 18 is described with reference to FIGS. 19A and 19B, FIGS. 20A-1, 20A-2, 20B-1, and 20B-2, and FIG. 21.

Figure 19A:
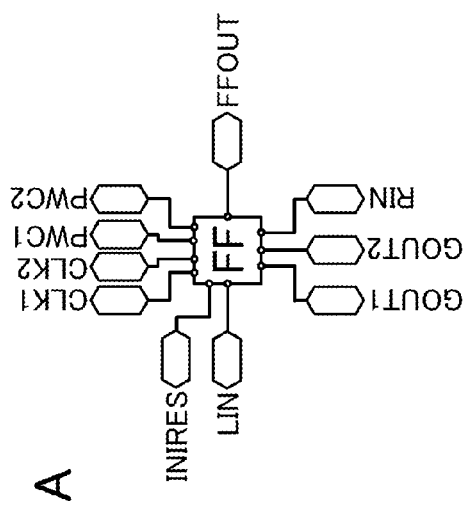
FIGS. 19A and 19B show an example of a flip-flop.

As shown in FIG. 19A, to each of the flip-flops 31_1 to 31_N in FIG. 18, a set signal LIN, a reset signal RIN, clock signals CLK1 and CLK2, pulse width control signals PWC1 and PWC2, and an initialization signal INIRES are input. Note that in FIG. 18, terminals into which the power source potential and the potentials BG1 and BG2 are input are omitted for convenience. Further, from the flip-flop in FIG. 19A, a signal FFOUT, a signal GOUT1, and a signal GOUT2 are output. Note that the initialization signal INIRES is a signal used for initialization of a flip-flop, for example. A pulse of the initialization signal INIRES is input into the flip-flop, whereby the flip-flop is initialized. It is not always necessary to input the initialization signal INIRES to the flip-flop.

Note that the structure of the flip-flop 31_N+1 is the same as the other flip-flops except that the reset signal RIN is not input.

Figure 19B:
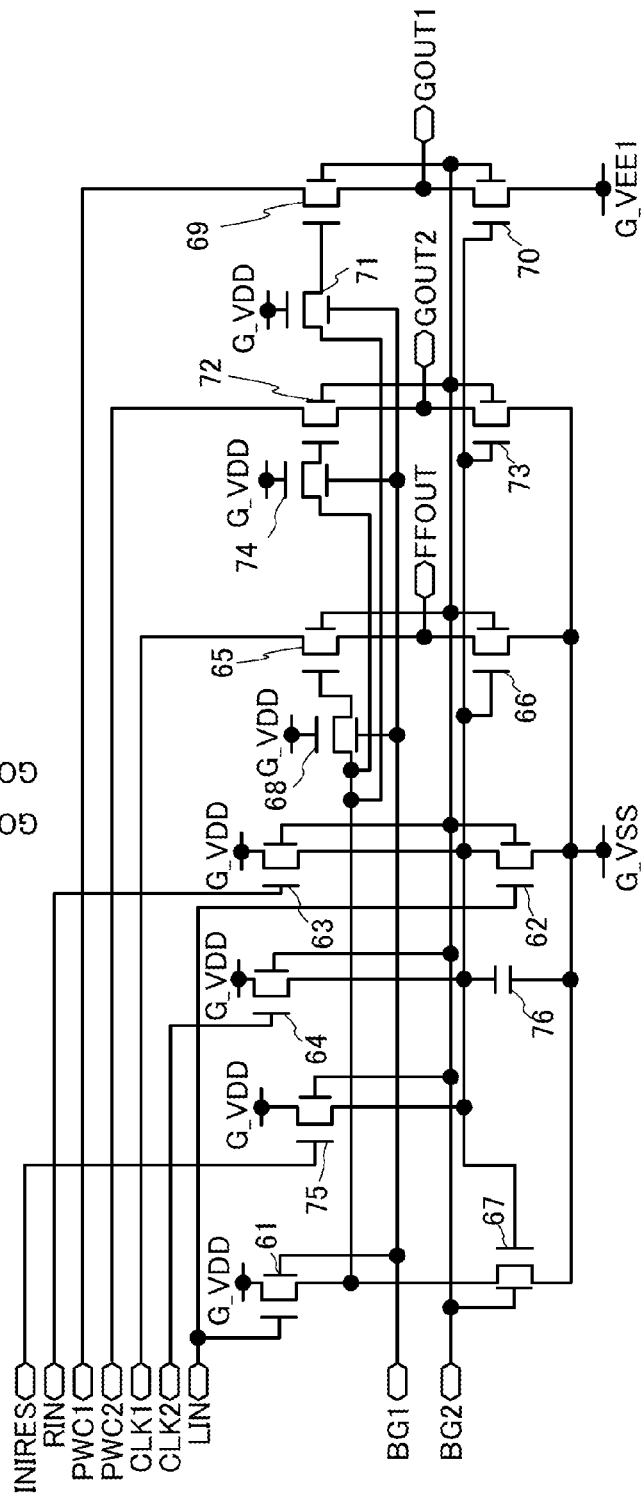

Further, the flip-flop in FIG. 19A includes transistors 61 to 75 and a capacitor 76 as shown in FIG. 19B.

A power source potential G_VDD is supplied to one of a source and a drain of the transistor 61. Further, the set signal LIN is input into a gate of the transistor 61, and the potential BG1 is supplied to a back gate of the transistor 61.

A power source potential G_VSS is supplied to one of a source and a drain of the transistor 62. Further, the set signal LIN is input into a gate of the transistor 62, and the potential BG2 is supplied to a back gate of the transistor 62. Here, the level of the potential BG2 is preferred to be lower than the level of the potential BG1. This is because when the threshold voltage of the transistor to be supplied with the potential BG1 is too high, malfunction of the semiconductor device is likely to occur. Note that in the power source potential G_VDD and the power source potential G_VSS, the power source potential G_VDD is a high power source potential which is relatively higher, and the power source potential G_VSS is a low power source potential which is relatively lower. A potential difference between the power source potential G_VDD and the power source potential G_VSS is a power source voltage.

A power source potential G_VDD is supplied to one of a source and a drain of the transistor 63. Further, the reset signal RIN is input into a gate of the transistor 63, and the potential BG2 is supplied to a back gate of the transistor 63.

A power source potential G_VDD is supplied to one of a source and a drain of the transistor 64. Further, the clock signal CLK2 is input into a gate of the transistor 64, and the potential BG2 is supplied to a back gate of the transistor 64.

In the transistor 65, the clock signal CLK1 is input into one of a source and a drain, and the potential of the other of the source and the drain corresponds to the potential of the signal FFOUT. Further, the potential BG2 is supplied to a back gate of the transistor 65.

In the transistor 66, one of a source and a drain is supplied with the power source potential G_VSS, and the other of the source and the drain is electrically connected to the other of the source and the drain of the transistor 65. Further, a gate of the transistor 66 is electrically connected to the other of the source and the drain of the transistor 63, and a back gate of the transistor 66 is supplied with the potential BG2.

In the transistor 67, one of a source and a drain is supplied with the power source potential G_VSS, and the other of the source and the drain is electrically connected to the other of the source and the drain of the transistor 61. Further, a gate of the transistor 67 is electrically connected to the other of the source and the drain of the transistor 63, and a back gate of the transistor 67 is supplied with the potential BG2.

In the transistor 68, one of a source and a drain is electrically connected to the other of the source and the drain of the transistor 61, and the other of the source and the drain is electrically connected to a gate of the transistor 65. Further, a gate of the transistor 68 is supplied with a power source potential G_VDD, and a back gate of the transistor 68 is supplied with the potential BG1.

In the transistor 69, the pulse width control signal PWC1 is input into one of a source and a drain, and the potential of the other of the source and the drain corresponds to the potential of the signal GOUT1. Further, the potential BG2 is supplied to a back gate of the transistor 69.

In the transistor 70, one of a source and a drain is supplied with a potential G_VEE1, and the other of the source and the drain is electrically connected to the other of the source and the drain of the transistor 69. The potential G_VEE1 is an arbitrary potential. Further, a gate of the transistor 70 is electrically connected to the other of the source and the drain of the transistor 63, and a back gate of the transistor 70 is supplied with the potential BG2.

In the transistor 71, one of a source and a drain is electrically connected to the other of the source and the drain of the transistor 61, and the other of the source and the drain is electrically connected to a gate of the transistor 69. Further, a gate of the transistor 71 is supplied with a power source potential G_VDD, and a back gate of the transistor 71 is supplied with the potential BG1.

In the transistor 72, the pulse width control signal PWC2 is input into one of a source and a drain, and the potential of the other of the source and the drain corresponds to the potential of the signal GOUT2. Further, a back gate of the transistor 72 is supplied with the potential BG2.

In the transistor 73, one of a source and a drain is supplied with the power source potential G_VSS, and the other of the source and the drain is electrically connected to the other of the source and the drain of the transistor 72. Further, a gate of the transistor 73 is electrically connected to the other of the source and the drain of the transistor 63, and a back gate of the transistor 73 is supplied with the potential BG2.

In the transistor 74, one of a source and a drain is electrically connected to the other of the source and the drain of the transistor 61, and the other of the source and the drain is electrically connected to a gate of the transistor 72. Further, a gate of the transistor 74 is supplied with a power source potential G_VDD, and a back gate of the transistor 74 is supplied with the potential BG1.

In the transistor 75, one of a source and a drain is supplied with a power source potential G_VDD, and the other of the source and the drain is electrically connected to the other of the source and the drain of the transistor 63. Further, the initialization signal INIRES is input into a gate of the transistor 75, and the potential BG2 is supplied to a back gate of the transistor 75.

In the capacitor 76, one of a pair of electrodes is supplied with the power source potential G_VSS, and the other of the pair of electrodes is electrically connected to the other of the source and the drain of the transistor 63. Note that the capacitor 76 is not necessarily provided.

In the flip-flop shown in FIG. 19B, when a pulse of the set signal LN is input, the transistor 61 is turned on and then the transistors 65, 69, and 72 are turned on, whereby the level of the potential of the signal FFOUT becomes equivalent to the level of the potential of the clock signal CLK1, the level of the potential of the signal GOUT1 becomes equivalent to the level of the potential of the pulse width control signal PWC1, and the level of the potential of the signal GOUT2 becomes equivalent to the level of the potential of the pulse width control signal PWC2. At this time, the transistors 66, 70, and 73 are off. Moreover, in the flip-flop shown in FIG. 19B, when the transistor 63 is turned on in accordance with the reset signal RN, the transistors 66, 70, and 73 are turned on, whereby the level of the potential of the signal FFOUT becomes equivalent to the level of the power source potential G_VSS, the level of the potential of the signal GOUT1 becomes equivalent to the level of the power source potential G_VSS, and the level of the potential of the signal GOUT2 becomes equivalent to the level of the power source potential G_VSS. At this time, the transistors 65, 69, and 72 are off. Accordingly, the flip-flop outputs a pulse signal.

As the set signal LIN of the flip-flop 31_1, a start pulse signal SP is input into the shift register 30 shown in FIG. 18.

Note that a protection circuit may be electrically connected to a wiring for inputting the start pulse signal SP into the gate driver 902.

As the set signal LN of the flip-flop 31_K (K is a natural number larger than or equal to 2 and smaller than or equal to X), a signal FFOUT of the flip-flop 31_K−1 is input into the shift register 30.

Moreover, as the reset signal RN of the flip-flop 31_M (M is a natural number smaller than N), a signal FFOUT of the flip-flop 31_M+1 is input into the shift register 30.

As the clock signal CLK1 and the clock signal CLK2 of the flip-flop 31_1, a clock signal G_CLK1 and a clock signal G_CLK2 are input into the shift register 30, respectively. Further, with the flip-flop 31_1 as the reference, the clock signal G_CLK1 and the clock signal G_CLK2 are input as the clock signal CLK1 and the clock signal CLK2, respectively, every three flip-flops.

As the clock signal CLK1 and the clock signal CLK2 of the flip-flop 31_2, the clock signal G_CLK2 and a clock signal G_CLK3 are input into the shift register 30, respectively. Further, with the flip-flop 31_2 as the reference, the clock signal G_CLK2 and the clock signal G_CLK3 are input as the clock signal CLK1 and the clock signal CLK2, respectively, every three flip-flops.

As the clock signal CLK1 and the clock signal CLK2 of the flip-flop 31_3, the clock signal G_CLK3 and a clock signal G_CLK4 are input into the shift register 30, respectively. Further, with the flip-flop 31_3 as the reference, the clock signal G_CLK3 and the clock signal G_CLK4 are input as the clock signal CLK1 and the clock signal CLK2, respectively, every three flip-flops.

As the clock signal CLK1 and the clock signal CLK2 of the flip-flop 31_4, the clock signal G_CLK4 and the clock signal G_CLK1 are input into the shift register 30, respectively. Further, with the flip-flop 31_3 as the reference, the clock signal G_CLK4 and the clock signal G_CLK1 are input as the clock signal CLK1 and the clock signal CLK2, respectively, every three flip-flops.

Note that a protection circuit may be electrically connected to wirings for inputting the clock signals G_CLK1 to G_CLK4.

In the shift register 30, a pulse width control signal G_PWC1 and a pulse width control signal G_PWCA are input as the pulse width control signal PWC1 and the pulse width control signal PWC2 of the flip-flop 31_1, respectively. Further, with the flip-flop 31_1 as the reference, the pulse width control signal G_PWC1 and the pulse width control signal G_PWCA are input as the pulse width control signal PWC1 and the pulse width control signal PWC2, respectively, every three flip-flops.

In the shift register 30, a pulse width control signal G_PWC2 and a pulse width control signal G_PWCB are input as the pulse width control signal PWC1 and the pulse width control signal PWC2 of the flip-flop 31_2, respectively. Further, with the flip-flop 31_2 as the reference, the pulse width control signal G_PWC2 and the pulse width control signal G_PWCB are input as the pulse width control signal PWC1 and the pulse width control signal PWC2, respectively, every three flip-flops.

In the shift register 30, a pulse width control signal G_PWC3 and a pulse width control signal G_PWCC are input as the pulse width control signal PWC1 and the pulse width control signal PWC2 of the flip-flop 31_3, respectively. Further, with the flip-flop 31_3 as the reference, the pulse width control signal G_PWC3 and the pulse width control signal G_PWCC are input as the pulse width control signal PWC1 and the pulse width control signal PWC2, respectively, every three flip-flops.

In the shift register 30, a pulse width control signal G_PWC4 and a pulse width control signal G_PWCD are input as the pulse width control signal PWC1 and the pulse width control signal PWC2 of the flip-flop 31_4, respectively. Further, with the flip-flop 31_4 as the reference, the pulse width control signal G_PWC4 and the pulse width control signal G_PWCD are input as the pulse width control signal PWC1 and the pulse width control signal PWC2, respectively, every three flip-flops.

Moreover, in the shift register 30, the signal GOUT1 of the flip-flop 31_M becomes a gate signal G1_M.

The above is the description of the flip-flops.

FIGS. 20A-1, 20A-2, 20B-1, and 20B-2 show examples of the structure of the inverters.

As shown in FIG. 20A-1, a pulse signal IN1 and a reset signal INV_RIN are input into each of the inverters 42_1 to 42_N+1 shown in FIG. 18. Each of the inverters 42_1 to 42_N+1 in FIG. 18 outputs a signal INVOUT1.

Moreover, as shown in FIG. 20A-2, each of the inverters 42_1 to 42_N+1, which is shown in FIG. 20A-1, includes transistors 81 to 85 and a capacitor 86.

One of a source and a drain of the transistor 81 is supplied with a power source potential G_VDD. Further, the reset signal INV_RIN is input into a gate of the transistor 81, and the potential BG2 is supplied to a back gate of the transistor 81.

In the transistor 82, one of a source and a drain is supplied with a power source potential G_VSS1, and the other of the source and the drain is electrically connected to the other of the source and the drain of the transistor 81. Further, the pulse signal IN1 is input into a gate of the transistor 82, and the potential BG2 is supplied to a back gate of the transistor 82.

In the transistor 83, one of a source and a drain is supplied with a power source potential G_VCC1, and a potential of the other of the source and the drain corresponds to a potential of the signal INVOUT1. The signal INVOUT1 corresponds to any of signals G2_1 to G2_N+1 shown in FIG. 18. The power source potential G_VCC1 is an arbitrary potential. Further, a back gate of the transistor 83 is supplied with the potential BG2.

In the transistor 84, one of a source and a drain is supplied with a potential G_VEE2, and the other of the source and the drain is electrically connected to the other of the source and the drain of the transistor 83. The potential G_VEE2 is an arbitrary potential. Further, the pulse signal IN1 is input into a gate of the transistor 84, and the potential BG2 is supplied to a back gate of the transistor 84.

In the transistor 85, one of a source and a drain is electrically connected to the other of the source and the drain of the transistor 81, and the other of the source and the drain is electrically connected to a gate of the transistor 83. Further, a gate of the transistor 85 is supplied with a power source potential G_VDD, and a back gate of the transistor 85 is supplied with the potential BG1.

In the capacitor 86, one of a pair of electrodes is electrically connected to the gate of the transistor 83, and the other of the pair of electrodes is electrically connected to the other of the source and the drain of the transistor 83.

Further, as shown in FIG. 20B-1, a pulse signal IN2 and a reset signal INV_RIN are input into each of the inverters 53_1 to 53_N+1 shown in FIG. 18. Each of the inverters 53_1 to 53_N+1 in FIG. 18 outputs a signal INVOUT2.

Moreover, as shown in FIG. 20B-2, each of the inverters 53_1 to 53_N+1, which is shown in FIG. 20B-1, includes transistors 91 to 95 and a capacitor 96.

In the transistor 91, one of a source and a drain is supplied with a power source potential G_VDD. Further, the reset signal INV_RIN is input into a gate of the transistor 91, and the potential BG2 is supplied to a back gate of the transistor 91.

In the transistor 92, one of a source and a drain is supplied with a power source potential G_VSS1, and the other of the source and the drain is electrically connected to the other of the source and the drain of the transistor 91. Further, the pulse signal IN2 is input into a gate of the transistor 92, and the potential BG2 is supplied to a back gate of the transistor 92.

In the transistor 93, one of a source and a drain is supplied with a power source potential G_VCC2, and a potential of the other of the source and the drain corresponds to a potential of the signal INVOUT2. The signal INVOUT2 corresponds to any of signals G3_1 to G3_N+1 shown in FIG. 18. Further, a back gate of the transistor 93 is supplied with the potential BG2.

In the transistor 94, one of a source and a drain is supplied with a potential G_VEE3, and the other of the source and the drain is electrically connected to the other of the source and the drain of the transistor 93. The potential G_VEE3 is an arbitrary potential. Further, the pulse signal IN2 is input into a gate of the transistor 94, and the potential BG2 is supplied to a back gate of the transistor 94.

In the transistor 95, one of a source and a drain is electrically connected to the other of the source and the drain of the transistor 91, and the other of the source and the drain is electrically connected to a gate of the transistor 93. Further, a gate of the transistor 95 is supplied with a power source potential G_VDD, and a back gate of the transistor 95 is supplied with the potential BG1.

In the capacitor 96, one of a pair of electrodes is electrically connected to the gate of the transistor 93, and the other of the pair of electrodes is electrically connected to the other of the source and the drain of the transistor 93.

Further, the signal FFOUT of the flip-flop 31_M is input as the pulse signal IN1 of the inverter 42_M, and the signal GOUT2 of the flip-flop 31_M is input as the pulse signal IN2 of the inverter 53_M. The signal INVOUT1 of the inverter 42_M serves as a gate signal G2_M, and the signal INVOUT2 of the inverter 53_M serves as a gate signal G3_M.

The clock signal G_CLK2 is input as the reset signal INV_RIN of the inverters 42_1 and 53_1. Further, with the inverter 42_1 as the reference, the clock signal G_CLK2 is input as the reset signal INV_RIN every three inverters.

The clock signal G_CLK3 is input as the reset signal INV_RIN of the inverters 42_2 and 53_2. Further, with the inverter 42_2 as the reference, the clock signal G_CLK3 is input as the reset signal INV_RIN every three inverters.

The clock signal G_CLK3 is input as the reset signal INV_RIN of the inverters 42_3 and 53_3. Further, with the inverter 42_3 as the reference, the clock signal G_CLK3 is input as the reset signal INV_RIN every three inverters.

The clock signal G_CLK4 is input as the reset signal INV_RIN of the inverters 42_4 and 53_4. Further, with the inverter 42_4 as the reference, the clock signal G_CLK4 is input as the reset signal INV_RIN every three inverters.

The above is the description of the inverters.

Next, the example of a method for driving the gate driver shown in FIG. 18 is described with reference to a timing chart in FIG. 21.

Figure 21:
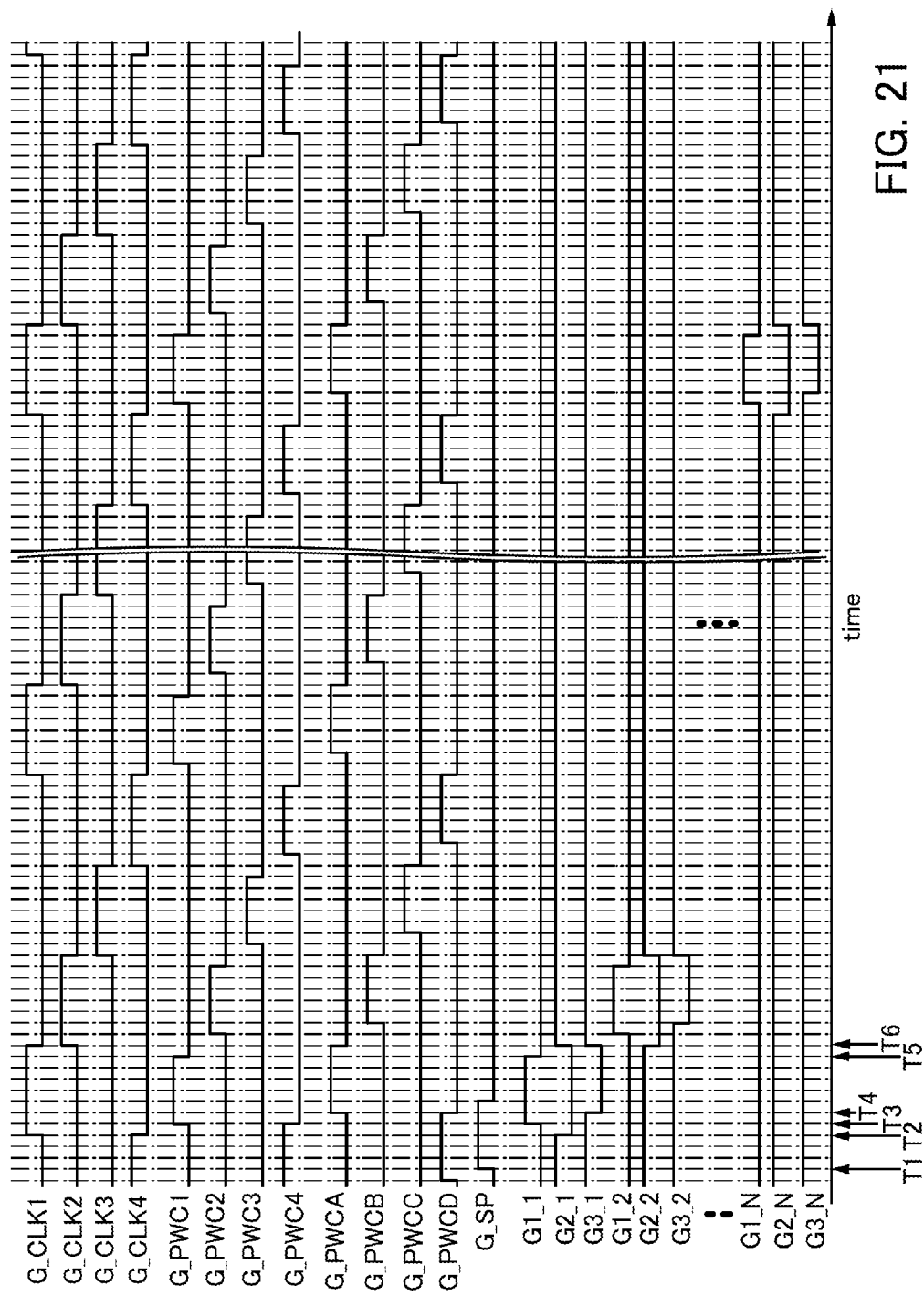
FIG. 21 is a timing chart showing an example of a method for driving a semiconductor device.

In the example of the method for driving the gate driver shown in FIG. 18, as shown in FIG. 21, a pulse of the start pulse signal SP is input, whereby pulses of gate signals G1_1 to G1_N are sequentially output, pulses of the gate signals G2_1 to G2_N are sequentially output, and pulses of the gate signals G3_1 to G3_N are sequentially output. For example, when the start pulse signal SP is at a high level at a time T1, the gate signal G2_1 is at a low level at a time T2, the gate signal G1_1 is at a high level at a time T3, and the gate signal G3_1 is at a low level at a time T4. Further, the gate signal G1_1 is at a low level at a time T5, and the gate signals G2_1 and G3_1 are at high levels at a time T6.

The above is the description of the method for driving the gate driver shown in FIG. 18.

Figure 22A:
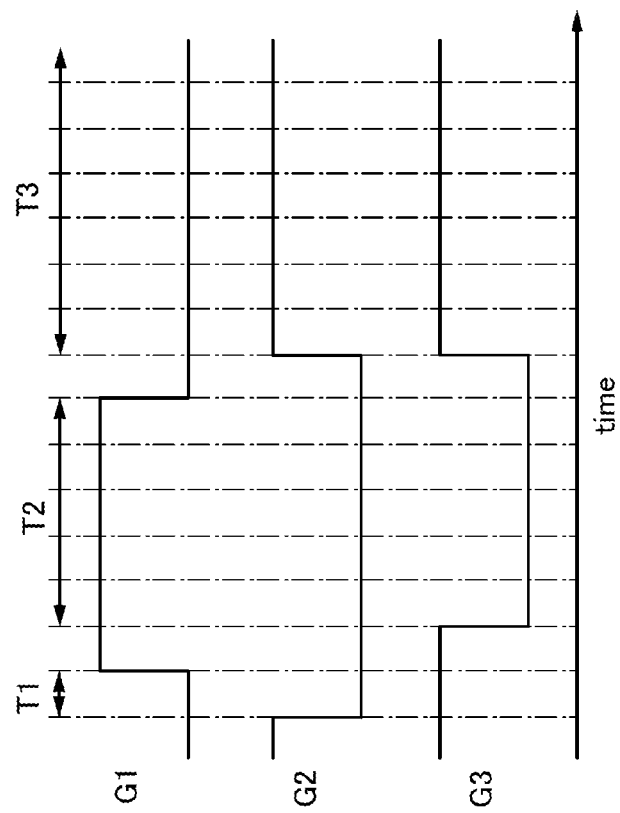
FIGS. 22A and 22B show an example of a pixel circuit.
Figure 22B:
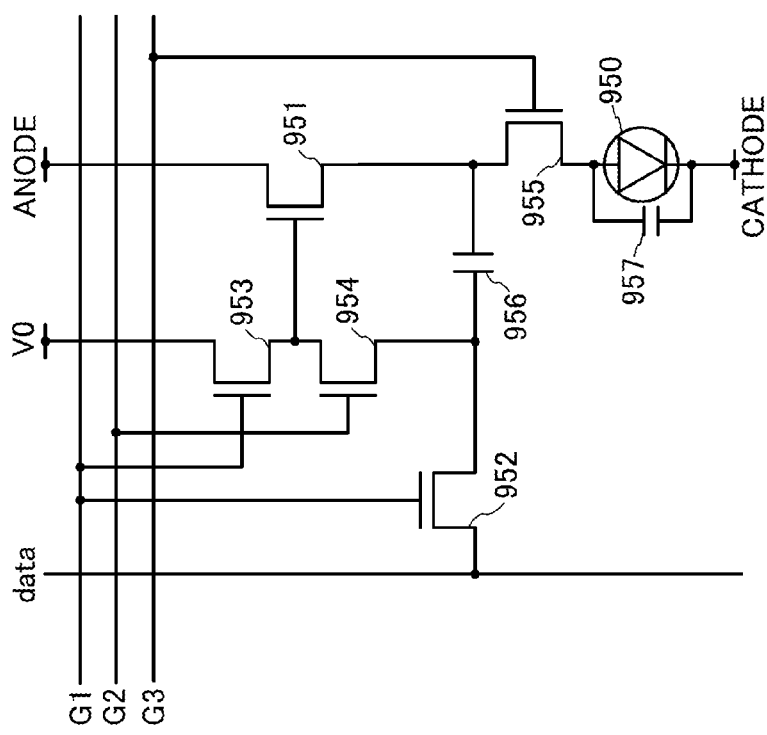

Next, a structure example of the pixel circuit 910 is shown in FIGS. 22A and 22B.

A pixel circuit shown in FIG. 22A includes a light-emitting element 950, transistors 951 to 955, and a capacitor 956. Note that a capacitor 957 is shown as a capacitance of the light-emitting element 950.

The light-emitting element 950 has a function of emitting light in accordance with the amount of current which flows between an anode and a cathode. A cathode potential (also referred to as CATHODE) is supplied to the cathode of the light-emitting element 950.

An anode potential (also referred to as ANODE) is supplied to a drain of the transistor 951. The transistor 951 functions as a driving transistor.

A data signal data is input into one of a source and a drain of the transistor 952, and a gate signal G1 is input into a gate of the transistor 952. The gate signal G1 corresponds to the gate signal G1_M shown in FIG. 18.

In the transistor 953, one of a source and a drain is supplied with a potential V0, and the other of the source and the drain is electrically connected to a gate of the transistor 951. Further, the gate signal G1 is input into a gate of the transistor 953.

One of a source and a drain of the transistor 954 is electrically connected to the gate of the transistor 951, and a gate signal G2 is input into a gate of the transistor 954. The gate signal G2 corresponds to the gate signal G2_M shown in FIG. 18.

In the transistor 955, one of a source and a drain is electrically connected to a source of the transistor 951, and the other of the source and the drain is electrically connected to the anode of the light-emitting element 950. Further, a gate signal G3 is input into a gate of the transistor 955. The gate signal G3 corresponds to the gate signal G3_M shown in FIG. 18.

In the capacitor 956, one of a pair of electrodes is electrically connected to the other of the source and the drain of the transistor 952 and the other of the source and the drain of the transistor 954, and the other of the pair of electrodes is electrically connected to the source of the transistor 951.

Next, the example of a method for driving the pixel circuit shown in FIG. 22A is described with reference to a timing chart in FIG. 22B.

A period T1 in FIG. 22B is an initialization period. In the period T1, the transistor 955 is turned on and the transistors 952, 953, and 954 are turned off.

At this time, the level of the source potential of the transistor 951 is lower than the level of the potential V0.

A period T2 is a threshold detection period. In the period T2, the transistors 952 and 953 are turned on and the transistors 954 and 955 are turned off.

At this time, when the gate potential of the transistor 951 is equivalent to the potential V0 and the level of a voltage between the gate and the source of the transistor 951 (the voltage is also referred to as Vgs 951) is equivalent to the level of a threshold voltage of the transistor 951 (the threshold voltage is also referred to as Vth 951), the transistor 951 is turned off. Here, the source potential of the transistor 951 can be obtained from the formula V0−Vth 951. Moreover, the level of the potential of the one of the pair of electrodes of the capacitor 956 is equivalent to the level of the potential Vdata of the data signal data.

A period T3 is a light-emitting period. In the period T3, the transistors 954 and 955 are turned on and the transistors 952 and 953 are turned off.

At this time, the level of the gate potential of the transistor 951 is equivalent to the level of the potential Vdata of the data signal data, and Vgs 951 can be obtained from the formula Vdata−Vth 951+V0. Accordingly, current that flows between the source and the drain of the transistor 951 in a saturation region (the current is also referred to as Ids 951) does not depend on Vth 951 but depends on Vdata; thus, the influence of the fluctuation of Vth 951 can be suppressed.

Further, the light-emitting element 950 emits light in accordance with Ids 951.

The above is the description of the method for driving the pixel circuit.

Figure 23:
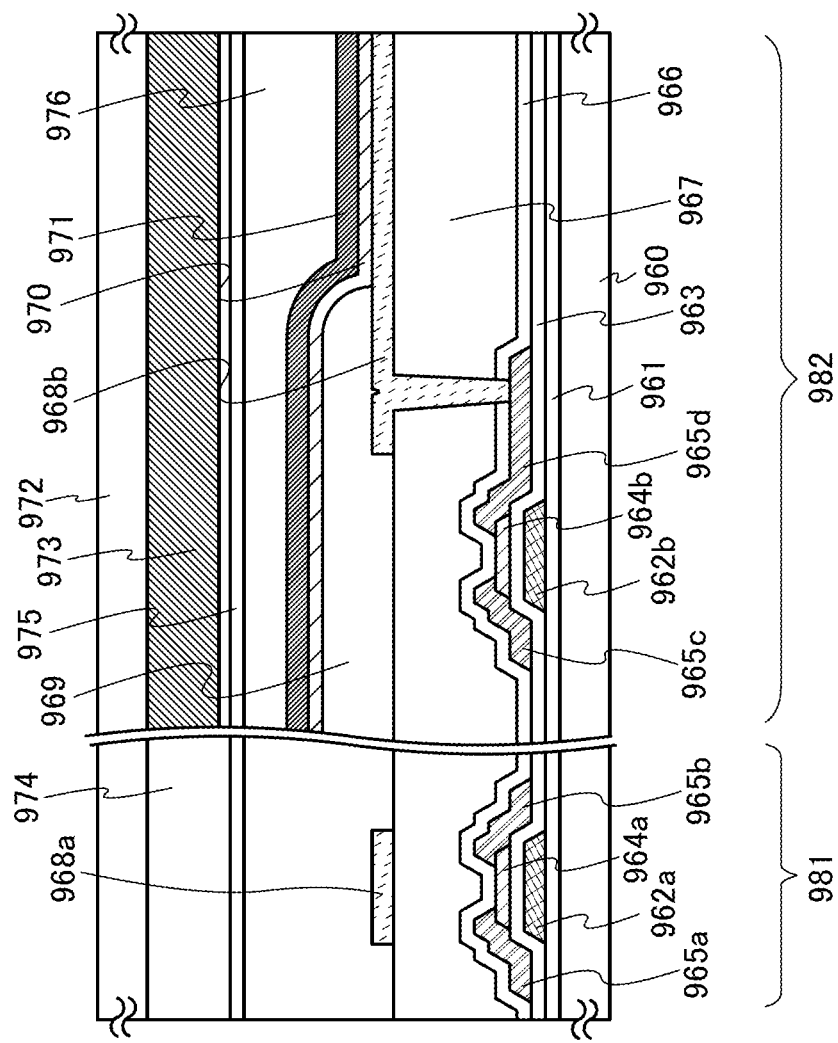
FIG. 23 shows a structure example of a semiconductor device.

Next, a structure example of the semiconductor device in this embodiment is illustrated in FIG. 23. Note that in this embodiment, a light-emitting element in the semiconductor device emits light toward the top surface side of the semiconductor device; however, structures of semiconductor devices of one embodiment of the present invention are not limited thereto. The semiconductor device may emit light toward the bottom side or both the top and bottom sides.

A semiconductor device illustrated in FIG. 23 includes a peripheral circuit portion 981 where a power source circuit and a driver circuit such as a gate driver are provided and a pixel portion 982 where pixel circuits are provided.

The semiconductor device in FIG. 23 includes conductive layers 962a and 962b, an insulating layer 963, semiconductor layers 964a and 964b, conductive layers 965a to 965d, an insulating layer 966, an insulating layer 967, conductive layers 968a and 968b, an insulating layer 969, a light-emitting layer 970, a conductive layer 971, a coloring layer 973, and insulating layers 974, 975, and 976.

The conductive layers 962a and 962b are provided over a substrate 960 with a base layer 961 provided therebetween.

Further, the conductive layer 962a is provided in the peripheral circuit portion 981. The conductive layer 962a functions as a gate electrode of a transistor in the gate driver, for example.

The conductive layer 962b is provided in the pixel portion 982. The conductive layer 962b functions as a gate electrode of a transistor in the pixel circuit, for example. The transistor in the pixel circuit corresponds to the transistor 955 of the pixel circuit shown in FIG. 22A, for example.

The conductive layers 962a and 962b are provided by partly etching the same conductive film, for example.

The insulating layer 963 is provided over the base layer 961 with the conductive layers 962a and 962b provided therebetween. The insulating layer 963 functions as a gate insulating layer of the transistor in the peripheral circuit portion 981 and a gate insulating layer of the transistor in the pixel portion 982.

The semiconductor layer 964a includes a region overlapping with the conductive layer 962a with the insulating layer 963 provided therebetween. The semiconductor layer 964a functions as a channel formation layer of the transistor in the peripheral circuit portion 981.

The semiconductor layer 964b includes a region overlapping with the conductive layer 962b with the insulating layer 963 provided therebetween. The semiconductor layer 964b functions as a channel formation layer of the transistor in the pixel portion 982.

Each of the conductive layers 965a and 965b is electrically connected to the semiconductor layer 964a. The conductive layer 965a functions as one of a source electrode and a drain electrode of the transistor in the peripheral circuit portion 981, and the conductive layer 965b functions as the other of the source electrode and the drain electrode of the transistor in the peripheral circuit portion 981.

Each of the conductive layers 965c and 965d is electrically connected to the semiconductor layer 964b. The conductive layer 965c functions as one of a source electrode and a drain electrode of the transistor in the pixel portion 982, and the conductive layer 965d functions as the other of the source electrode and the drain electrode of the transistor in the pixel portion 982.

The insulating layer 966 is provided over the semiconductor layers 964a and 964b with the conductive layers 965a to 965d provided therebetween. The insulating layer 966 functions as a protection layer.

The insulating layer 967 is provided over the insulating layer 966. The insulating layer 967 functions as a planarization layer.

The conductive layer 968a overlaps with the semiconductor layer 964a with the insulating layers 966 and 967 provided therebetween. The conductive layer 968a functions as a back gate electrode of the transistor in the peripheral circuit portion 981.

The conductive layer 968b is electrically connected to the conductive layer 965d through an opening penetrating the insulating layers 966 and 967. The conductive layer 968b functions as an anode electrode of a light-emitting element in the pixel portion 982.

The conductive layers 968a and 968b are provided by partly etching the same conductive film, for example.

The insulating layer 969 is provided over the insulating layer 967 with the conductive layer 968a provided therebetween.

The light-emitting layer 970 is electrically connected to the conductive layer 968b through an opening penetrating the insulating layer 969.

The conductive layer 971 is electrically connected to the light-emitting layer 970. The conductive layer 971 functions as a cathode electrode of the light-emitting element in the pixel portion 982.

The coloring layer 973 is provided on part of a substrate 972 in the pixel portion 982.

The insulating layer 974 is provided on a plane surface of the substrate 972 with the coloring layer 973 provided therebetween. The insulating layer 974 functions as a planarization layer.

The insulating layer 975 is provided on a plane surface of the insulating layer 974. The insulating layer 975 functions as a protection layer.

The insulating layer 976 is a layer for attaching the substrate 972 to the substrate 960 provided with the elements.

Further, components of the semiconductor device illustrated in FIG. 23 are described. Note that each layer can be a stack of a plurality of materials.

As each of the substrates 960 and 972, a glass substrate or a plastic substrate can be used, for example. Note that the substrates 960 and 972 are not necessarily provided.

As the base layer 961, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, a gallium oxide layer, or the like can be used, for example. For example, a silicon oxide layer, a silicon oxynitride layer, or the like can be used as the base layer 961. The above insulating layer may contain halogen. Note that the base layer 961 is not necessarily provided.

The conductive layers 962a and 962b can be a layer containing a metal material such as molybdenum, titanium, chromium, tantalum, magnesium, silver, tungsten, aluminum, copper, neodymium, ruthenium, or scandium, for example. Further, graphene or the like may be used for the conductive layers 962a and 962b.

As the insulating layer 963, an oxide layer of a gallium oxide, a Ga—Zn-based oxide, an In—Ga—Zn-based oxide containing In, Ga, and Zn at an atomic ratio of 1:3:2, or the like as well as a layer formed using the material which can be used for the base layer 961 can be used.

As the semiconductor layers 964a and 964b, a layer of the oxide semiconductor which can be used for the channel formation region of the control transistor 120 shown in FIG. 1 can be used.

In the case where an oxide semiconductor layer is used as the semiconductor layers 964a and 964b, the oxide semiconductor layer can be highly purified in the following manner, for example: dehydration or dehydrogenation is performed so that impurities such as hydrogen, water, a hydroxyl group, and a hydride (also referred to as a hydrogen compound) are removed from the oxide semiconductor layer, and oxygen is supplied to the oxide semiconductor layer. For example, a layer containing oxygen is used as the layer in contact with the oxide semiconductor layer, and heat treatment is performed, whereby the oxide semiconductor layer can be highly purified.

The oxide semiconductor layer is preferred to be in a supersaturated state in which the oxygen content is in excess of that in the stoichiometric composition just after its formation. For example, in the case where the oxide semiconductor layer is formed by a sputtering method, the deposition is preferably performed under a condition that the proportion of oxygen in a deposition gas is large, in particular, under an oxygen atmosphere (e.g., oxygen gas: 100%).

The oxide semiconductor layer is formed by a sputtering method at the substrate temperature higher than or equal to 100° C. and lower than or equal to 500° C., preferably higher than or equal to 200° C. and lower than or equal to 350° C.

Further, in order to sufficiently supply oxygen to supersaturate the oxide semiconductor layer with oxygen, an insulating layer containing excess oxygen may be formed as the insulating layer in contact with the oxide semiconductor layer (e.g., the insulating layers 963 and 966).

The insulating layer containing excess oxygen can be formed using an insulating film which is formed so as to contain a large amount of oxygen by a sputtering method. In order to make the insulating layer contain much more excess oxygen, oxygen is added by an ion implantation method, an ion doping method, or plasma treatment. Moreover, oxygen may be added to the oxide semiconductor layer.

In a sputtering apparatus, the amount of moisture remaining in a deposition chamber is preferred to be small. Therefore, an entrapment vacuum pump is preferred to be used in the sputtering apparatus. Further, a cold trap may be used.

In fabricating the transistors, heat treatment is preferred to be performed. The temperature of the heat treatment is preferably higher than or equal to 350° C. and lower than the strain point of the substrate, more preferably higher than or equal to 350° C. and lower than or equal to 450° C. Note that the heat treatment may be performed more than once.

As a heat treatment apparatus used for the heat treatment, a rapid thermal annealing (RTA) apparatus such as a gas rapid thermal annealing (GRTA) apparatus or a lamp rapid thermal annealing (LRTA) apparatus may be used. Alternatively, another heat treatment apparatus such as an electric furnace may be used.

After the heat treatment, the following step is favorable: introducing a high-purity oxygen gas, a high-purity $N_2O$ gas, or ultra-dry air (having a dew point of −40° C. or lower, preferably −60° C. or lower) in the furnace where the heat treatment has been performed while the heating temperature is being maintained or being decreased. In that case, it is preferred that water, hydrogen, and the like be not contained in the oxygen gas or the $N_2O$ gas. It is favorable that the purity of the oxygen gas or the $N_2O$ gas which is introduced into the heat treatment apparatus is higher than or equal to 6N, preferably higher than or equal to 7N. That is, the impurity concentration in the oxygen gas or the $N_2O$ gas is preferably lower than or equal to 1 ppm, more preferably lower than or equal to 0.1 ppm. Through this step, oxygen is supplied to the oxide semiconductor layer, and defects due to oxygen vacancies in the oxide semiconductor layer can be reduced. Note that a high-purity oxygen gas, a high-purity $N_2O$ gas, or ultra-dry air may be introduced at the time of the above heat treatment.

The hydrogen concentration in the highly purified semiconductor layer which is measured by secondary ion mass spectrometry (also referred to as SIMS) is preferably lower than or equal to $5\times10^{19}$ atoms/cm$^3$, more preferably lower than or equal to $5\times10^{18}$ atoms/cm$^3$, and further preferably lower than or equal to $5\times10^{17}$ atoms/cm$^3$.

The conductive layers 965a to 965d can be a layer containing a metal material such as molybdenum, titanium, chromium, tantalum, magnesium, silver, tungsten, aluminum, copper, neodymium, ruthenium, or scandium, for example. Further, graphene or the like may be used for the conductive layers 965a to 965d.

As the insulating layer 966, a layer formed using the material which can be used for the insulating layer 963 can be used, for example.

As the insulating layer 967, the layer formed using the material which can be used for the insulating layer 963 can be used, for example.

The conductive layers 968a and 968b can be a layer containing a metal material such as molybdenum, titanium, chromium, tantalum, magnesium, silver, tungsten, aluminum, copper, neodymium, ruthenium, or scandium, for example. Alternatively, the conductive layers 968a and 968b can be formed using a layer containing a conductive metal oxide. The conductive metal oxide can be, for example, a metal oxide such as an indium oxide ($In_2O_3$), a tin oxide ($SnO_2$), a zinc oxide (ZnO), an indium tin oxide ($In_2O_3$—$SnO_2$, which is abbreviated to ITO in some cases), or an indium zinc oxide ($In_2O_3$—ZnO); or the metal oxide containing silicon, a silicon oxide, or nitrogen.

As the insulating layer 969, an organic insulating layer or an inorganic insulating layer can be used, for example. Note that the insulating layer 969 is also referred to as a partition.

The light-emitting layer 970 is a layer which emits light of a specific color. As the light-emitting layer 970, for example, a light-emitting layer using a light-emitting material which emits light of a specific color can be used. The light-emitting layer 970 can also be formed using a stack of light-emitting layers which emit light of different colors. The light-emitting material can be an electroluminescent material such as a fluorescent material or a phosphorescent material. Alternatively, the light-emitting material can be formed by a material containing a plurality of electroluminescent materials. A light-emitting layer emitting white light may be formed by a stack of a layer of a fluorescent material emitting blue light, a layer of a first phosphorescent material emitting orange color, and a layer of a second phosphorescent material emitting orange color, for example. Alternatively, as the electroluminescent material, an organic electroluminescent material or an inorganic electroluminescent material can be used. Further, in addition to the light-emitting layer, an electroluminescent layer may include one or more of a hole injection layer, a hole transport layer, an electron transport layer, and an electron injection layer.

As the conductive layer 971, a layer formed using the material which can be used for the conductive layer 968*b* and through which light passes can be used.

The coloring layer 973 can be a layer which includes dye or pigment, for example, and which transmits light with the wavelength range of red, light with the wavelength range of green, and light with the wavelength range of blue. The coloring layer 973 can be a layer which includes dye or pigment and which transmits light with the wavelength range of cyan, magenta, or yellow. For example, the coloring layer 973 is formed by a photolithography method, a printing method, an inkjet method, an electrodeposition method, an electrophotographic method, or the like. By using an inkjet method, the coloring layer can be fabricated at room temperature, fabricated at a low vacuum, or formed over a large substrate. Since the coloring layer can be manufactured without a resist mask, manufacturing cost and the number of steps can be reduced.

As the insulating layer 974, the layer formed using the material which can be used for the base layer 961 can be used, for example.

As the insulating layer 975, the layer formed using the material which can be used for the base layer 961 can be used, for example.

As the insulating layer 976, the layer formed using the material which can be used for the base layer 961 or a layer formed using a resin material can be used, for example.

As described with reference to FIG. 23, the example of the semiconductor device in this embodiment includes a light-emitting element emitting light of a specific color, and a coloring layer which transmits light with a particular wavelength emitted from the light-emitting element. The above structure facilitates the manufacturing process and enhances yield. For example, a display element can be formed without a metal mask; therefore, a manufacturing process can be simple.

The above is the description of the example of the semiconductor device in this embodiment.

In the example of the semiconductor device in this embodiment, the driver circuit may be provided over the same substrate as the pixel circuits, as described with reference to FIG. 17, FIG. 18, FIGS. 19A and 19B, FIGS. 20A-1, 20A-2, 20B-1, and 20B-2, FIG. 21, FIGS. 22A and 22B, and FIG. 23. In that case, the transistor in the circuit such as a driver circuit may have the same structure as the transistor in the pixel circuit. A circuit such as the driver circuit is provided over the same substrate as the unit circuit, so that the number of connection wirings of the unit circuit and the driver circuit can be made small.

Moreover, in the example of the semiconductor device in this embodiment, a power source potential is intermittently supplied to a back gate of a transistor, whereby the threshold voltage of the transistor can be controlled with power consumption suppressed.

[Embodiment 3]

In this embodiment, another example of a semiconductor device which is different from that of Embodiment 2 will be described.

Figure 24:
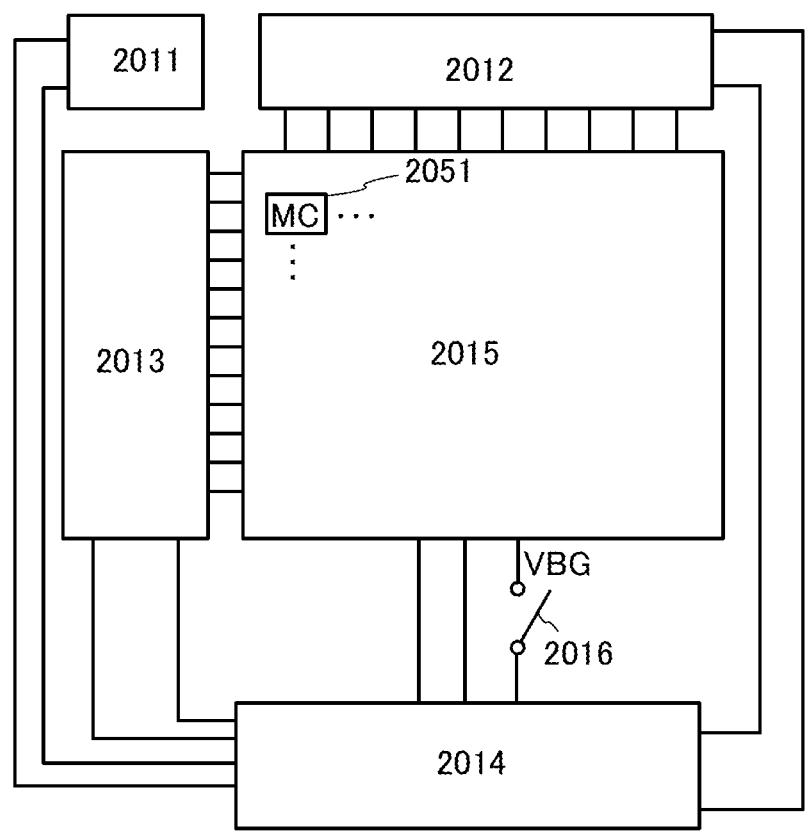
FIG. 24 shows an example of a semiconductor device.

A structure example of a semiconductor device in this embodiment is described with reference to FIG. 24. FIG. 24 is a block diagram showing a structure example of the semiconductor device in this embodiment.

A semiconductor device shown in FIG. 24 includes a control circuit 2011, a bit-line driver circuit 2012, a word-line driver circuit 2013, a power source circuit 2014, a memory cell array 2015 including a plurality of memory cells (also referred to as MC) 2051, and a power supply control switch 2016.

A write control signal, a read control signal, and an address signal are input into the control circuit 2011. The control circuit 2011 has a function of generating and outputting a plurality of control signals in accordance with the input write control signal, read control signal, and address signal. For example, the control circuit 2011 has a function of outputting a row address signal and a column address signal in accordance with the input address signal.

A data signal and a column address signal are input into the bit-line driver circuit 2012. The bit-line driver circuit 2012 has a function of setting the voltage of a wiring (including, for example, a data line) arranged in a column direction. The bit-line driver circuit 2012 includes a decoder and a plurality of analog switches, for example. The decoder has a function of selecting a wiring arranged in a column direction, and the plurality of analog switches have a function of determining whether the data signal is output or not in accordance with a signal input from the decoder. Note that the bit-line driver circuit 2012 may be provided with a reading signal output circuit and a read circuit. The reading signal output circuit has a function of outputting a reading signal to a wiring having a function as a reading selection line, and the read circuit has a function of reading data stored in the memory cell 2051 electrically connected to a wiring which is selected by a reading signal.

The row address signal is input into the word-line driver circuit 2013. The word-line driver circuit 2013 has a function of selecting a wiring (including, for example, a word line) arranged in a row direction in accordance with the input row address signal and setting the voltage of the selected wiring. The word-line driver circuit 2013 includes a decoder, for example. The decoder has function of selecting a wiring arranged in a row direction in accordance with the input row address signal.

Further, the power source circuit 2014 supplies a power source potential or a power source voltage to the control circuit 2011, the bit-line driver circuit 2012, the word-line driver circuit 2013, and the plurality of memory cells (also referred to as MC) 2051. Note that the power source circuit 2014 may be formed over a substrate different from that of the memory cells 2051 and connected by a wiring or the like.

Further, a power source potential is supplied to a back gate of a transistor in the memory cell 2051 via the power supply control switch 2016. As the structures of the power supply control switch 2016, the structure of the power supply control switch 102 shown in FIG. 1 can be employed.

The memory cell 2051 is selected by the word-line driver circuit 2013 and the bit-line driver circuit 2012, and data writing or data reading is performed in the selected memory cell 2051.

In the semiconductor device shown in FIG. 24, the memory cell is selected by the driver circuits in accordance with the signals that are input into the control circuit, and a write operation or a read operation is performed.

Further, an example of the memory cell array 2015 is described.

Figure 25:
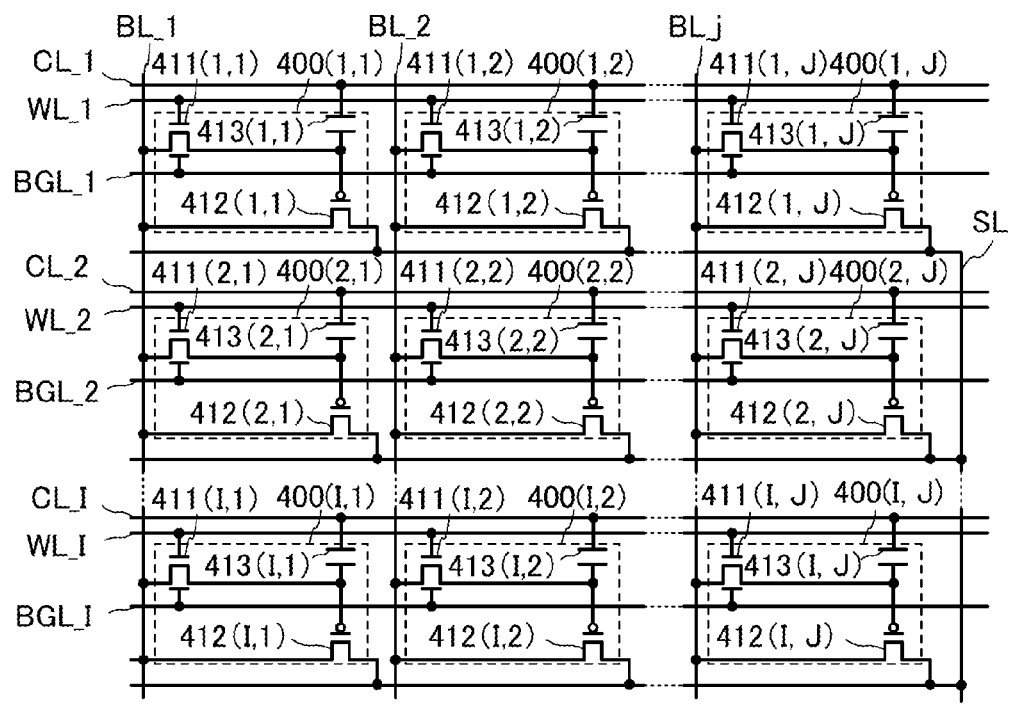
FIG. 25 shows an example of a memory cell.

A memory cell array shown in FIG. 25 includes a plurality of memory cells (memory circuits) 400 arranged in I rows and J columns, bit lines BL_1 to BL_J, word lines WL_1 to WL_I, capacitor lines CL_1 to CL_I, a source line SL supplied with a potential at a predetermined level, and back-gate lines BGL_1 to BGL_I.

In the memory cell array in FIG. 25, the memory cell 400 of the M-th row (M is a natural number larger than or equal to 1 and smaller than or equal to I) and the N-th column (N is a natural number larger than or equal to 1 and smaller than or equal to J), that is, a memory cell 400(M, N) includes a transistor 411(M, N), a transistor 412(M, N), and a capacitor 413(M, N).

One of a source and a drain of the transistor 411(M, N) is electrically connected to the bit line BL_N. Further, a gate of the transistor 411(M, N) is electrically connected to the word line WL_M, and a back gate of the transistor 411(M, N) is electrically connected to the back-gate line BGL_M.

The transistor 411(M, N) is an n-channel transistor and a selection transistor for controlling writing and holding of data.

As the transistor 411(M, N), the transistor with low off-state current described in Embodiment 1 can be used.

The transistor 412 is a p-channel transistor. In the transistor 412(M, N), one of a source and a drain is electrically connected to the bit line BL_N, and the other of the source and the drain is electrically connected to the source line SL. A gate of the transistor 412(M, N) is electrically connected to the other of the source and the drain of the transistor 411(M, N).

The transistor 412(M, N) functions as an output transistor which sets a potential of data to be output.

In the capacitor 413(M, N), one of a pair of electrodes is electrically connected to the other of the source and the drain of the transistor 411(M, N), and the other of the pair of electrodes is electrically connected to the capacitor line CL_M.

The capacitor 413(M, N) functions as a storage capacitor that holds data.

The above is the description of the structure example of the memory cell array shown in FIG. 25.

Figure 26:
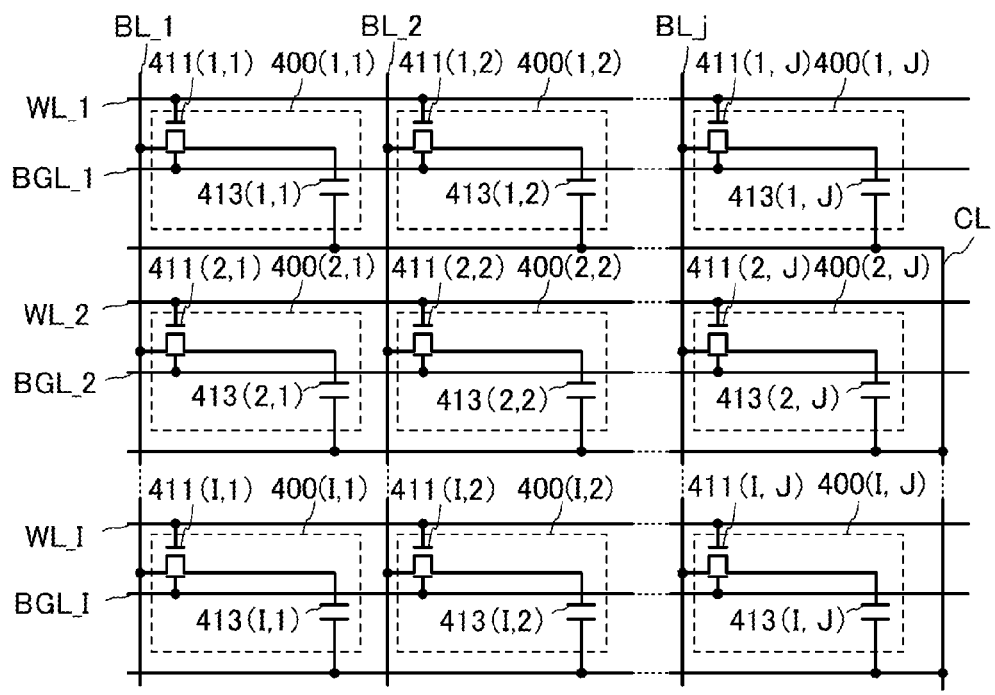
FIG. 26 shows an example of a memory cell.

Note that the transistor 412 is not necessarily provided in the memory cell. For example, the memory cell may have a structure shown in FIG. 26. In that case, the capacitor lines CL can be integrated into one line which also serves as a source line SL.

Next, an example of a method for driving the semiconductor device in FIG. 24 including the memory cell array in FIG. 25 is described. Here, the case where data is sequentially written into the memory cells 400 of the M-th row and then the written data is read is described as an example; however, one embodiment of the present invention is not limited to this case.

First, in order to write data into the memory cells 400 of the M-th row, the potential of the M-th word line WL_M is set at VH and the potentials of the other word lines WL other are set at VL.

Note that VH is a potential at a higher level than a reference potential (e.g., a power source potential VSS) and is a power source potential VDD, for example. Moreover, VL is a potential at a level lower than or equal to the level of the reference potential.

At this time, in each of the memory cells 400 of the M-th row, the transistor 411 is turned on and the level of the potential of one of the pair of electrodes of the capacitor 413 is equivalent to the level of the potential of the corresponding bit lines BL.

Then, the transistor 411 is turned off and the gate of the transistor 412 is in a floating state, so that the gate potential of the transistor 412 is held. At this time, a negative power source potential −Vx is supplied to each of the back-gate lines BGL_1 to BGL_I. Accordingly, the threshold voltage of the transistor 411 is controlled.

Data can be written into all the memory cells 400 by performing the above operation row by row.

In order to read data from the memory cells 400 of the M-th row, the potentials of all the word lines WL are set at VL, the potential of the capacitor line CL_M is set at VL, and the potentials of the other capacitor lines CL_other are set at VH.

In each of the memory cells 400 of the M-th row, the resistance between the source and the drain of the transistor 412 depends on the gate voltage of the transistor 412. In addition, a potential corresponding to the amount of current flowing between the source and the drain of the transistor 412 can be read as data from the memory cell 400.

Data can be read from all the memory cells 400 by repeatedly performing the above operation row by row. The above is the description of the example of the method for driving the semiconductor device shown in FIG. 24.

Further, an example of a semiconductor device including an arithmetic processing unit is described.

Figure 27A:
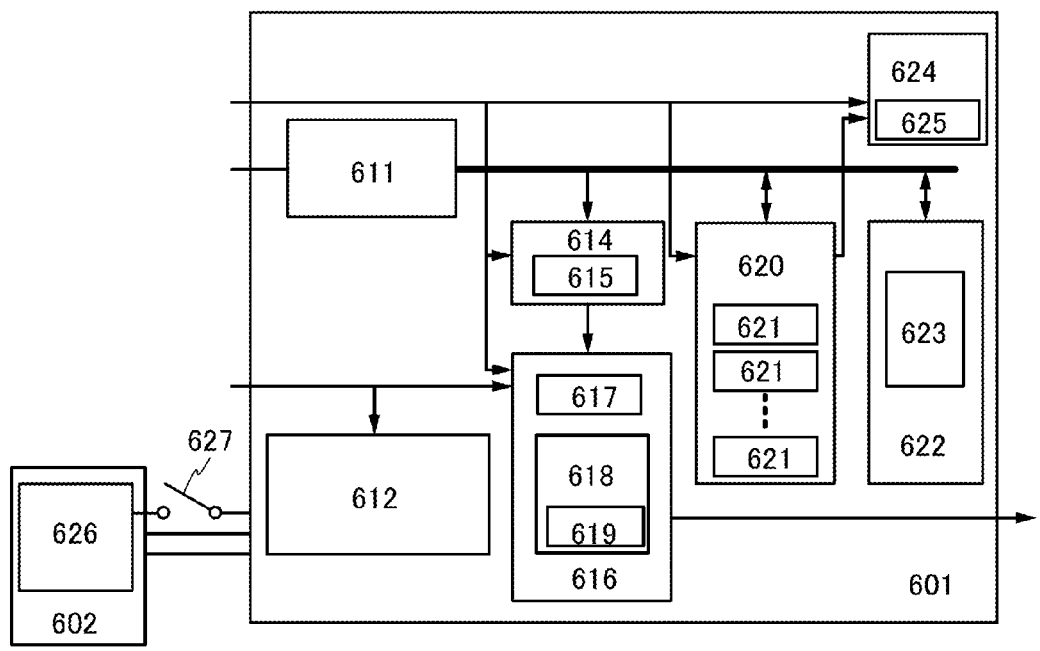
FIGS. 27A and 27B show an example of a semiconductor device.
Figure 27B:
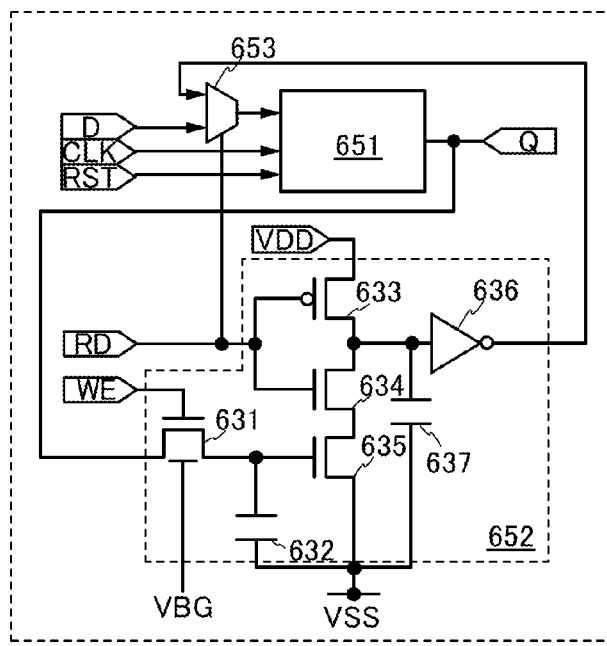

FIGS. 27A and 27B show structure examples of the semiconductor device in this embodiment. The semiconductor device shown in FIG. 27A includes an arithmetic processing unit 601 and a power source unit 602. The arithmetic processing unit 601 includes a circuit 611 having functions of a data latch and a selector, a circuit 612 having functions of an internal clock generator and a reset controller, a decode unit 614, an arithmetic control unit 616, a register set 620, an arithmetic unit 622, and an address buffer 624. The power source unit 602 includes a power source circuit 626.

Further, a power source potential or a power source voltage is supplied to components of the arithmetic processing unit 601 from the power source unit 602. For example, a power source potential is supplied to a back gate of each of transistors in the arithmetic processing unit 601 from the power source circuit 626 via a power supply control switch 627. Note that the power supply control switch 627 may be controlled using a power controller or the like. As the structures of the power supply control switch 627, the structure of the power supply control switch 102 shown in FIG. 1 can be employed. Note that the power source circuit 626 may be formed over a substrate different from that of the arithmetic processing unit 601 and connected by a wiring or the like.

Further, components of the arithmetic processing unit 601 are described.

The circuit 611 controls latch and output of input data.

The circuit 612 controls timings for generating and resetting a clock signal.

The decode unit 614 is provided with a register 615 which is an instruction register and an instruction decoder. The decode unit 614 has a function of decoding input instruction data and analyzing an instruction.

The arithmetic control unit 616 includes a state generation unit 618 and a register 617. Further, the state generation unit 618 includes a register 619. The state generation unit 618 generates a signal for determining a state of the semiconductor device.

The register set 620 includes a plurality of registers 621. The plurality of registers 621 include registers functioning as a program counter, a general register, and an arithmetic register. The register set 620 has a function of storing data needed for arithmetic processing.

The arithmetic unit 622 includes an arithmetic logic unit (ALU) 623. The arithmetic unit 622 has a function of performing arithmetic processing of data input from the ALU 623. Note that a register may be provided also in the arithmetic unit 622.

The address buffer 624 includes a register 625. The address buffer 624 is a buffer gate for address data.

Further, a write control signal WE and a read control signal RD are input into the arithmetic processing unit 601. Via a data bus, 8-bit data is input into the arithmetic processing unit 601. Moreover, an arithmetic control signal is input into the arithmetic processing unit 601.

Data of a 16-bit address is output from the arithmetic processing unit 601. Moreover, a bus control signal is output from the arithmetic processing unit 601.

The write control signal WE and the read control signal RD are input into the circuit 612, the arithmetic control unit 616, the register set 620, and the address buffer 624. The 8-bit data is input into the circuit 612, the register set 620, and the arithmetic unit 622 via the data bus. Moreover, the arithmetic control signal is input into the circuit 612 and the arithmetic control unit 616.

The data of the 16-bit address is output from the address buffer 624. The bus control signal is output from the arithmetic control unit 616.

Each of the circuits in the arithmetic processing unit 601 can input and output data, an address, and an arithmetic control signal via an address bus and a control bus in addition to the data bus.

Each of the registers provided in the arithmetic processing unit 601 has a function of holding data for a certain period of time in data processing.

Further, FIG. 27B shows an example of a circuit structure of a register capable of holding 1-bit data. The register shown in FIG. 27B includes a flip-flop 651, a nonvolatile memory circuit 652, and a selector 653.

The flip-flop 651 is supplied with a reset signal RST, a clock signal CLK, and a data signal D. The flip-flop 651 has a function of holding data of the data signal D that is input in response to the clock signal CLK and outputting the data as a data signal Q.

The write control signal WE, the read control signal RD, and a data signal are input into the nonvolatile memory circuit 652.

The nonvolatile memory circuit 652 has a function of storing data of an input data signal in accordance with the write control signal WE and outputting the stored data as a data signal in accordance with the read control signal RD.

The selector 653 selects the data signal D or a data signal output from the nonvolatile memory circuit 652 and inputs the selected signal into the flip-flop 651 in accordance with the read control signal RD.

The nonvolatile memory circuit 652 includes a transistor 631 and a capacitor 632.

The transistor 631, which is an n-channel transistor, functions as a selection transistor. One of a source and a drain of the transistor 631 is electrically connected to an output terminal of the flip-flop 651. Further, a back gate of the transistor 631 is electrically connected to the power supply control switch 627 shown in FIG. 27A. The transistor 631 has a function of controlling holding of a data signal output from the flip-flop 651 in accordance with the write control signal WE.

As the transistor 631, the transistor with low off-state current described in Embodiment 1 can be used.

In the capacitor 632, one of a pair of electrodes is electrically connected to the other of the source and the drain of the transistor 631, and the other of the pair of electrodes is supplied with a power source potential VSS. The capacitor 632 has a function of holding charge based on data of a stored data signal. Since the off-state current of the transistor 631 is extremely low, the charge in the capacitor 632 is held and thus the data is held even when supply of the power source voltage stops.

A transistor 633 is a p-channel transistor. A power source potential VDD is supplied to one of a source and a drain of the transistor 633, and the read control signal RD is input into a gate of the transistor 633.

A transistor 634 is an n-channel transistor. One of a source and a drain of the transistor 634 is electrically connected to the other of the source and the drain of the transistor 633, and the read control signal RD is input into a gate of the transistor 634.

The transistor 635 is an n-channel transistor. In the transistor 635, one of a source and a drain is electrically connected to the other of the source and the drain of the transistor 634, and the other of the source and the drain is supplied with the power source potential VSS.

An input terminal of the inverter 636 is electrically connected to the other of the source and the drain of the transistor 633. An output terminal of the inverter 636 is electrically connected to an input terminal of the selector 653.

One of a pair of electrodes of a capacitor 637 is electrically connected to the input terminal of the inverter 636, and the other of the pair of electrodes is supplied with the power source potential VSS. The capacitor 632 has a function of holding charge based on data of a data signal that is input into the inverter 636.

Note that the components of the nonvolatile memory circuit 652 are not limited to the above, and a phase-change random access memory (also referred to as PRAM), a resistive random access memory (also referred to as ReRAM), or a magnetic random access memory (also referred to as MRAM) may be included, for example. For the MRAM, a magnetic tunnel junction element (also referred to as an MTJ element) can be used, for example.

Next, an example of a method for driving the register shown in FIG. 27B is described.

First, in a normal operation period, the register is supplied with the power source voltage, the reset signal RST, and the clock signal CLK. At this time, the selector 653 outputs data of the data signal D to the flip-flop 651. The flip-flop 651 has a function of holding data of the data signal D that is input in response to the clock signal CLK.

Next, in a period which is a backup period provided immediately before supply of the power source voltage stops, the data of the data signal D is stored in the nonvolatile memory circuit 652 in accordance with a pulse of the write control signal WE, and the nonvolatile memory circuit 652 holds the data as the data D_HLD. After that, supply of the clock signal CLK to the register stops, and then, supply of the reset signal RST to the register stops.

Next, in a power stop period, the supply of the power source voltage to the register is stopped. During this period, the value of the data D_HLD is held in the nonvolatile memory circuit 652 because the off-state current of the transistor 631 is low. Note that the supply of the power source voltage may be stopped by supplying a ground potential GND instead of the power source potential VDD.

At this time, the back gate of the transistor 631 may be supplied with a power source potential by intermittently turning on the power supply control switch 627. For example, the back gate may be supplied with a negative power source potential so that the threshold voltage of the transistor 631 is shifted to maintain the off state of the transistor. Further, when the power supply control switch 627 is off, supply of the power source voltage to the power source circuit 626 may be stopped in a manner similar to that of the power source circuit 101 shown in Embodiment 1.

Next, in a recovery period immediately before a normal operation period, the supply of the power source voltage to the register is restarted, the supply of the clock signal CLK is restarted, and after that, the supply of the reset signal RST is restarted. At this time, before the supply of the clock signal CLK is restarted, the wiring supplied with the clock signal CLK is set to the power source potential VDD. Further, the data signal having a value corresponding to the data D_HLD is output to the selector 653 from the nonvolatile memory circuit 652 in accordance with a pulse of the read control signal RD. The selector 653 outputs the above data signal to the flip-flop 651 in accordance with the pulse of the read control signal RD. Thus, the flip-flop 651 can return to a state just before the power stop period.

Then, in a normal operation period, normal operation of the flip-flop 651 is performed again.

The above is the description of the example of the method for driving the register.

Figure 28A:
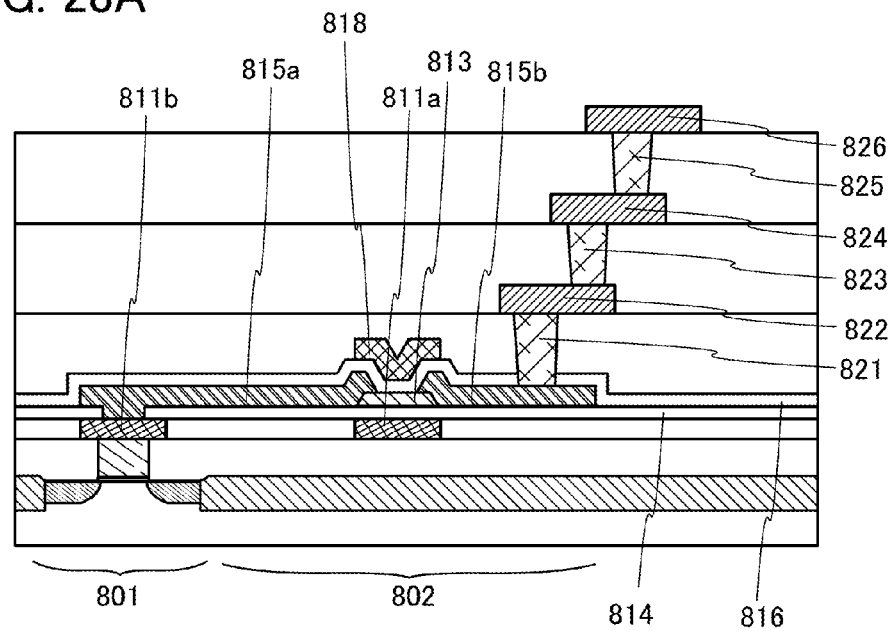
FIGS. 28A and 28B show structure examples of a semiconductor device.
Figure 28B:
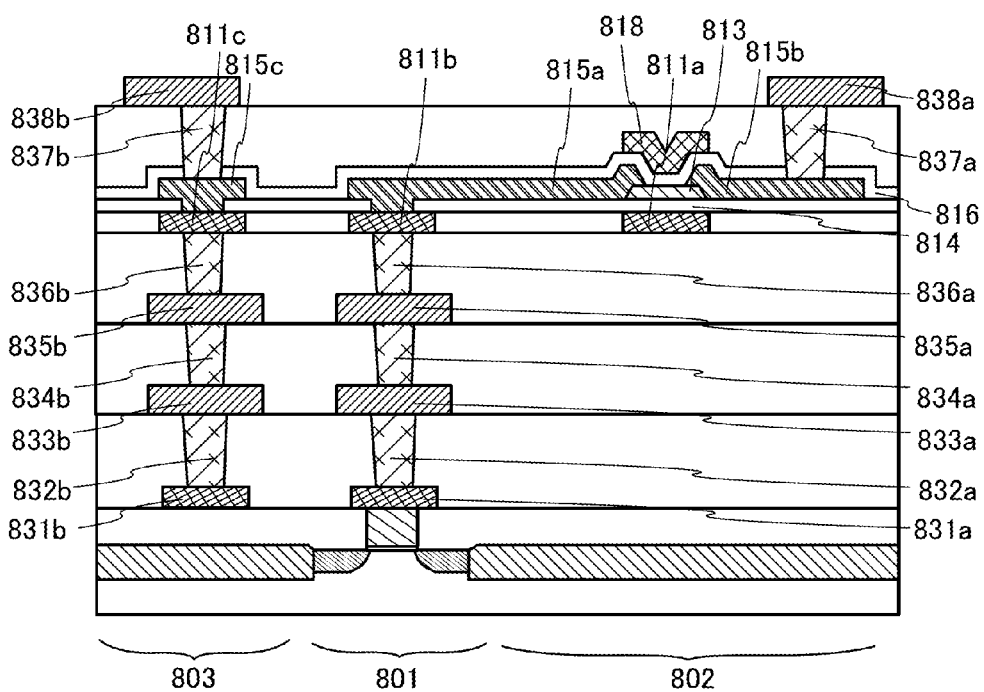

Next, structure examples of the semiconductor device in this embodiment are shown in FIGS. 28A and 28B.

In a semiconductor device illustrated in FIG. 28A, a transistor 801 containing silicon in a channel formation region and a transistor 802 containing an oxide semiconductor in a channel formation region are stacked and further a plurality of wirings are stacked over the transistor 802.

The transistor 801 is provided in a semiconductor substrate having an embedded insulating layer. The transistor 801 corresponds to the transistor 635 shown in FIG. 27B, for example.

The transistor 802 includes a conductive layer 811a embedded in an insulating layer, an insulating layer 814 over the conductive layer 811a, a semiconductor layer 813 which overlaps with the conductive layer 811a with the insulating layer 814 provided therebetween, conductive layers 815a and 815b which are electrically connected to the semiconductor layer 813, an insulating layer 816 over the semiconductor layer 813 and the conductive layers 815a and 815b, and a conductive layer 818 which overlaps with the semiconductor layer 813 with the insulating layer 816 provided therebetween. At this time, the conductive layer 811a functions as a back gate electrode. The insulating layer 814 functions as a gate insulating layer. The semiconductor layer 813 functions as a channel formation layer. Each of the conductive layers 815a and 815b functions as a source electrode or a drain electrode. The insulating layer 816 functions as a gate insulating layer. The conductive layer 818 functions as a gate electrode. The transistor 802 corresponds to the transistor 631 shown in FIG. 27B, for example.

It is preferred that the insulating layer 814 has a function of blocking impurities such as hydrogen. For example, an aluminum oxide layer, a silicon nitride layer, or the like has a function of blocking hydrogen. Since the semiconductor layer 813 is surrounded with the insulating layers 814 and 816 in the semiconductor device illustrated in FIG. 28A, diffusion of impurities such as hydrogen from the outside (e.g., the transistor 801) into the transistor 802 is suppressed.

Further, the conductive layer 815a is electrically connected to a conductive layer 811b formed using the same conductive film as the conductive layer 811a through an opening penetrating the insulating layer 814, and the conductive layer 811b is electrically connected to a gate electrode of the transistor 801.

Further, wiring layers 822, 824, and 826 are sequentially stacked over the transistor 802. The wiring layer 822 is electrically connected to the conductive layer 815b through a wiring layer 821 embedded in an insulating layer. The wiring layer 824 is electrically connected to the wiring layer 822 through a wiring layer 823 embedded in an insulating layer. The wiring layer 826 is electrically connected to the wiring layer 824 through a wiring layer 825 embedded in an insulating layer. For example, the wiring layer 826 may be used as an external connection terminal.

Further, in a semiconductor device illustrated in FIG. 28B, the transistor 801 and the transistor 802 are stacked and further a plurality of wiring layers are provided between the transistor 801 and the transistor 802. Further, a terminal portion 803 is also illustrated in FIG. 28B.

Further, wiring layers 831a, 833a, and 835a are sequentially stacked over the transistor 801. The wiring layer 831a is electrically connected to the gate electrode of the transistor 801. The wiring layer 833a is electrically connected to the wiring layer 831a through a wiring layer 832a embedded in an insulating layer. The wiring layer 835a is electrically connected to the wiring layer 833a through a wiring layer 834a embedded in an insulating layer.

Further, the conductive layer 815a is electrically connected to the conductive layer 811b formed using the same conductive film as the conductive layer 811a through the opening penetrating the insulating layer 814, and the conductive layer 811b is electrically connected to the wiring layer 835a through a wiring layer 836a embedded in an insulating layer.

Further, a wiring layer 838a is stacked over the transistor 802. The wiring layer 838a is electrically connected to the conductive layer 815b through a wiring layer 837a embedded in an insulating layer.

In the terminal portion 803, a wiring layer 831b formed using the same conductive film as the wiring layer 831a, a wiring layer 833b formed using the same conductive film as the wiring layer 833a, a wiring layer 835b formed using the same conductive film as the wiring layer 835a, a conductive layer 811c formed using the same conductive film as the conductive layer 811a, a conductive layer 815c formed using the same conductive film as the conductive layer 815a, a wiring layer 837b formed using the same conductive film as the wiring layer 837a, and a wiring layer 838b formed using the same conductive film as the wiring layer 838a are sequentially stacked. The wiring layer 833b is electrically connected to the wiring layer 831b through a wiring layer 832b which is embedded in the insulating layer and formed using the same conductive film as the wiring layer 832a. The wiring layer 835b is electrically connected to the wiring layer 833b through a wiring layer 834b which is embedded in the insulating layer and formed using the same conductive film as the wiring layer 834a. The conductive layer 811c is electrically connected to the wiring layer 835b through a wiring layer 836b which is embedded in the insulating layer and formed using the same conductive film as the wiring layer 836a. The conductive layer 815c is electrically connected to the conductive layer 811c through an opening penetrating the insulating layer 816. The wiring layer 838b is electrically connected to the conductive layer 815c through the wiring layer 837b which is embedded in the insulating layer and formed using the same conductive film as the wiring layer 837a. For example, the wiring layer 838b may be used as an external connection terminal.

Further, components are described.

As each of the conductive layers 811a to 811c and 818, and the wiring layers 831a to 838a and 831b to 838b, a layer formed using the material which can be used for the conductive layers 962a and 962b illustrated in FIG. 23 can be used, for example.

As each of the insulating layers including the insulating layers 814 and 816, the layer formed using the material which can be used for the base layer 961 illustrated in FIG. 23 can be used, for example.

As the semiconductor layer 813, a layer of the material which can be used for the semiconductor layers 964a and 964b illustrated in FIG. 23 can be used, for example.

As illustrated in FIGS. 28A and 28B, in the examples of the semiconductor device in this embodiment, the semiconductor device has a stack of different transistors, whereby the circuit area can be reduced. Moreover, in a semiconductor device including, for example, an MTJ element, the MTJ element needs to be formed in an uppermost layer to be connected to transistors below the MTJ element through a through wiring; therefore, it is difficult to fabricate such semiconductor devices. However, in the examples of the semiconductor device in this embodiment, another transistor can be stacked over one transistor; therefore, the semiconductor device can be fabricated easily.

The above is the description of the structure examples of the semiconductor device.

As has been described with reference to FIG. 24, FIG. 25, FIG. 26, FIGS. 27A and 27B, and FIGS. 28A and 28B, in the examples of the semiconductor device in this embodiment, the data holding time can be extended by using a transistor with low off-state current as a selection transistor of a memory circuit. Therefore, the data can be held even when supply of a power source voltage is stopped, for example.

Further, in the examples of the semiconductor device in this embodiment, conduction between a power source circuit and a back gate of a selection transistor is controlled by a power supply control switch, and a power source potential is intermittently supplied to the back gate, whereby the threshold voltage of the transistor can be controlled with power consumption suppressed.

[Embodiment 4]

In this embodiment, examples of an electronic device including the semiconductor device of one embodiment of the present invention will be described with reference to FIGS. 29A to 29F.

Figure 29A:
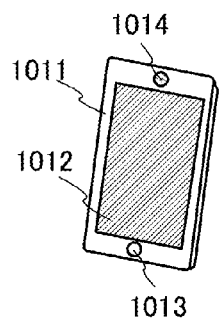
FIGS. 29A to 29F show examples of an electronic device.

An electronic device illustrated in FIG. 29A is an example of a portable information terminal.

The electronic device illustrated in FIG. 29A includes a housing 1011, a panel 1012 incorporated in the housing 1011, a button 1013, and a speaker 1014.

The housing 1011 may be provided with a connection terminal for connecting the electronic device to an external device and a button for operating the electronic device.

The panel 1012 is a display panel (display). The panel 1012 is preferred to function as a touch panel.

The button 1013 is provided for the housing 1011. When the button 1013 is a power button, for example, pressing the button 1013 can turn on or off the electronic device.

The speaker 1014 is provided for the housing 1011. The speaker 1014 outputs sound.

The housing 1011 may be provided with a microphone, in which case the electronic device in FIG. 29A can function as a telephone, for example.

In the electronic device illustrated in FIG. 29A, the semiconductor device which is one embodiment of the present invention is provided inside the housing 1011.

The electronic device illustrated in FIG. 29A functions as one or more of a telephone set, an e-book reader, a personal computer, and a game machine, for example.

Figure 29B:
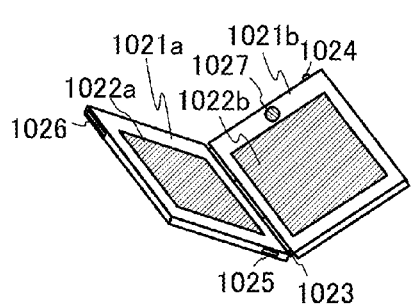

The electronic device illustrated in FIG. 29B is an example of a foldable information terminal.

The electronic device illustrated in FIG. 29B includes a housing 1021a, a housing 1021b, a panel 1022a provided for the housing 1021a, a panel 1022b provided for the housing 1021b, a hinge 1023, a button 1024, a connection terminal 1025, a storage media inserting portion 1026, and a speaker 1027.

The housing 1021a and the housing 1021b are connected by the hinge 1023.

The panels 1022a and 1022b are display panels (displays). The panels 1022a and 1022b are preferred to function as a touch panel.

Since the electronic device illustrated in FIG. 29B includes the hinge 1023, it can be folded so that the panels 1022a and 1022b face each other.

The button 1024 is provided for the housing 1021b. Note that the housing 1021a may also be provided with the button 1024. For example, when the button 1024 which functions as a power button is provided and pushed, supply of a power source voltage to the electronic device can be controlled.

The connection terminal 1025 is provided for the housing 1021a. Note that the connection terminal 1025 may be provided on the housing 1021b. Alternatively, a plurality of connection terminals 1025 may be provided on one or both of the housings 1021a and 1021b. The connection terminal 1025 is a terminal for connecting the electronic device illustrated in FIG. 29B to another device.

The storage media inserting portion 1026 is provided for the housing 1021a. The storage medium insertion portion 1026 may be provided on the housing 1021b. Alternatively, a plurality of storage medium insertion portions 1026 may be provided on one or both of the housings 1021a and 1021b. For example, a card-type recording medium is inserted into the recording medium insertion portion so that data can be read to the electronic device from the card-type recording medium or data stored in the electronic device can be written into the card-type recording medium.

The speaker 1027 is provided for the housing 1021b. The speaker 1027 outputs sound. Note that the speaker 1027 may be provided for the housing 1021a.

The housing 1021a or 1021b may be provided with a microphone, in which case the electronic device in FIG. 29B can function as a telephone, for example.

In the electronic device illustrated in FIG. 29B, the semiconductor device which is one embodiment of the present invention is provided inside the housing 1021a or 1021b.

The electronic device illustrated in FIG. 29B functions as one or more of a telephone set, an e-book reader, a personal computer, and a game machine, for example.

Figure 29C:
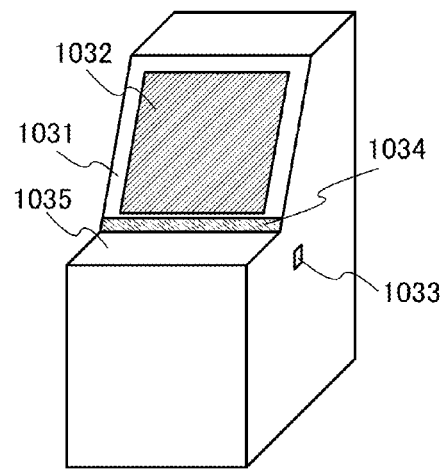

An electronic device illustrated in FIG. 29C is an example of a stationary information terminal The stationary information terminal illustrated in FIG. 29C includes a housing 1031, a panel 1032 incorporated in the housing 1031, a button 1033, and a speaker 1034.

The panel 1032 is a display panel (display). The panel 1032 is preferred to function as a touch panel.

Note that a panel similar to the panel 1032 may be provided for a deck portion 1035 of the housing 1031. This panel is preferred to function as a touch panel.

Further, the housing 1031 may be provided with one or more of a ticket slot from which a ticket or the like is dispensed, a coin slot, and a bill slot.

The button 1033 is provided for the housing 1031. For example, when the button 1033 is a power button, supply of a power source voltage to the electronic device can be controlled by pressing the button 1033.

The speaker 1034 is provided for the housing 1031. The speaker 1034 outputs sound.

In the electronic device illustrated in FIG. 29C, the semiconductor device which is one embodiment of the present invention is provided inside the housing 1031.

The electronic device illustrated in FIG. 29C functions as an automated teller machine, an information communication terminal for ordering a ticket or the like (also referred to as a multi-media station), or a game machine, for example.

Figure 29D:
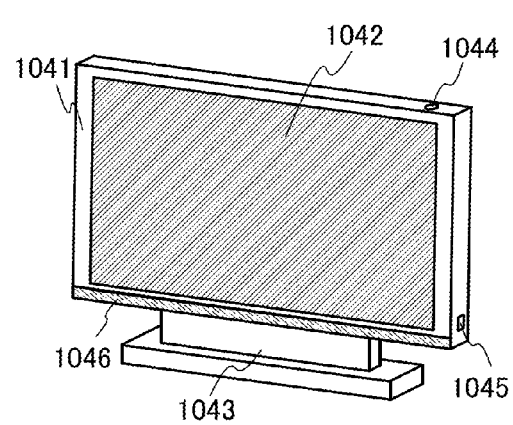

FIG. 29D is an example of a stationary information terminal. The electronic device illustrated in FIG. 29D includes a housing 1041, a panel 1042 incorporated in the housing 1041, a support 1043 supporting the housing 1041, a button 1044, a connection terminal 1045, and a speaker 1046.

Note that a connection terminal for connecting the housing 1041 to an external device may be provided.

The panel 1042 functions as a display panel (display).

The button 1044 is provided for the housing 1041. For example, when the button 1044 is a power button, supply of a power source voltage to the electronic device can be controlled by pressing the button 1044.

The connection terminal 1045 is provided for the housing 1041. The connection terminal 1045 is a terminal for connecting the electronic device illustrated in FIG. 29D to another device. For example, when the electronic device illustrated in FIG. 29D and a personal computer are connected with the connection terminal 1045, the panel 1042 can display an image corresponding to a data signal that is input from the personal computer. For example, when the panel 1042 of the electronic device illustrated in FIG. 29D is larger than a panel of another electronic device connected thereto, a displayed image of the other electronic device can be enlarged, so that a plurality of viewers can easily see the image at the same time.

The speaker 1046 is provided for the housing 1041. The speaker 1046 outputs sound.

In the electronic device illustrated in FIG. 29D, the semiconductor device which is one embodiment of the present invention is provided inside the housing 1041.

The electronic device illustrated in FIG. 29D functions as an output monitor, a personal computer, and/or a television set, for example.

Figure 29E:
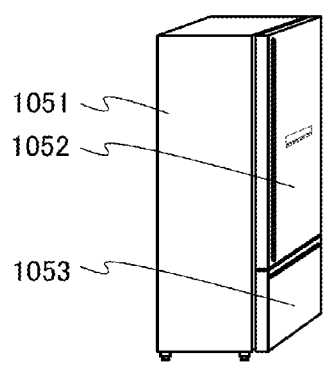

FIG. 29E is an example of an electric refrigerator-freezer. The electronic device illustrated in FIG. 29E includes a housing 1051, a refrigerator door 1052, and a freezer door 1053.

In the electronic device illustrated in FIG. 29E, the semiconductor device which is one embodiment of the present invention is provided inside the housing 1051. With the above structure, supply of a power source voltage to the semiconductor device in the housing 1051 can be controlled in response to opening and closing of the refrigerator door 1052 and the freezer door 1053, for example.

Figure 29F:
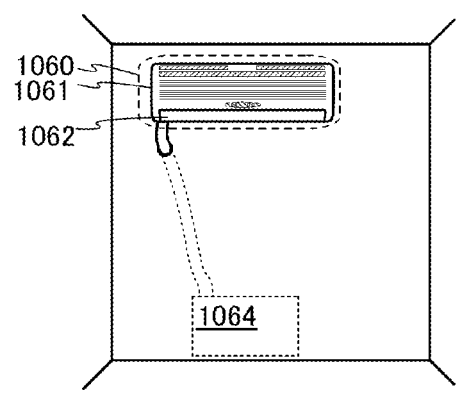

FIG. 29F is an example of an air conditioner. The electronic device illustrated in FIG. 29F includes an indoor unit 1060 and an outdoor unit 1064.

The indoor unit 1060 includes a housing 1061 and a ventilation duct 1062.

In the electronic device illustrated in FIG. 29F, the semiconductor device which is one embodiment of the present invention is provided inside the housing 1061. With the above structure, supply of a power source voltage to the semiconductor device in the housing 1061 can be controlled in response to a signal from a remote controller, for example.

Note that the separated air conditioner including the indoor unit and the outdoor unit is illustrated in FIG. 29F as an example. Alternatively, an air conditioner may be such that the functions of an indoor unit and an outdoor unit are integrated in one housing.

Examples of the electronic devices are not limited to the above, and the semiconductor device which is one embodiment of the present invention can also be used for an electric rice cooker, a high-frequency heating apparatus such as a microwave oven, and the like.

The above is the description of the electronic devices illustrated in FIGS. 29A to 29F.

As has been described with reference to FIGS. 29A to 29F, the electronic device in this embodiment consumes less power by using the semiconductor device which is one embodiment of the present invention.

This application is based on Japanese Patent Application serial No. 2012-109475 filed with the Japan Patent Office on May 11, 2012 and Japanese Patent Application serial No. 2012-125706 filed with the Japan Patent Office on Jun. 1, 2012, the entire contents of which are hereby incorporated by reference.

What is claimed is:
1. A semiconductor device comprising:
   a circuit comprising a first transistor, the first transistor including a gate electrode and a back gate electrode for controlling a threshold voltage of the first transistor, wherein the back gate electrode is formed on and in contact with an insulating surface;
   a switch comprising a second transistor;
   a power source circuit electrically connected to the back gate electrode of the first transistor through the second transistor; and
   a pulse output circuit electrically connected to a gate of the second transistor,
   wherein each of the first transistor and the second transistor comprises a channel formation region, the channel formation region comprising an oxide semiconductor,
   wherein the first transistor further includes an insulating layer over the back gate electrode, and
   wherein the channel formation region of the first transistor is formed over the back gate electrode with the insulating layer therebetween, and the gate electrode of the first transistor is formed over the channel formation region of the first transistor.

2. The semiconductor device according to claim 1, further comprising:
   a second switch, wherein a power source potential is supplied to the power source circuit through the second switch.

3. The semiconductor device according to claim 1, wherein a leakage current of the switch is lower than or equal to $1 \times 10^{-19}$ A.

4. The semiconductor device according to claim 1, wherein the oxide semiconductor comprises indium, zinc and gallium.

5. The semiconductor device according to claim 1, wherein the power source circuit is one of a charge pump, an inverted converter, and a Cuk-type converter.

6. The semiconductor device according to claim 1, wherein the circuit is a shift register.

7. The semiconductor device according to claim 1, wherein the circuit is a pixel circuit.

8. The semiconductor device according to claim 1, wherein the circuit is an LSI.

9. The semiconductor device according to claim 1, wherein the circuit is a sensor.

10. The semiconductor device according to claim 1, wherein the second transistor is configured to turn off so that the back gate electrode is kept in a floating state.

11. A semiconductor device comprising:
a memory cell comprising a first transistor, the first transistor and a capacitor connected to one of a source and a drain of the first transistor, the first transistor including a gate electrode and a back gate electrode for controlling a threshold voltage of the first transistor, wherein the back gate electrode is formed on and in contact with an insulating surface;
a switch comprising a second transistor;
a power source circuit electrically connected to the back gate electrode of the first transistor through the second transistor; and
a pulse output circuit electrically connected to a gate of the second transistor,
wherein each of the first transistor and the second transistor comprises a channel formation region, the channel formation region comprising an oxide semiconductor,
wherein the first transistor further includes an insulating layer over the back gate electrode, and
wherein the channel formation region of the first transistor is formed over the back gate electrode with the insulating layer therebetween, and the gate electrode of the first transistor is formed over the channel formation region of the first transistor.

12. The semiconductor device according to claim 11, further comprising:
a second switch,
wherein a power source potential is supplied to the power source circuit through the second switch.

13. The semiconductor device according to claim 11, wherein a leakage current of the switch is lower than or equal to $1 \times 10^{-19}$ A.

14. The semiconductor device according to claim 11, wherein the oxide semiconductor comprises indium, zinc and gallium.

15. The semiconductor device according to claim 11, wherein the power source circuit is one of a charge pump, an inverted converter, and a Cuk-type converter.

16. The semiconductor device according to claim 11, wherein the second transistor is configured to turn off so that the back gate electrode is kept in a floating state.

17. A semiconductor device comprising:
a circuit comprising a first transistor, the first transistor including a gate electrode and a back gate electrode for controlling a threshold voltage of the first transistor wherein the back gate electrode is formed on and in contact with an insulating surface;
a first switch comprising a second transistor;
a first power source circuit electrically connected to the back gate electrode of the first transistor through the second transistor;
a second switch comprising a third transistor; and
a second power source circuit electrically connected to the back gate electrode of the first transistor through the third transistor;
wherein each of the first transistor, the second transistor and the third transistor comprises a channel formation region, the channel formation region comprising an oxide semiconductor,
wherein the first transistor further includes an insulating layer over the back gate electrode, and
wherein the channel formation region of the first transistor is formed over the back gate electrode with the insulating layer therebetween, and the gate electrode of the first transistor is formed over the channel formation region of the first transistor.

18. The semiconductor device according to claim 17,
wherein the first power source circuit is configured to generate a first power source potential, and
wherein the second power source circuit is configured to generate a second power source potential, the second power source potential having an opposite polarity to the first power source potential.

19. The semiconductor device according to claim 17, wherein the circuit is a shift register.

20. The semiconductor device according to claim 17, wherein the circuit is a pixel circuit.

21. The semiconductor device according to claim 17, wherein the circuit is an LSI.

22. The semiconductor device according to claim 17, wherein the circuit is a sensor.

23. The semiconductor device according to claim 17, further comprising:
a first pulse output circuit electrically connected to a gate of the second transistor; and
a second pulse output circuit electrically connected to a gate of the second transistor.

24. The semiconductor device according to claim 17, wherein the second transistor is configured to turn off so that the back gate electrode is kept in a floating state.

* * * * *